(12) United States Patent
Choi et al.

(10) Patent No.: US 11,812,632 B2
(45) Date of Patent: Nov. 7, 2023

(54) DISPLAY DEVICE HAVING A COLOR CONVERSION PATTERN OR WAVELENGTH CONVERSION PATTERN DISPOSED IN EACH PIXEL ON A LIGHT PATH EXTENDING FROM A LIGHT SOURCE TO A VIEWER

(71) Applicant: Samsung Display Co., LTD., Yongin-si (KR)

(72) Inventors: Je Hong Choi, Suwon-si (KR); Jin Woo Park, Cheonan-si (KR); Sung Ho Seo, Hwaseong-si (KR); Seung Wook Chang, Suwon-si (KR); Sang Woo Pyo, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 289 days.

(21) Appl. No.: 17/226,061

(22) Filed: Apr. 8, 2021

(65) Prior Publication Data
US 2021/0408476 A1 Dec. 30, 2021

(30) Foreign Application Priority Data
Jun. 24, 2020 (KR) .................... 10-2020-0077022

(51) Int. Cl.
*H10K 50/844* (2023.01)
*H10K 50/84* (2023.01)
(Continued)

(52) U.S. Cl.
CPC ......... *H10K 50/844* (2023.02); *H10K 50/841* (2023.02); *H10K 50/858* (2023.02); *H10K 59/38* (2023.02); *H10K 2102/351* (2023.02)

(58) Field of Classification Search
CPC ............... H10K 50/844; H10K 50/858; H10K 2102/351
See application file for complete search history.

(56) References Cited

U.S. PATENT DOCUMENTS 9,095,033 B2  7/2015 Naraoka et al.
10,720,596 B2 7/2020 Cho et al.
(Continued)

FOREIGN PATENT DOCUMENTS

KR  1020140033867  3/2014
KR  1020150047794  5/2015
(Continued)

OTHER PUBLICATIONS

Extended European Search Report-European Application No. EP 21181362.1 dated Nov. 24, 2021.
(Continued)

*Primary Examiner* — Nduka E Ojeh
(74) *Attorney, Agent, or Firm* — CANTOR COLBURN LLP

(57) ABSTRACT

A display device includes a base, a light emitting element disposed on the base, a capping layer disposed on the light emitting element, a thin-film encapsulation layer which is disposed on the capping layer and includes an inorganic layer at the bottom, and a wavelength conversion pattern which is disposed on the thin-film encapsulation layer and overlaps the light emitting element. The capping layer includes a first sub-capping layer disposed on the light emitting element and a second sub-capping layer disposed between the first sub-capping layer and the inorganic layer, and a refractive index of the second sub-capping layer is greater than a refractive index of the inorganic layer and smaller than a refractive index of the first sub-capping layer.

20 Claims, 27 Drawing Sheets

(51) Int. Cl.
  *H10K 50/858*  (2023.01)
  *H10K 59/38*  (2023.01)
  *H10K 102/00* (2023.01)

(56) References Cited

U.S. PATENT DOCUMENTS

| | | | |
|---|---|---|---|
| 2005/0263775 | A1 | 12/2005 | Ikeda et al. |
| 2010/0219429 | A1* | 9/2010 | Cok ............ H10K 50/865 |
| | | | 257/89 |
| 2014/0110690 | A1 | 4/2014 | Yagi et al. |
| 2015/0115278 | A1* | 4/2015 | Ichikawa ........ H01L 33/22 |
| | | | 257/98 |
| 2017/0357125 | A1 | 12/2017 | Tojo |
| 2018/0374409 | A1* | 12/2018 | Lee ............. G09G 3/2003 |
| 2019/0025638 | A1 | 1/2019 | Kim et al. |
| 2019/0123301 | A1* | 4/2019 | Lee ............. H10K 50/844 |
| 2020/0161579 | A1 | 5/2020 | Kim et al. |
| 2021/0305537 | A1* | 9/2021 | Song ............ H10K 59/124 |

FOREIGN PATENT DOCUMENTS

| | | |
|---|---|---|
| KR | 1020150052490 | 5/2015 |
| KR | 1020180033352 | 4/2018 |
| KR | 1020180078802 | 7/2018 |
| KR | 1020190050144 | 5/2019 |
| KR | 1020190064318 | 6/2019 |
| KR | 1020200058665 | 5/2020 |
| WO | 2012168978 | 12/2012 |

OTHER PUBLICATIONS

Korean Office Action-Korean Application No. 10-2020-0077022 dated Apr. 26, 2021.

* cited by examiner

DISPLAY DEVICE HAVING A COLOR CONVERSION PATTERN OR WAVELENGTH CONVERSION PATTERN DISPOSED IN EACH PIXEL ON A LIGHT PATH EXTENDING FROM A LIGHT SOURCE TO A VIEWER

This application claims priority to Korean Patent Application No. 10-2020-0077022, filed on Jun. 24, 2020, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

Display devices are becoming increasingly important with a development of multimedia. Accordingly, various display devices such as liquid crystal display devices and organic light emitting diode display devices are being developed.

Of the display devices, self-light emitting display devices include a self-light emitting element such as an organic light emitting diode. The self-light emitting element may include two electrodes facing each other and a light emitting layer interposed between the two electrodes. When the self-light emitting element is an organic light emitting diode, electrons and holes provided from the two electrodes may be recombined in the light emitting layer to generate excitons. As the generated excitons change from an excited state to a ground state, light may be emitted.

Since the self-light emitting display devices do not desire a light source such as a backlight unit, the self-light emitting display devices may consume low power, be made lightweight and thin, and have a wide viewing angle, high luminance and contrast and fast response speed. Due to such high-quality characteristics, the self-light emitting display devices are drawing attention as next-generation display devices.

SUMMARY

As one way to make each pixel of a display device uniquely display one primary color, a color conversion pattern or a wavelength conversion pattern may be placed in each pixel on a light path extending from a light source to a viewer.

Features of the invention provide a display device having improved reliability and light efficiency.

However, features of the invention are not restricted to the one set forth herein. The above and other features of the invention will become more apparent to one of ordinary skill in the art to which the invention pertains by referencing the detailed description of the invention given below.

An embodiment of a display device includes a base, a light emitting element which is disposed on the base, a capping layer which is disposed on the light emitting element and includes a first sub-capping layer disposed on the light emitting element and a second sub-capping layer disposed on the first sub-capping layer, a thin-film encapsulation layer which is disposed on the capping layer and includes an inorganic layer at a bottom of thin-film encapsulation layer, and a wavelength conversion pattern which is disposed on the thin-film encapsulation layer and overlaps the light emitting element, where a refractive index of the second sub-capping layer is greater than a refractive index of the inorganic layer and smaller than a refractive index of the first sub-capping layer.

An embodiment of a display device includes a base, a light emitting element which is disposed on the base, a first capping layer which is disposed on the light emitting element and includes a first sub-capping layer disposed on the light emitting element and a second sub-capping layer disposed on the first sub-capping layer, a thin-film encapsulation layer which includes a first lower inorganic layer disposed on the first capping layer, a first organic layer disposed on the first lower inorganic layer and a first upper inorganic layer disposed on the first organic layer, a wavelength conversion pattern which is disposed on the thin-film encapsulation layer and overlaps the light emitting element, a second capping layer which is disposed on the wavelength conversion pattern, a color filter which is disposed on the second capping layer and overlaps the wavelength conversion pattern, and an upper thin-film encapsulation layer which is disposed on the color filter and includes a second lower inorganic layer, a second organic layer disposed on the second lower inorganic layer and a second upper inorganic layer disposed on the second organic layer, where a refractive index of the second sub-capping layer is smaller than a refractive index of the first sub-capping layer, and a refractive index of the first lower inorganic layer is smaller than the refractive index of the second sub-capping layer.

BRIEF DESCRIPTION OF THE DRAWINGS

These and/or other features and advantages will become apparent and more readily appreciated from the following description of the embodiments, taken in conjunction with the accompanying drawings in which.

DETAILED DESCRIPTION

Figure 1:
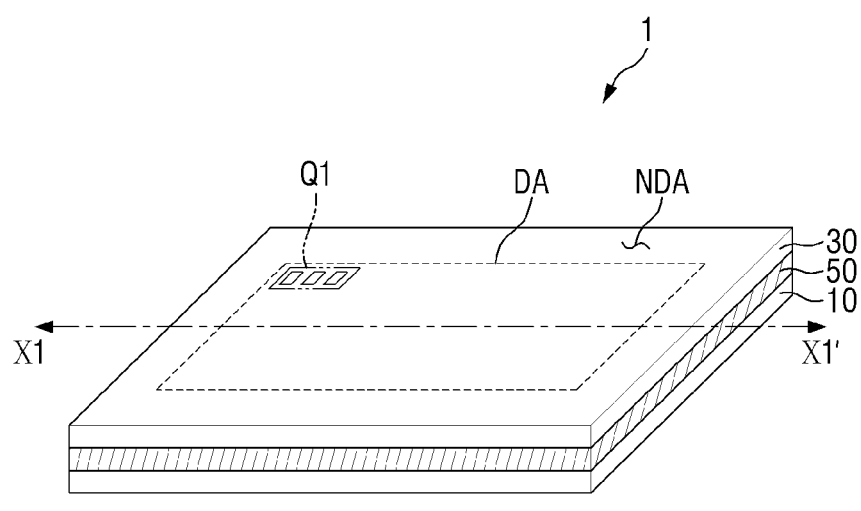
FIG. 1 is a perspective view of an embodiment of a display device.

Embodiments of the invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached drawing figures, the thickness of layers and regions is exaggerated for clarity.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Embodiments are described herein with reference to plan and cross-section illustrations that are schematic illustrations of idealized embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Thus, the regions illustrated in the drawing figures are schematic in nature and their shapes are not intended to illustrate the actual shape of a region of a device and are not intended to limit the scope of the disclosure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described with reference to the attached drawings.

Figure 2A:
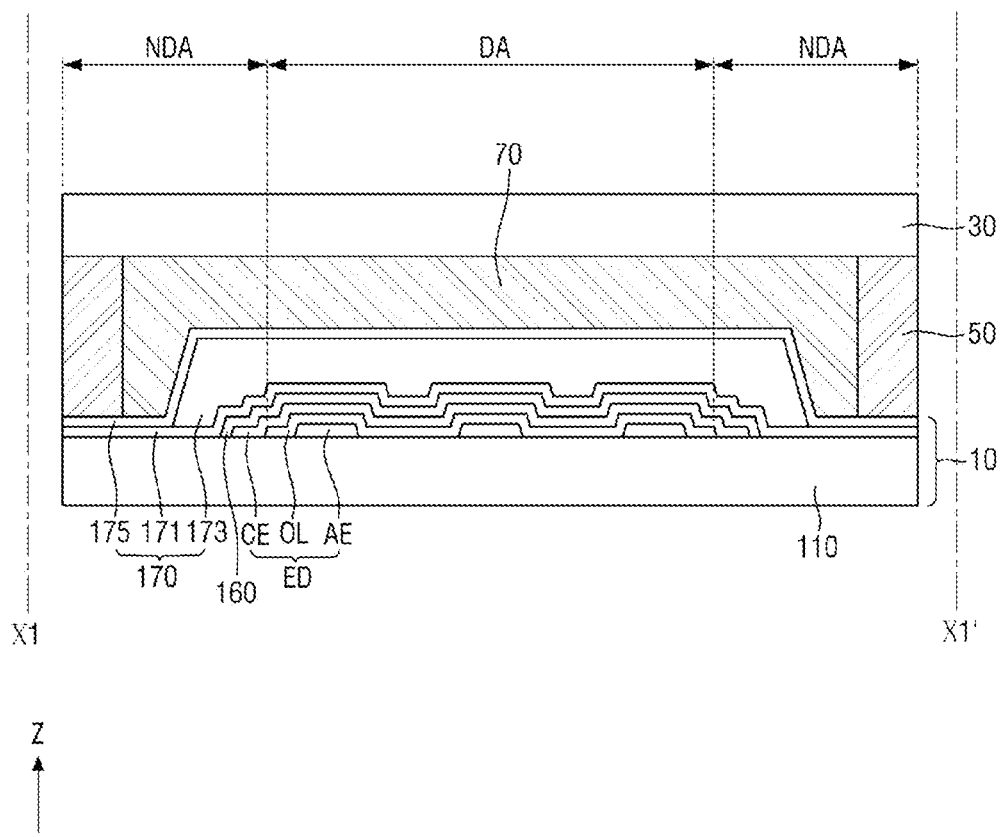
FIG. 2A is a cross-sectional view of the embodiment of the display device, taken along line X1-X1' of FIG. 1.
Figure 2B:
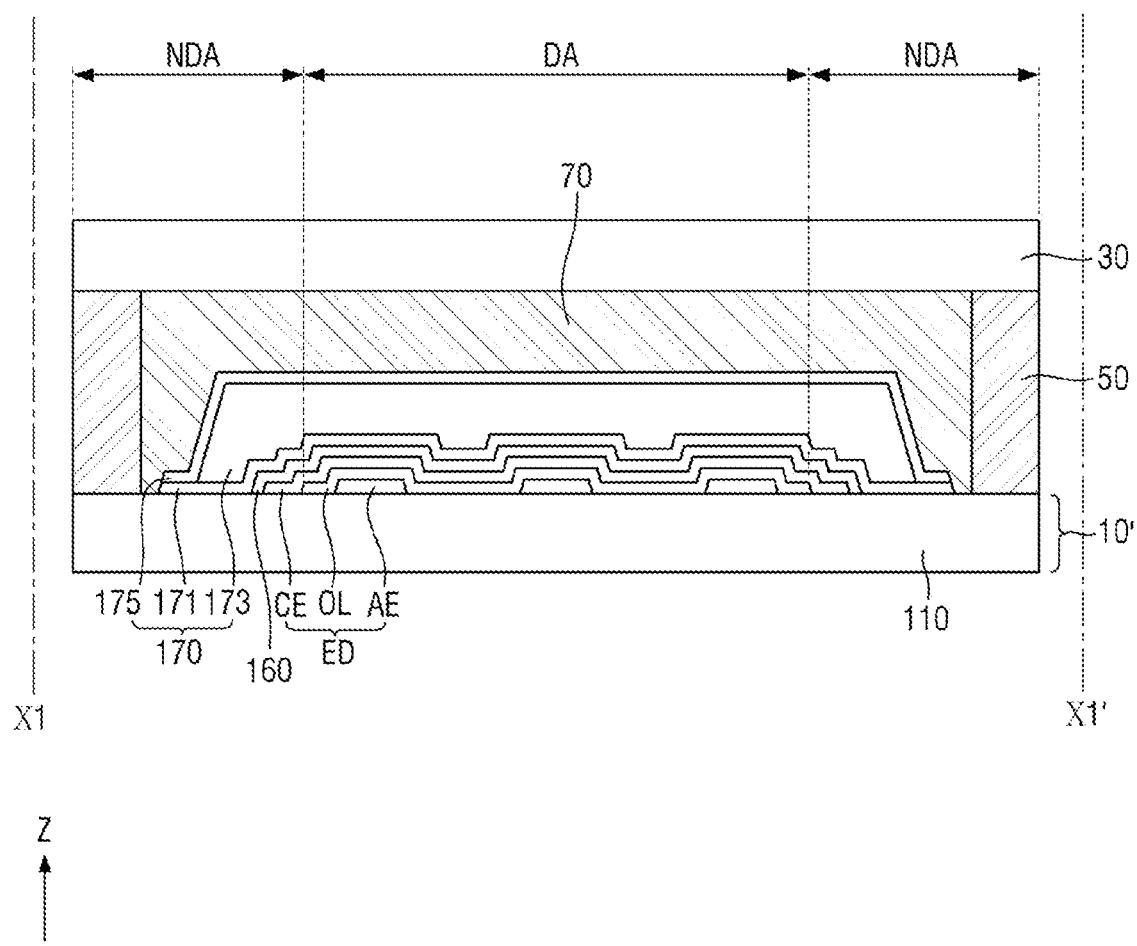
FIG. 2B is a cross-sectional view of another embodiment of FIG. 2A.

FIG. 1 is a perspective view of an embodiment of a display device 1. FIG. 2A is a cross-sectional view of the embodiment of the display device 1, taken along line X1-X1' of FIG. 1. FIG. 2B is a cross-sectional view of another embodiment of FIG. 2A.

Referring to FIGS. 1, 2A and 2B, the display device 1 may be applied to various electronic devices including small and medium-sized electronic devices such as tablet personal computers ("PCs"), smartphones, car navigation units, cameras, center information displays ("CIDs") provided in cars, wristwatch-type electronic devices, personal digital assistants ("PDAs"), portable multimedia players ("PMPs") and game machines and medium and large-sized electronic devices such as televisions, external billboards, monitors, desktop computers integrated with monitors, and notebook computers. However, these are just examples, and it is obvious that the display device 1 may also be employed in other electronic devices without departing from the concept of the invention.

In some embodiments, the display device 1 may be rectangular in a plan view. The display device 1 may include two first sides extending in a first direction X and two second sides extending in a second direction Y intersecting the first direction X. Corners at which the first and second sides of the display device 1 meet may be right-angled. However, the invention is not limited thereto, and the corners may also be curved. In some embodiments, lengths of the first sides may be different from lengths of the second sides, but the invention is not limited thereto. The planar shape of the display device 1 is not limited to the above example and may also be a circular shape or other shapes.

The display device 1 may include a display area DA which displays an image and a non-display area NDA which does not display an image. In some embodiments, the non-display area NDA may be disposed around the display area DA and may surround the display area DA. An image displayed in the display area DA may be viewed by a user in a direction in which an arrow in a third direction Z intersecting the first direction X and the second direction Y points in the drawings. As for the schematic stacked structure of the display device 1, in some embodiments, as illustrated in FIG. 2A, the display device 1 includes a display substrate 10 and a color conversion substrate 30 facing the display substrate 10 and may further include a sealing part 50 bonding the display substrate 10 and the color conversion substrate 30 and a filler 70 filling a space between the display substrate 10 and the color conversion substrate 30. The display substrate 10 may include elements and circuits (e.g., pixel circuits such as transistors) for displaying an image, a pixel defining layer defining a light emitting region and a non-light emitting region in the display area DA, and a self-light emitting element. In an embodiment, the self-light emitting element may include at least one of an organic light emitting diode, a quantum dot light emitting diode, an inorganic material-based micro light emitting diode (e.g., a micro "LED"), and an inorganic material-based nano light emitting diode (e.g., a nano LED). For ease of description, the self-light emitting element will be described below as an organic light emitting diode.

A plurality of light emitting regions may be defined in the display area DA of the display substrate 10. In an embodiment, as will be described in FIG. 3, a first light emitting region, a second light emitting region, and a third light emitting region may be defined in the display substrate 10, for example. The first light emitting region, the second light emitting region, and the third light emitting region may form one group (e.g., a 'light emitting region group'), and a plurality of such light emitting region groups may be defined in the display area DA. A part of the display substrate 10 which corresponds to part Q1 of FIG. 1 may denote one light emitting region group. In some embodiments, the light emitting region groups may be repeatedly disposed along the first direction X and the second direction Y. The first light emitting region, the second light emitting region, and the third light emitting region will be described in more detail later.

As for the schematic stacked structure of the display substrate 10, light emitting elements ED may be disposed on a first base 110, a first capping layer 160 may be disposed on the light emitting elements ED to cover the light emitting elements ED, and a thin-film encapsulation layer 170 may be disposed on the first capping layer 160 to cover the first capping layer 160. The detailed stacked structure of the display substrate 10 will be described later.

The light emitting elements ED may be disposed in the display area DA. In some embodiments, the light emitting elements ED may overlap the light emitting regions, respectively. Each of the light emitting elements ED may include an anode AE, a light emitting layer OL disposed on the anode AE, and a cathode CE disposed on the light emitting layer OL. In some embodiments, a part of the cathode CE may also be disposed in the non-display area NDA. The anode AE, the light emitting layer OL, and the cathode CE will be described in more detail later.

The first capping layer 160 may be disposed on the cathode CE. In some embodiments, the first capping layer 160 may be disposed over the display area DA and the non-display area NDA and may cover the light emitting elements ED. In some embodiments, ends of the first capping layer 160 may be disposed at a relatively outer side than ends of the cathode CE, and the first capping layer 160 may cover the cathode CE.

In some embodiments, the ends of the first capping layer 160 may be disposed at a relatively inner side than the sealing part 50 and may be spaced apart from the sealing part 50. The first capping layer 160 will be described in more detail later.

The thin-film encapsulation layer 170 may be disposed on the first capping layer 160. In some embodiments, the thin-film encapsulation layer 170 may be disposed over the display area DA and the non-display area NDA and may completely cover the first capping layer 160.

In some embodiments, the thin-film encapsulation layer 170 may include a first lower inorganic layer 171 disposed on the first capping layer 160, a first organic layer 173 disposed on the first lower inorganic layer 171, and a first upper inorganic layer 175 disposed on the first organic layer 173. In some embodiments, ends of the first lower inorganic layer 171 and ends of the first upper inorganic layer 175 may be disposed at a relatively outer side than ends of the first organic layer 173, and the first lower inorganic layer 171 and the first upper inorganic layer 175 may contact each other in the non-display area NDA.

In some embodiments, ends of the thin-film encapsulation layer 170 may be disposed at a relatively outer side than the ends of the first capping layer 160. In an embodiment, the ends of the first lower inorganic layer 171 and the ends of the first upper inorganic layer 175 may be disposed at a relatively outer side than the ends of the first capping layer 160, and the first lower inorganic layer 171 and the first upper inorganic layer 175 may completely cover the first capping layer 160, for example. Accordingly, it is possible to prevent moisture or oxygen from penetrating into the first capping layer 160 and denaturing the first capping layer 160.

The thin-film encapsulation layer 170 will be described in more detail later.

The color conversion substrate 30 may be disposed on the display substrate 10 and may face the display substrate 10. In some embodiments, the color conversion substrate 30 may include a color conversion pattern that converts the color of incident light. In some embodiments, the color conversion substrate 30 may include at least any one of a color filter and a wavelength conversion pattern as the color conversion pattern. In some embodiments, the color conversion substrate 30 may include both the color filter and the wavelength conversion pattern.

In the display area DA, a plurality of light transmitting regions may be defined in the color conversion substrate 30. In an embodiment, as will be described in FIG. 4, a first light transmitting region, a second light transmitting region, and a third light transmitting region may be defined in the color conversion substrate 30, for example. The first light transmitting region, the second light transmitting region, and the third light transmitting region may form one group (e.g., a 'light transmitting region group'), and a plurality of such light transmitting region groups may be defined in the display area DA. A part of the color conversion substrate 30 which corresponds to part Q1 of FIG. 1 may denote one light transmitting region group. In some embodiments, the light transmitting groups may be repeatedly disposed along the first direction X and the second direction Y and may correspond to the light emitting region groups. The first light transmitting region, the second light transmitting region, and the third light transmitting region will be described in more detail later.

The sealing part 50 may be disposed between the display substrate 10 and the color conversion substrate 30 in the non-display area NDA. The sealing part 50 may be disposed in the non-display area NDA along edges of the display substrate 10 and the color conversion substrate 30 to surround the display area DA in a plan view. The display substrate 10 and the color conversion substrate 30 may be bonded to each other by the sealing part 50.

In some embodiments, the sealing part 50 may include an organic material. In an embodiment, the sealing part 50 may include, but not limited to, epoxy resin, for example.

In some embodiments, the sealing part 50 may overlap the thin-film encapsulation layer 170 of the display substrate 10. In other words, as illustrated in FIG. 2A, the sealing part 50 may be disposed between the thin-film encapsulation layer 170 and the color conversion substrate 30 in the non-display area NDA. In some embodiments, the sealing part 50 may directly contact the thin-film encapsulation layer 170. In an embodiment, as illustrated in FIG. 2A, the sealing part 50 may overlap the first lower inorganic layer 171 and the first upper inorganic layer 175 of the thin-film encapsulation layer 170 and may directly contact the first upper inorganic layer 175, for example.

However, the invention is not limited thereto. The relationship between the sealing part 50 and the thin-film encapsulation layer 170 may also be changed as illustrated in FIG. 2B. Specifically, as illustrated in FIG. 2B, a sealing part 50 may not overlap a thin-film encapsulation layer 170. In other words, as illustrated in FIG. 2B, ends of the thin-film encapsulation layer 170 may be disposed at a relatively inner side than the sealing part 50, and the thin-film encapsulation layer 170 and the sealing part 50 may not overlap each other.

A case where the display substrate 10 has the structure illustrated in FIG. 2A will be described below as an example. However, the invention is not limited thereto, and the relationship between the sealing part 50 and the thin-film encapsulation layer 170 on a display substrate of embodiments to be described later may also be changed as illustrated in FIG. 2B.

The filler 70 may be disposed in the space between the display substrate 10 and the color conversion substrate 30 and surrounded by the sealing part 50. The filler 70 may fill the space between the display substrate 10 and the color conversion substrate 30.

In some embodiments, the filler 70 may include a material capable of transmitting light. In some embodiments, the filler 70 may include an organic material. In an embodiment, the filler 70 may include a silicon-based organic material, an epoxy-based organic material, or a combination of a silicon-based organic material and an epoxy-based organic material, for example.

In some embodiments, the filler 70 may include a material having an extinction coefficient of substantially zero. A refractive index and an extinction coefficient are correlated, and the extinction coefficient decreases as the refractive index decreases. In an embodiment, when the refractive index is about 1.7 or less, for example, the extinction coefficient may converge to substantially zero. In some embodiments, the filler 70 may include a material having a refractive index of about 1.7 or less, for example. Accordingly, light provided by the self-light emitting element may be prevented or minimized from being transmitted through and absorbed by the filler 70. In some embodiments, the filler 70 may include an organic material having a refractive index of about 1.4 to about 1.6, for example.

Figure 3:
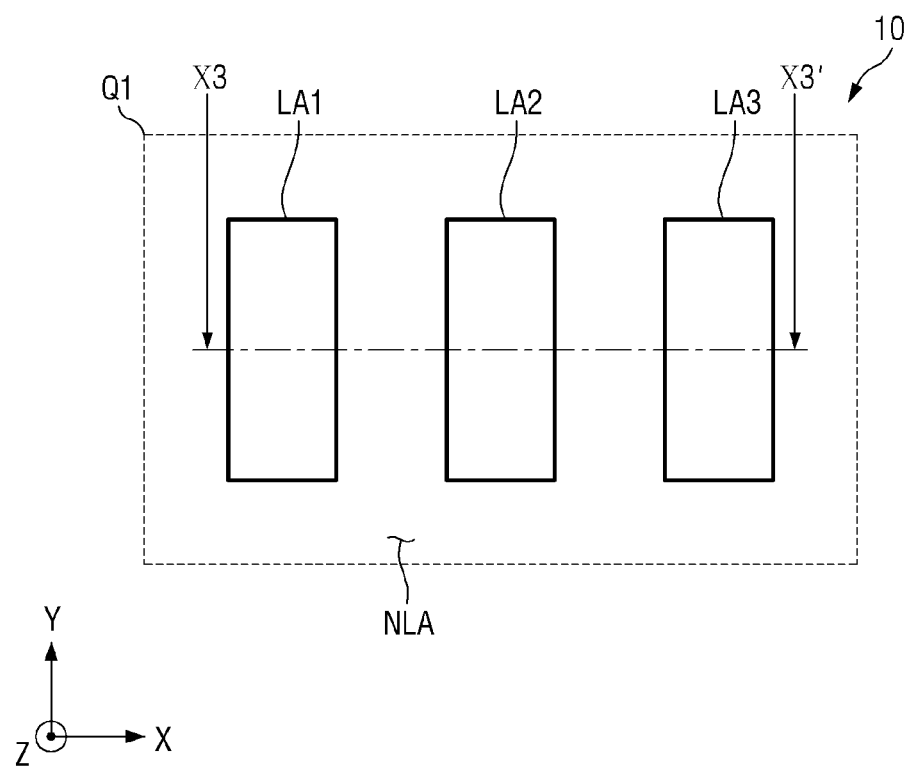
FIG. 3 is an enlarged plan view of part Q1 of FIG. 1, more specifically, a plan view of a display substrate included in the display device of FIG. 1.
Figure 4:
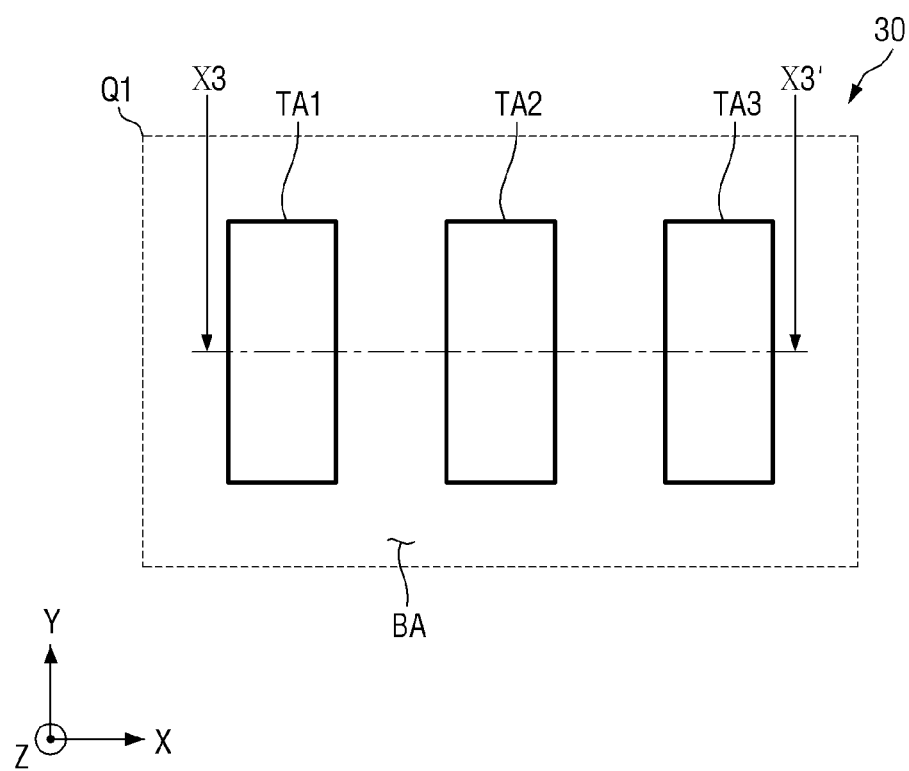
FIG. 4 is an enlarged plan view of part Q1 of FIG. 1, more specifically, a plan view of a color conversion substrate included in the display device of FIG. 1.
Figure 5:
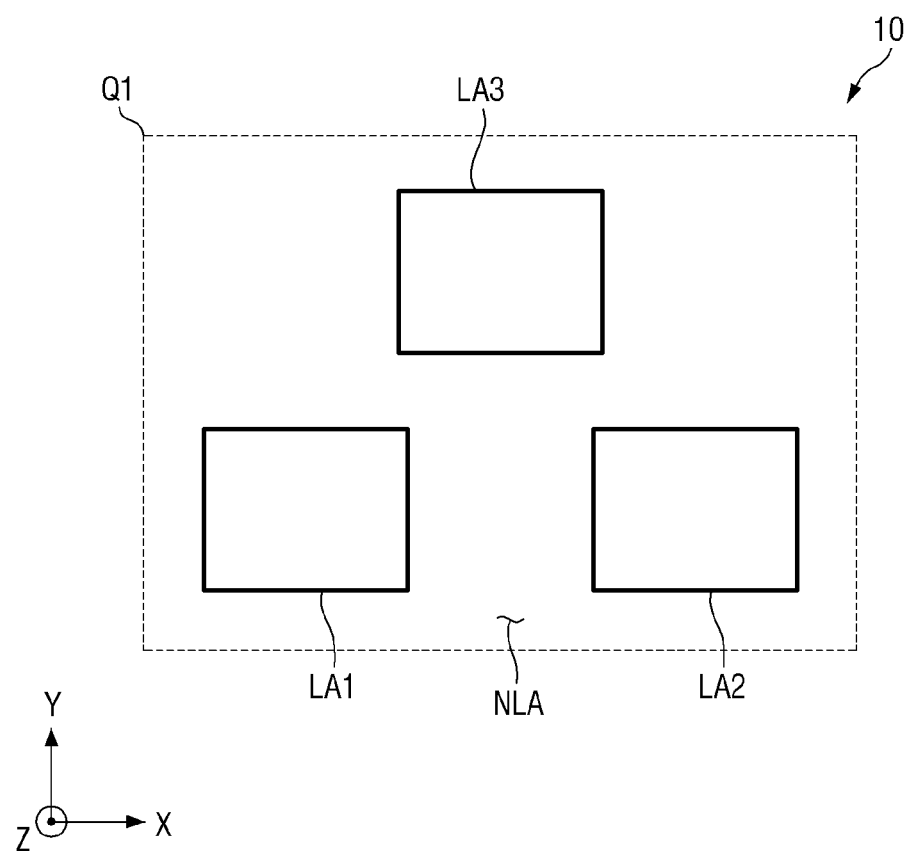
FIG. 5 is a plan view of another embodiment of FIG. 3.
Figure 6:
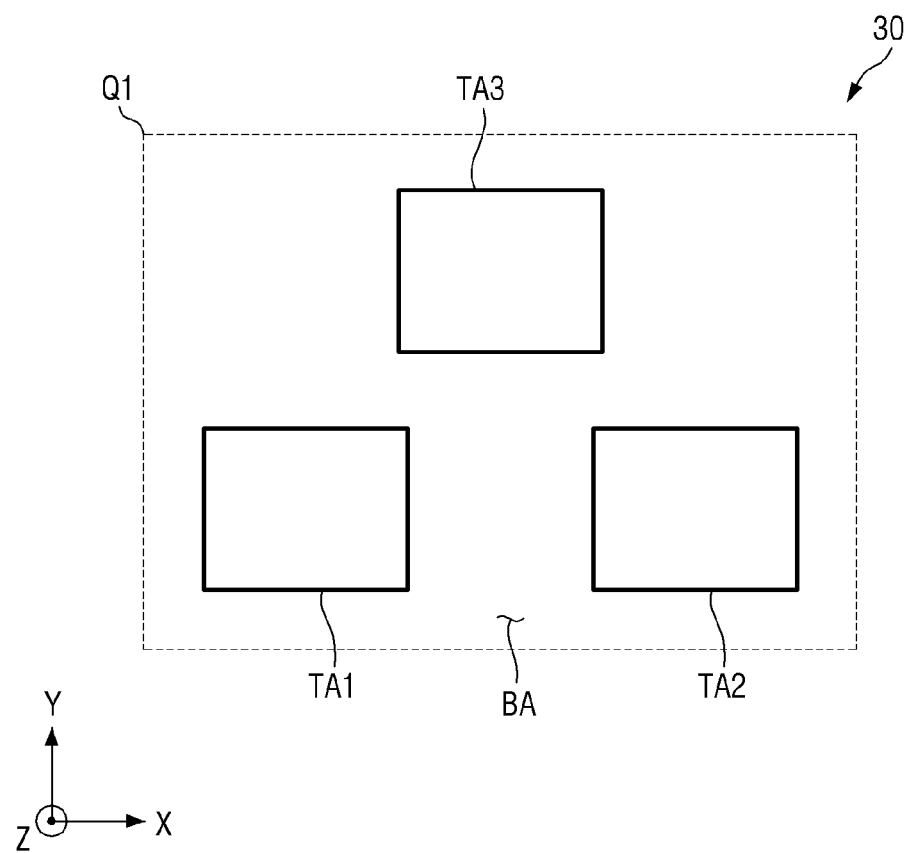
FIG. 6 is a plan view of another embodiment of FIG. 4.

FIG. 3 is an enlarged plan view of part Q1 of FIG. 1, more specifically, a plan view of the display substrate 10 included in the display device 1 of FIG. 1. FIG. 4 is an enlarged plan view of part Q1 of FIG. 1, more specifically, a plan view of the color conversion substrate 30 included in the display device 1 of FIG. 1. FIG. 5 is a plan view of another embodiment of FIG. 3. FIG. 6 is a plan view of another embodiment of FIG. 4.

Referring to FIGS. 3 through 6 in addition to FIGS. 1 and 2A, a plurality of light emitting regions and a non-light emitting region NLA may be defined in the display substrate 10 in the display area DA. In some embodiments, a first light emitting region LA1, a second light emitting region LA2, and a third light emitting region LA3 may be defined in the display area DA of the display substrate 10. Each of the first light emitting region LA1, the second light emitting region LA2, and the third light emitting region LA3 may be a region where light generated by a light emitting element of the display substrate 10 is emitted out of the display substrate 10, and the non-light emitting region NLA may be a region where light is not emitted out of the display substrate 10.

In some embodiments, light emitted from the first light emitting region LA1, the second light emitting region LA2, and the third light emitting region LA3 may be light of a third color. In some embodiments, the light of the third color may be blue light and may have a peak wavelength in the range of about 440 nanometers (nm) to about 480 nm, for example.

In some embodiments, the first light emitting region LA1, the second light emitting region LA2 and the third light emitting region LA3 may form one group, and a plurality of such groups may be defined in the display area DA.

In some embodiments, the first light emitting region LA1, the second light emitting region LA2, and the third light emitting region LA3 may be sequentially disposed along the first direction X as illustrated in FIG. 3. In some embodiments, the first light emitting region LA1, the second light emitting region LA2, and the third light emitting region LA3 forming one group may be repeatedly arranged in the display area DA along the first direction X and the second direction Y.

However, the invention is not limited thereto, and the arrangement of the first light emitting region LA1, the second light emitting region LA2, and the third light emitting region LA3 may be changed variously. In an embodiment, as illustrated in FIG. 5, the first light emitting region LA1 and the second light emitting region LA2 may neighbor each other along the first direction X, and the third light emitting region LA3 may be disposed on a side of the first light emitting region LA1 and the second light emitting region LA2 along the second direction Y, for example.

A case where the first light emitting region LA1, the second light emitting region LA2, and the third light emitting region LA3 are arranged as illustrated in FIG. 3 will be described below as an example.

In some embodiments, the non-display area NDA of the display substrate 10 may be disposed around the display area DA and may surround the display area DA.

A plurality of light transmitting regions and a light blocking region BA may be defined in the color conversion substrate 30 in the display area DA. Each of the light transmitting regions may be a region where light emitted from the display substrate 10 is transmitted through the color conversion substrate 30 and provided to the outside of the display device 1. The light blocking region BA may be a region through which light emitted from the display substrate 10 is not transmitted.

In some embodiments, a first light transmitting region TA1, a second light transmitting region TA2 and a third light transmitting region TA3 may be defined in the color conversion substrate 30.

The first light transmitting region TA1 may correspond to or may overlap the first light emitting region LA1. Similarly, the second light transmitting region TA2 may correspond to or overlap the second light emitting region LA2, and the third light transmitting region TA3 may correspond to or overlap the third light emitting region LA3.

In some embodiments, when the first light emitting region LA1, the second light emitting region LA2, and the third light emitting region LA3 are sequentially disposed along the first direction X as illustrated in FIG. 3, the first light transmitting region TA1, the second light transmitting region TA2, and the third light transmitting region TA3 may be sequentially disposed along the first direction X as illustrated in FIG. 4.

In an alternative embodiment, when the first light emitting region LA1 and the second light emitting region LA2 neighbor each other along the first direction X and the third light emitting region LA3 is disposed on a side of the first light emitting region LA1 and the second light emitting region LA2 along the second direction Y as illustrated in FIG. 5, the first light transmitting region TA1 and the second light transmitting region TA2 may neighbor each other along the first direction X, and the third light transmitting region TA3 may be disposed on a side of the first light transmitting region TA1 and the second light transmitting region TA2 along the second direction Y as illustrated in FIG. 6.

In some embodiments, light of the third color provided by the display substrate 10 may be transmitted through the first light transmitting region TA1, the second light transmitting region TA2 and the third light transmitting region TA3 and emitted out of the display device 1 in a state where a part of the light has been wavelength-converted while the other part has not been wavelength-converted. When light emitted out of the display device 1 in the first light transmitting region TA1 is referred to as first output light, light emitted out of the display device 1 in the second light transmitting region TA2 is referred to as second output light, and light emitted out of the display device 1 in the third light transmitting region TA3 is referred to as third output light, the first output light may be light of a first color, the second output light may be light of a second color different from the first color, and the third output light may be light of the third color. In some embodiments, the light of the third color may be blue light having a peak wavelength in the range of about 440 nm to about 480 nm as described above, and the light of the first color may be red light having a peak wavelength in the range of about 610 nm to about 650 nm, for example. In an embodiment, the light of the second color may be green light having a peak wavelength in the range of about 510 nm to about 550 nm, for example. The light of the first color and the light of the second color may be light into which the light of the third color has been wavelength-converted.

The light blocking region BA may be disposed around the first light transmitting region TA1, the second light transmitting region TA2, and the third light transmitting region TA3 of the color conversion substrate 30 in the display area DA. In some embodiments, the light blocking region BA may surround the first light transmitting region TA1, the second light transmitting region TA2, and the third light transmitting region TA3.

The structure of the display device 1 will now be described in more detail.

Figure 7:
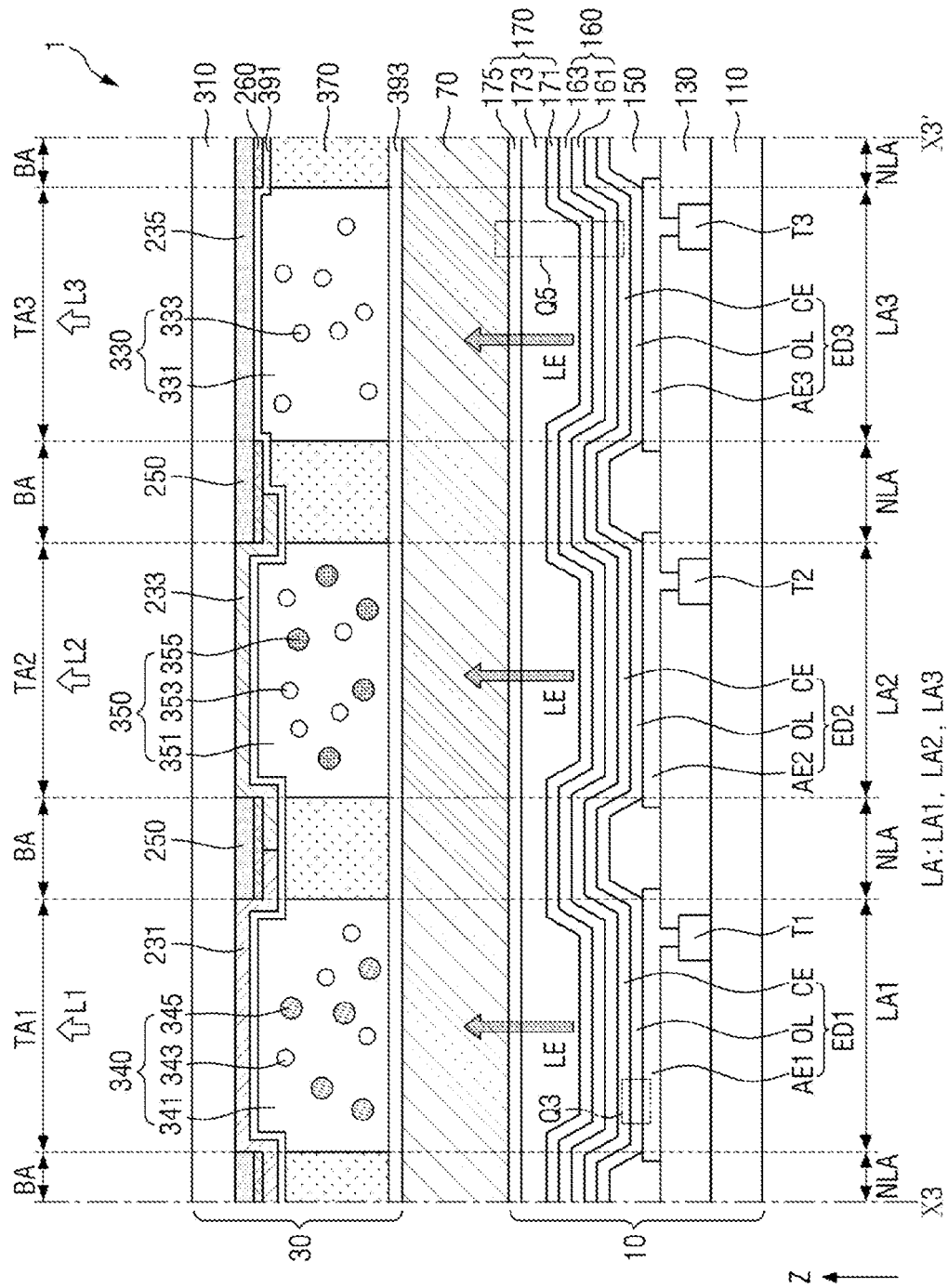
FIG. 7 is a cross-sectional view of the embodiment of the display device, taken along line X3-X3' of FIGS. 3 and 4.
Figure 8:
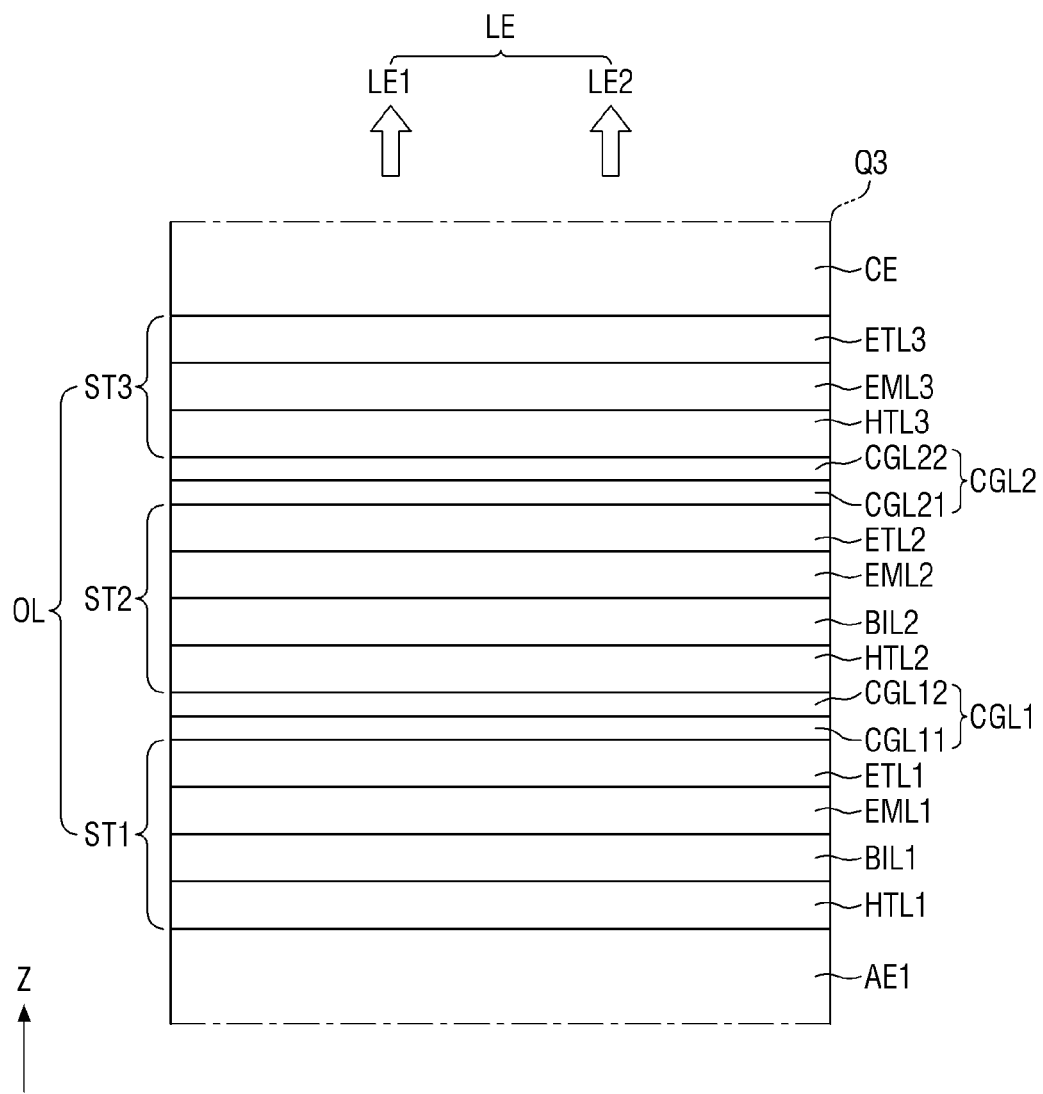
FIG. 8 is an enlarged cross-sectional view of part Q3 of FIG. 7.
Figure 9:
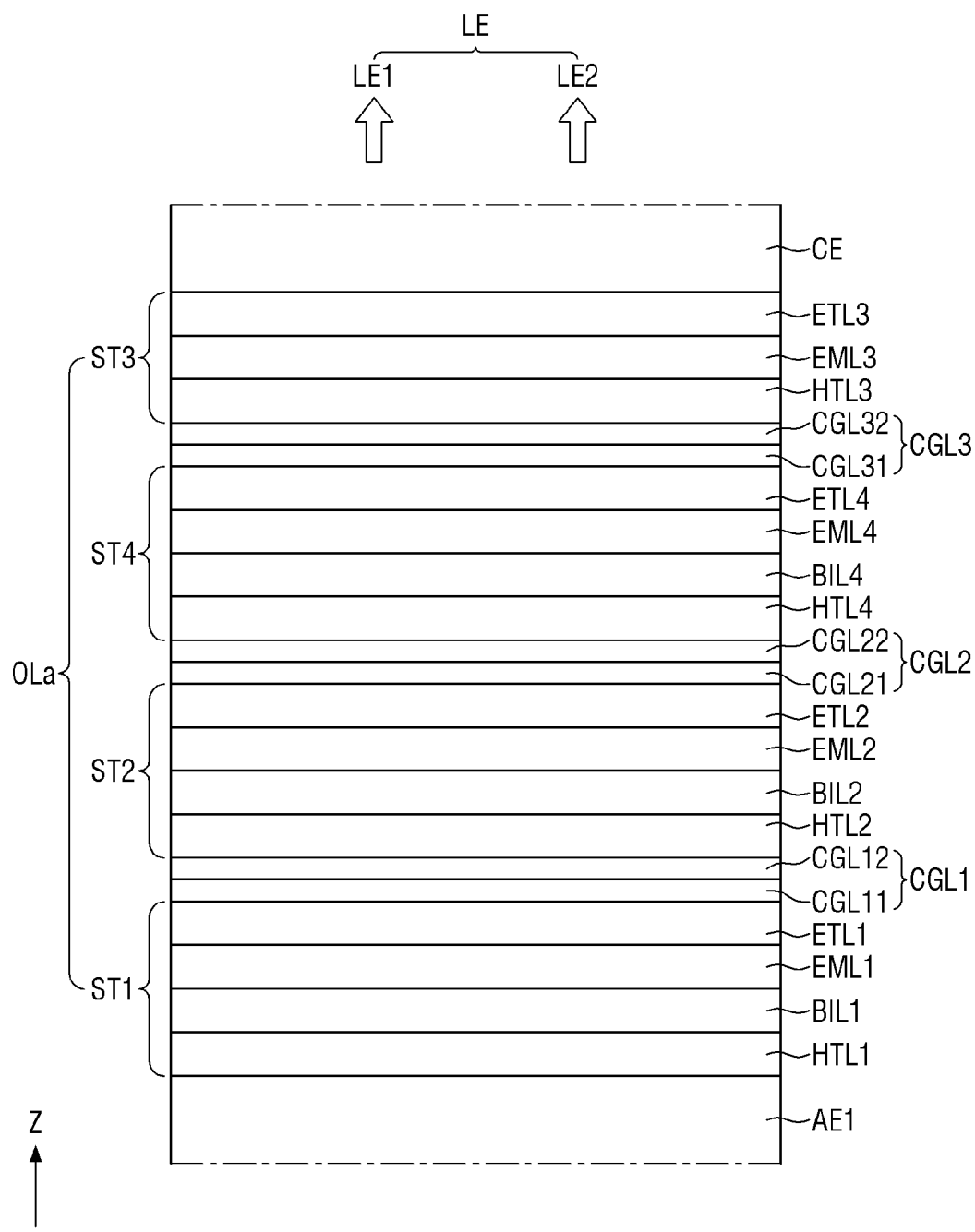
FIG. 9 is a cross-sectional view of another embodiment of the structure illustrated in FIG. 8.
Figure 10:
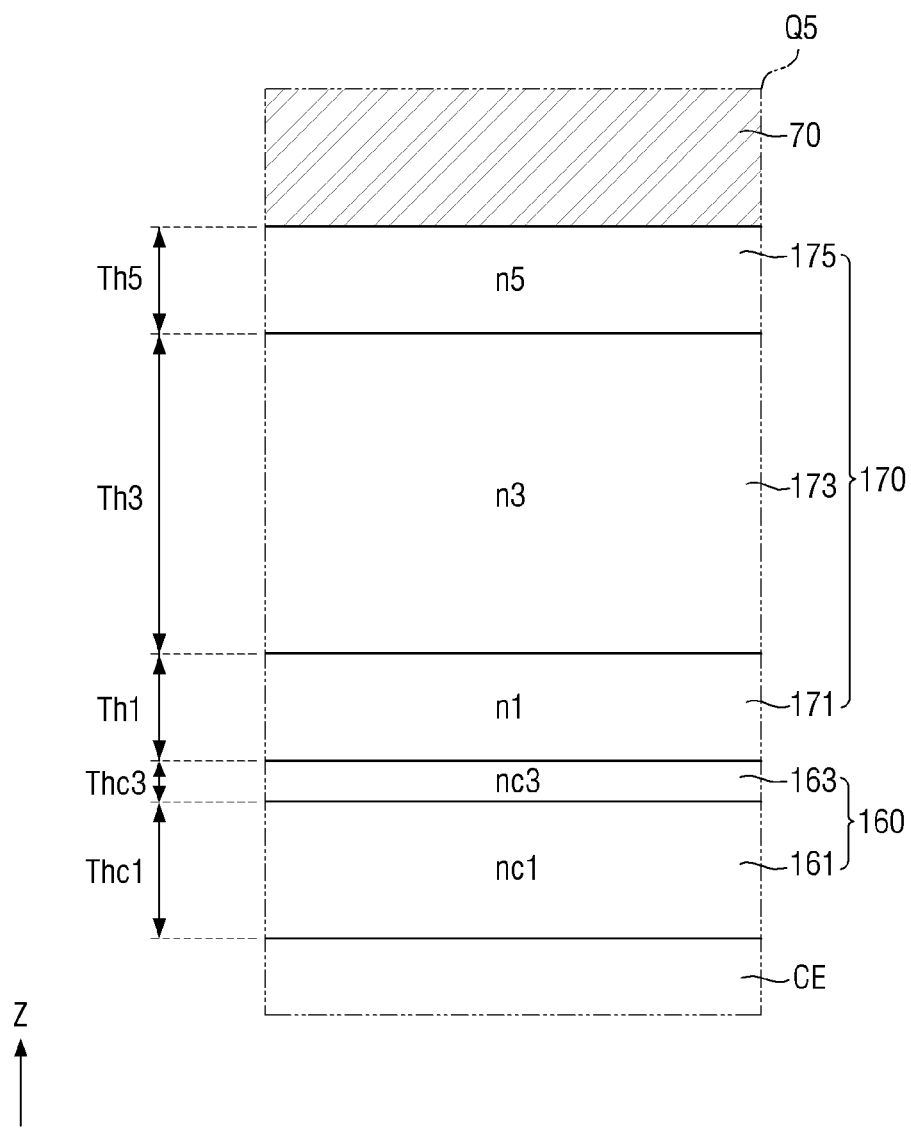
FIG. 10 is an enlarged cross-sectional view of part Q5 of FIG. 7.
Figure 11:
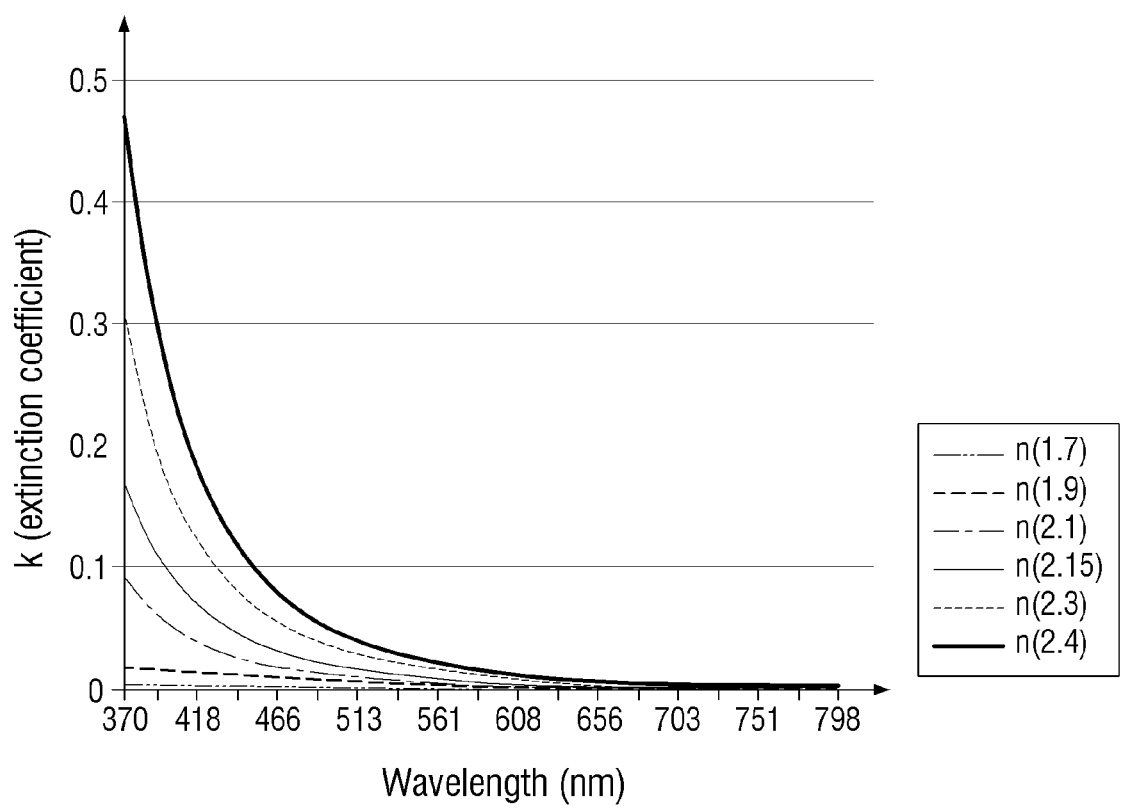
FIG. 11 is a graph illustrating the change in extinction coefficient according to the change in refractive index.
Figure 12:
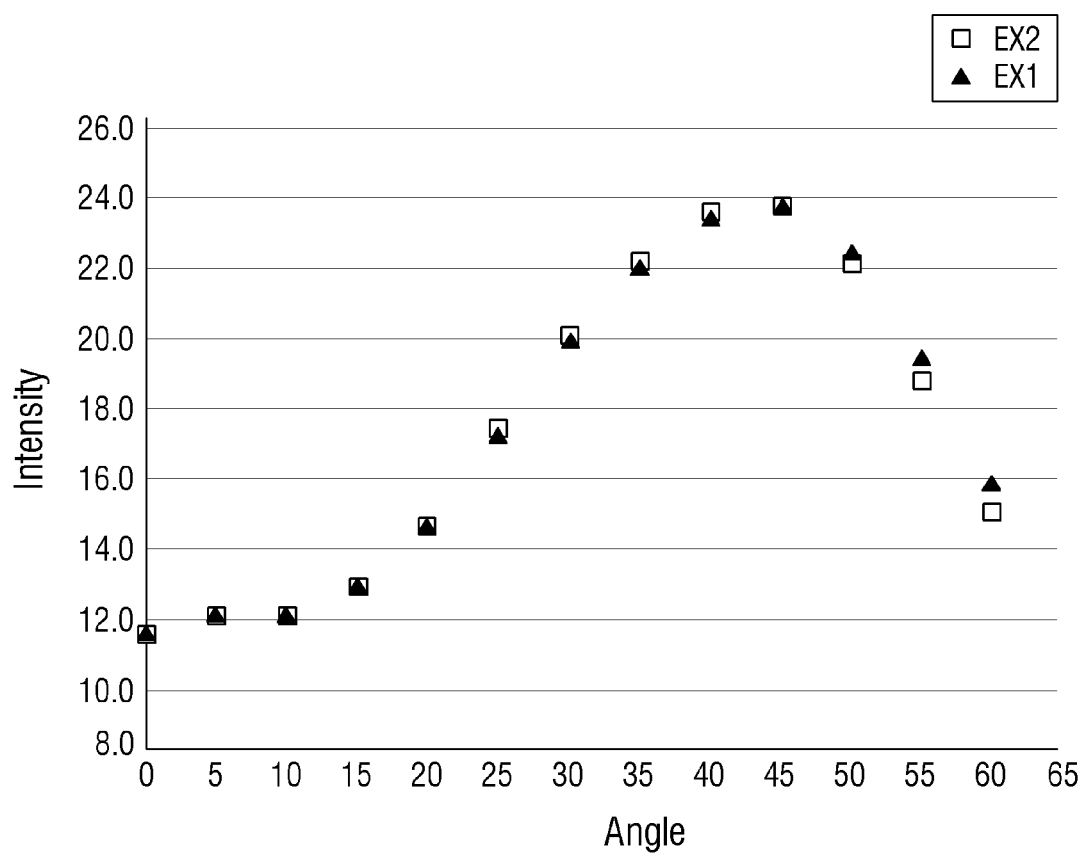
FIG. 12 is a graph illustrating light efficiency according to the structure of a capping layer.

FIG. 7 is a cross-sectional view of the embodiment of the display device 1, taken along line X3-X3' of FIGS. 3 and 4. FIG. 8 is an enlarged cross-sectional view of part Q3 of FIG. 7. FIG. 9 is a cross-sectional view of another embodiment of the structure illustrated in FIG. 8. FIG. 10 is an enlarged cross-sectional view of part Q5 of FIG. 7. FIG. 11 is a graph illustrating the change in extinction coefficient according to the change in refractive index. FIG. 12 is a graph illustrating light efficiency according to the structure of a capping layer.

Referring to FIGS. 7 through 12 in addition to FIGS. 1 and 2A, the display device 1 may include the display substrate 10 and the color conversion substrate 30 as described above and may further include the filler 70 disposed between the display substrate 10 and the color conversion substrate 30.

The display substrate 10 will now be described.

The first base 110 may include a light transmitting material. In some embodiments, the first base 110 may be a glass substrate or a plastic substrate. In some embodiments, the first base 110 may have flexibility. In some embodiments, the first base 110 may further include a separate layer located on the glass substrate or the plastic substrate, for example, a buffer layer or an insulating layer.

In some embodiments, the light emitting regions LA1 through LA3 and the non-light emitting region NLA may be defined in the first base 110 as described above.

As illustrated in FIG. 7, transistors T1 through T3 may be disposed on the first base 110. In some embodiments, each of the transistors T1 through T3 may be a thin-film transistor. In some embodiments, a first transistor T1 may overlap the first light emitting region LA1, a second transistor T2 may overlap the second light emitting region LA2, and a third transistor T3 may overlap the third light emitting region LA3. Although the first transistor T1, the second transistor T2 and the third transistor T3 overlap the light emitting regions LA and do not overlap the non-light emitting region NLA in the drawing, this is merely an example. In an embodiment, at least any one of the first transistor T1, the second transistor T2, and the third transistor T3 may overlap the non-light emitting region NLA. In an alternative embodiment, all of the first transistor T1, the second transistor T2 and the third transistor T3 may overlap the non-light emitting region NLA and may not overlap the light emitting regions LA.

Although not illustrated in the drawing, a plurality of signal lines (e.g., gate lines, data lines, and power lines) for transmitting signals to each transistor may be further disposed on the first base 110.

An insulating layer 130 may be disposed on the first transistor T1, the second transistor T2, and the third transistor T3. In some embodiments, the insulating layer 130 may be a planarization layer. In some embodiments, the insulating layer 130 may include an organic material. In an embodiment, the insulating layer 130 may include acrylic resin, epoxy resin, imide resin, or ester resin, for example. In some embodiments, the insulating layer 130 may include a photosensitive organic material.

A first anode AE1, a second anode AE2 and a third anode AE3 may be disposed on the insulating layer 130.

The first anode AE1 may overlap the first light emitting region LA1, and at least a part of the first anode AE1 may extend to the non-light emitting region NLA. The second anode AE2 may overlap the second light emitting region LA2, and at least a part of the second anode AE2 may extend to the non-light emitting region NLA. The third anode AE3 may overlap the third light emitting region LA3, and at least a part of the third anode AE3 may extend to the non-light emitting region NLA. The first anode AE1 may penetrate the third insulating layer 130 and may be connected to the first transistor T1, the second anode AE2 may penetrate the third insulating layer 130 and may be connected to the second transistor T2, and the third anode AE3 may penetrate the third insulating layer 130 and may be connected to the third transistor T3.

In some embodiments, the first anode AE1, the second anode AE2, and the third anode AE3 may be reflective electrodes. In this case, each of the first anode AE1, the second anode AE2, and the third anode AE3 may be a metal layer including at least any one of Ag, Mg, Al, Pt, Pd, Au, Ni, Nd, Ir, and Cr. In an embodiment, each of the first anode AE1, the second anode AE2, and the third anode AE3 may further include a metal oxide layer stacked on the metal layer. In an embodiment, each of the first anode AE1, the second anode AE2, and the third anode AE3 may have a multilayer structure such as a two-layer structure of indium tin oxide ("ITO")/Ag, Ag/ITO, ITO/Mg or ITO/MgF$_2$ or a three-layer structure of ITO/Ag/ITO.

A pixel defining layer 150 may be disposed on the first anode AE1, the second anode AE2, and the third anode AE3. An opening exposing the first anode AE1, an opening exposing the second anode AE2 and an opening exposing the third anode AE3 may be defined the pixel defining layer 150, and the pixel defining layer 150 may define the first light emitting region LA1, the second light emitting region LA2, the third light emitting region LA3 and the non-light emitting region NLA. That is, a region of the first anode AE1 which is exposed without being covered by the pixel defining layer 150 may be the first light emitting region LA1. Similarly, a region of the second anode AE2 which is exposed without being covered by the pixel defining layer 150 may be the second light emitting region LA2, and a region of the third anode AE3 which is exposed without being covered by the pixel defining layer 150 may be the third light emitting region LA3. In addition, a region where the pixel defining layer 150 is disposed may be the non-light emitting region NLA.

In some embodiments, the pixel defining layer 150 may include an omanic insulating material such as polyacrylates resin, epoxy resin, phenolic resin, polyamides resin, polyimides resin, unsaturated polyesters resin, polyphenylenethers resin, polyphenylenesulfides resin or benzocyclobutene ("BCB").

In some embodiments, the pixel defining layer 150 may overlap a color pattern 250 to be described later. In addition, the pixel defining layer 150 may further overlap a first color filter 231 and a second color filter 233.

In some embodiments, the pixel defining layer 150 may also overlap a bank pattern 370 to be described later.

As illustrated in FIG. 7, the light emitting layer OL may be disposed on the first anode AE1, the second anode AE2, and the third anode AE3.

In some embodiments, the light emitting layer OL may be in the shape of a continuous layer disposed over the light emitting regions LA1 through LA3 and the non-light emitting region NLA. The light emitting layer OL will be described in more detail later.

As illustrated in FIG. 7, the cathode CE may be disposed on the light emitting layer OL.

In some embodiments, the cathode CE may have translucency or transparency. When the cathode CE has translucency, it may include Ag, Mg, Cu, Al, Pt, Pd, Au, Ni, Nd, Ir, Cr, Li, Ca, LiF/Ca, Mo, Ti, or a compound or mixture of the same (e.g., a mixture of Ag and Mg). In addition, when a thickness of the cathode CE is tens to hundreds of angstroms, the cathode CE may have translucency.

When the cathode CE has transparency, it may include a transparent conductive oxide ("TCO"). In an embodiment, the cathode CE may include tungsten oxide (WxOy), titanium oxide (TiO$_2$), ITO, indium zinc oxide ("IZO"), zinc oxide (ZnO), indium tin zinc oxide ("ITZO"), or magnesium oxide (MgO), for example.

The first anode AE1, the light emitting layer OL and the cathode CE may constitute a first light emitting element ED1, the second anode AE2, the light emitting layer OL and the cathode CE may constitute a second light emitting element ED2, and the third anode AE3, the light emitting layer OL and the cathode CE may constitute a third light emitting element ED3. Each of the first light emitting element ED1, the second light emitting element ED2, and the third light emitting element ED3 may emit output light LE, and the output light LE may be provided to the color conversion substrate 30.

As illustrated in FIG. 8, the output light LE finally emitted from the light emitting layer OL may be a combination of a first light component LE1 and a second light component LE2. In an embodiment, each of the first light component LE1 and the second light component LE2 in the output light LE may have a peak wavelength of about 440 nm to less than about 480 nm, for example. That is, the peak wavelength may be equal to or greater than about 440 nm and less than about 480 nm. The first light component LE1 and the second light component LE2 may have the same peak wavelength as each other or different peak wavelengths from each other. That is, the output light LE may be blue light.

As illustrated in FIG. 8, in some embodiments, the light emitting layer OL may have a structure in which a plurality of light emitting layers overlaps may have a tandem structure, for example. In an embodiment, the light emitting layer OL may include a first stack ST1 including a first light emitting layer EML1, a second stack ST2 disposed on the first stack ST1 and including a second light emitting layer EML2, a third stack ST3 disposed on the second stack ST2 and including a third light emitting layer EML3, a first charge generation layer CGL1 disposed between the first stack ST1 and the second stack ST2, and a second charge generation layer CGL2 disposed between the second stack ST2 and the third stack ST3, for example. The first stack ST1, the second stack ST2, and the third stack ST3 may overlap each other.

The first light emitting layer EML1, the second light emitting layer EML2, and the third light emitting layer EML3 may overlap each other.

In some embodiments, the first light emitting layer EML1, the second light emitting layer EML2 and the third light emitting layer EML3 may all emit light of the third color, for example, blue light. In an embodiment, each of the first light emitting layer EML1, the second light emitting layer EML2 and the third light emitting layer EML3 may be a blue light emitting layer and may include an organic material, for example. However, the invention is not limited thereto. In an embodiment, at least any one of the first light emitting layer EML1, the second light emitting layer EML2 and the third light emitting layer EML3 may include an inorganic material that emits blue light. In an embodiment, at least any one of the first light emitting layer EML1, the second light emitting layer EML2 and the third light emitting layer EML3 may include an inorganic material-based light emitting element or may be a part of the inorganic material-based light emitting element, for example. In some embodiments, the inorganic material-based light emitting element may be a nano-sized inorganic light emitting element.

In some embodiments, at least any one of the first light emitting layer EML1, the second light emitting layer EML2 and the third light emitting layer EML3 may emit first blue light having a first peak wavelength, and at least another one of the first light emitting layer EML1, the second light emitting layer EML2 and the third light emitting layer EML3 may emit second blue light having a second peak wavelength different from the first peak wavelength. In an embodiment, any one of the first light emitting layer EML1, the second light emitting layer EML2 and the third light emitting layer EML3 may emit the first blue light having the first peak wavelength, and the other two of the first light emitting layer EML1, the second light emitting layer EML2 and the third light emitting layer EML3 may emit the second blue light having the second peak wavelength, for example. That is, the output light LE finally emitted from the light emitting layer OL may be a combination of the first light component LE1 and the second light component LE2, the first light component LE1 may be the first blue light having the first peak wavelength, and the second light component LE2 may be the second blue light having the second peak wavelength.

In some embodiments, any one of the first peak wavelength and the second peak wavelength may be in the range of about 440 nm to less than about 460 nm, for example. In an embodiment, the other one of the first peak wavelength and the second peak wavelength may be in the range of about 460 nm to about 480 nm, for example. However, the range of the first peak wavelength and the range of the second peak wavelength are not limited to this example. In an embodiment, the range of the first peak wavelength and the range of the second peak wavelength may all include 460 nm, for example. In some embodiments, any one of the first blue light and the second blue light may be light of a deep blue color, and the other one of the first blue light and the second blue light may be light of a sky blue color.

According to some embodiments, the output light LE emitted from the light emitting layer OL is blue light and may include a long wavelength component and a short wavelength component. Therefore, the light emitting layer OL may finally emit blue light having a broader emission peak as the output light LE, thereby improving color visibility at a side viewing angle compared with a conventional light emitting element that emits blue light having a sharp emission peak.

In some embodiments, each of the first light emitting layer EML1, the second light emitting layer EML2 and the third light emitting layer EML3 may include a host and a dopant. The host is not particularly limited as long as it is a commonly used material. In an embodiment, the host may include tris(8-hydroxyquinolino)aluminum (Alq3), 4,4'-bis(N-carbazolyl)-1,1'-biphenyl ("CBP"), poly(n-vinylcabazole) ("PVK"), 9,10-di(naphthalene-2-yl)anthracene ("ADN"), 4,4',4"-tris(carbazol-9-yl)-triphenylamine ("TCTA"), 1,3,5-tris(N-phenylbenzimidazole-2-yl)benzene (TPBi), 3-tert-butyl-9,10-di(naphth-2-yl)anthracene ("TBADN"), distyrylarylene ("DSA"), 4,4'-bis(9-carbazolyl)-2,2'-dimethyl-biphenyl ("CDBP"), or 2-methyl-9,10-bis(naphthalen-2-yl)anthracene) ("MADN"), for example.

Each of the first light emitting layer EML1, the second light emitting layer EML2 and the third light emitting layer EML3 which emit blue light may include, for example, a fluorescent material including any one of Spiro-DPVBi, Spiro-6P, distyryl-benzene ("DSB"), distlyry-arylene ("DSA"), a polyfluorene ("PFO")-based polymer, and a poly(p-phenylene vinylene) ("PPV")-based polymer. In an alternative embodiment, a phosphorescent material including an organometallic complex such as (4,6-F2ppy)2Irpic may be included. However, the material that emits blue light is not limited to the above examples.

As described above, at least one of the first light emitting layer EML1, the second light emitting layer EML2 and the third light emitting layer EML3 and at least another one of the first light emitting layer EML1, the second light emitting layer EML2 and the third light emitting layer EML3 emit blue light in different wavelength ranges. To emit blue light in different wavelength ranges, the first light emitting layer EML1, the second light emitting layer EML2 and the third light emitting layer EML3 may include the same material, and a method of adjusting a resonance distance may be used. In an alternative embodiment, to emit blue light in different wavelength ranges, at least one of the first light emitting layer EML1, the second light emitting layer EML2 and the third light emitting layer EML3 and at least another one of the first light emitting layer EML1, the second light emitting layer EML2 and the third light emitting layer EML3 may include different materials.

However, the invention is not limited thereto. In an embodiment, the first light emitting layer EML1, the second light emitting layer EML2 and the third light emitting layer EML3 may all emit blue light having a peak wavelength of about 440 nm to about 480 nm and may include the same material, for example.

In an alternative embodiment, at least any one of the first light emitting layer EML1, the second light emitting layer EML2 and the third light emitting layer EML3 may emit the first blue light having the first peak wavelength, another one of the first light emitting layer EML1, the second light emitting layer EML2 and the third light emitting layer EML3 may emit the second blue light having the second peak wavelength different from the first peak wavelength, and the other one of the first light emitting layer EML1, the second light emitting layer EML2 and the third light emitting layer EML3 may emit third blue light having a third peak wavelength different from the first peak wavelength and the second peak wavelength. In some embodiments, any one of the first peak wavelength, the second peak wavelength and the third peak wavelength may be in the range of about 440 nm to less than about 460 nm, for example.

Another one of the first peak wavelength, the second peak wavelength and the third peak wavelength may be in the range of about 460 nm to less than about 470 nm, and the other one of the first peak wavelength, the second peak wavelength and the third peak wavelength may be in the range of about 470 nm to about 480 nm, for example.

According to some embodiments, the output light LE emitted from the light emitting layer OL is blue light and includes a long wavelength component, a medium wavelength component and a short wavelength component. Therefore, the light emitting layer OL may finally emit blue light having a broader emission peak as the output light LE and improve color visibility at a side viewing angle.

According to the above-described embodiments, light efficiency may be increased, and the life of the display device may be extended as compared with a conventional light emitting element that does not employ a tandem structure, that is, a structure in which a plurality of light emitting layers are stacked.

In alternative embodiments, at least any one of the first light emitting layer EML1, the second light emitting layer EML2 and the third light emitting layer EML3 may emit light of the third color, for example, blue light, and at least another one of the first light emitting layer EML1, the second light emitting layer EML2 and the third light emitting layer EML3 may emit light of the second color, for example, green light. In some embodiments, blue light emitted from at least any one of the first light emitting layer EML1, the second light emitting layer EML2 and the third light emitting layer EML3 may have a peak wavelength in the range of about 440 nm to about 480 nm or about 460 nm to about 480 nm, for example. In an embodiment, green light emitted from at least another one of the first light emitting layer EML1, the second light emitting layer EML2 and the third light emitting layer EML3 may have a peak wavelength in the range of about 510 nm to about 550 nm, for example.

In an embodiment, any one of the first light emitting layer EML1, the second light emitting layer EML2 and the third light emitting layer EML3 may be a green light emitting layer that emits green light, and the other two of the first light emitting layer EML1, the second light emitting layer EML2 and the third light emitting layer EML3 may be blue light emitting layers that emit blue light, for example. When the other two of the first light emitting layer EML1, the second light emitting layer EML2 and the third light emitting layer EML3 are blue light emitting layers, blue light emitted from the two blue light emitting layers may have the same peak wavelength range or different peak wavelength ranges.

According to some embodiments, the output light LE emitted from the light emitting layer OL may be a combination of the first light component LE1 which is blue light and the second light component LE2 which is green light. In an embodiment, when the first light component LE1 is deep blue light and the second light component LE2 is green light, the output light LE may be light having a sky blue color, for example. Similarly to the above-described embodiments, the output light LE emitted from the light emitting layer OL is a combination of blue light and green light and includes a long wavelength component and a short wavelength component. Therefore, the light emitting layer OL may finally emit blue light having a broader emission peak as the output light LE and improve color visibility at a side viewing angle. In addition, since the second light component LE2 of the output light LE is green light, a green light component of light provided from the display device 1 to the outside may be supplemented. Accordingly, the color reproducibility of the display device 1 may be improved.

In some embodiments, a green light emitting layer among the first light emitting layer EML1, the second light emitting layer EML2, and the third light emitting layer EML3 may include a host and a dopant. The host included in the green light emitting layer is not particularly limited as long as it is a commonly used material. In an embodiment, the host may include tris(8-hydroxyquinolino)aluminum (Alq3), CBP, ADN, TCTA, 1,3,5-tris(N-phenylbenzimidazole-2-yl)benzene (TPBi), TBADN, DSA, CDBP, or MADN, for example.

In an embodiment, the dopant included in the green light emitting layer may be, for example, a fluorescent material including tris-(8-hydroyquinolato) aluminum(III) (Alq3) or a phosphorescent material such as fac tris(2-phenylpyridine) iridium (Ir(ppy)3), bis(2-phenylpyridine)(acetylacetonate) iridium(III) (Ir(ppy)2(acac)), or 2-phenyl-4-methylpyridine iridium (Ir(mpyp)3).

The first charge generation layer CGL1 may be disposed between the first stack ST1 and the second stack ST2. The first charge generation layer CGL1 may inject electric charges into each light emitting layer. The first charge generation layer CGL1 may control the charge balance between the first stack ST1 and the second stack ST2. The first charge generation layer CGL1 may include an n-type charge generation layer CGL11 and a p-type charge generation layer CGL12. The p-type charge generation layer CGL12 may be disposed on the n-type charge generation layer CGL11 and may be disposed between the n-type charge generation layer CGL11 and the second stack ST2.

The first charge generation layer CGL1 may have a structure in which the n-type charge generation layer CGL11 and the p-type charge generation layer CGL12 are in contact with each other. The n-type charge generation layer CGL11 is disposed closer to the anode AE1 (AE2 of FIG. 7, AE3 of FIG. 7) among the anode AE1 (AE2 of FIG. 7, AE3 of FIG. 7) and the cathode CE. The p-type charge generation layer CGL12 is disposed closer to the cathode CE among the anode AE1 (AE2 of FIG. 7, AE3 of FIG. 7) and the cathode CE. The n-type charge generation layer CGL11 supplies electrons to the first light emitting layer EML1 adjacent to the anode AE1 (AE2 of FIG. 7, AE3 of FIG. 7), and the p-type charge generation layer CGL12 supplies holes to the second light emitting layer EML2 included in the second stack ST2. Since the first charge generation layer CGL1 is disposed between the first stack ST1 and the second stack ST2 to provide electric charges to each light emitting layer, luminous efficiency may be improved, and a driving voltage may be lowered.

The first stack ST1 may be disposed on the first anode AE1, the second anode AE2 (refer to FIG. 7) and the third anode AE3 (refer to FIG. 7) and may further include a first hole transport layer HTL1, a first electron blocking layer BIL1 and a first electron transport layer ETL1.

The first hole transport layer HTL1 may be disposed on the first anode AE1, the second anode AE2 (refer to FIG. 7), and the third anode AE3 (refer to FIG. 7). The first hole transport layer HTL1 may facilitate the transportation of holes and may include a hole transport material. The hole transport material may include, but is not limited to, a carbazole derivative such as N-phenylcarbazole or polyvinylcarbazole, a fluorene derivative, a triphenylamine derivative such as N,N'-bis(3-methylphenyl)-N,N'-diphenyl-[1,1-biphenyl]-4,4'-diamine ("TPD") or 4,4',4"-tris(N-carbazolyl)triphenylamine ("TCTA"), N,N'-di(1-naphthyl)-

N,N'-diphenylbenzidine) ("NPB"), or 4,4'-Cyclohexylidene bis[N,N-bis(4-methylphenyl)benzenamine] ("TAPC").

The first electron blocking layer BIL1 may be disposed on the first hole transport layer HTL1 and may be disposed between the first hole transport layer HTL1 and the first light emitting layer EML1. The first electron blocking layer BIL1 may include a hole transport material and a metal or a metal combination in order to prevent electrons generated by the first light emitting layer EML1 from entering the first hole transport layer HTL1. In some embodiments, the first hole transport layer HTL1 and the first electron blocking layer BIL1 described above may be provided as a single layer in which their respective materials are mixed.

The first electron transport layer ETL1 may be disposed on the first light emitting layer EML1 and may be disposed between the first charge generation layer CGL1 and the first light emitting layer EML1. In some embodiments, the first electron transport layer ETL1 may include an electron transport material such as tris-(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline ("BCP"), 4,7-diphenyl-1,10-phenanthroline (Bphen), 3-(4-biphenyl)-4-phenyl-5-tert-butylphenyl-1,2,4-triazole ("TAZ"), 4-(naphthalen-1-yl)-3,5-diphenyl-4H-1,2,4-triazole ("NTAZ"), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), ADN, or a combination of the same. However, the invention is not limited to the type of the electron transport material. The second stack ST2 may be disposed on the first charge generation layer CGL1 and may further include a second hole transport layer HTL2, a second electron blocking layer BIL2 and a second electron transport layer ETL2.

The second hole transport layer HTL2 may be disposed on the first charge generation layer CGL1. The second hole transport layer HTL2 may include the same material as that of the first hole transport layer HTL1 or may include one or more materials selected from the materials exemplified as the materials included in the first hole transport layer HTL1. The second hole transport layer HTL2 may be composed of a single layer or a plurality of layers.

The second electron blocking layer BIL2 may be disposed on the second hole transport layer HTL2 and may be disposed between the second hole transport layer HTL2 and the second light emitting layer EML2. The second electron blocking layer BIL2 may have the same material and structure as the first electron blocking layer BIL1 or may include one or more materials selected from the materials exemplified as the materials included in the first electron blocking layer BIL1.

The second electron transport layer ETL2 may be disposed on the second light emitting layer EML2 and may be disposed between the second charge generation layer CGL2 and the second light emitting layer EML2. The second electron transport layer ETL2 may have the same material and structure as the first electron transport layer ETL1 or may include one or more materials selected from the materials exemplified as the materials included in the first electron transport layer ETL1. The second electron transport layer ETL2 may be composed of a single layer or a plurality of layers.

The second charge generation layer CGL2 may be disposed on the second stack ST2 and may be disposed between the second stack ST2 and the third stack ST3.

The second charge generation layer CGL2 may have the same structure as the first charge generation layer CGL1 described above. In an embodiment, the second charge generation layer CGL2 may include an n-type charge generation layer CGL21 disposed closer to the second stack ST2 and a p-type charge generation layer CGL22 disposed closer to the cathode CE, for example. The p-type charge generation layer CGL22 may be disposed on the n-type charge generation layer CGL21.

The second charge generation layer CGL2 may have a structure in which the n-type charge generation layer CGL21 and the p-type charge generation layer CGL22 are in contact with each other. The first charge generation layer CGL1 and the second charge generation layer CGL2 may include different materials or the same material.

The third stack ST3 may be disposed on the second charge generation layer CGL2 and may further include a third hole transport layer HTL3 and a third electron transport layer ETL3.

The third hole transport layer HTL3 may be disposed on the second charge generation layer CGL2. The third hole transport layer HTL3 may include the same material as that of the first hole transport layer HTL1 or may include one or more materials selected from the materials exemplified as the materials included in the first hole transport layer HTL1. The third hole transport layer HTL3 may be composed of a single layer or a plurality of layers. When the third hole transport layer HTL3 is composed of a plurality of layers, the layers may include different materials.

The third electron transport layer ETL3 may be disposed on the third light emitting layer EML3 and may be disposed between the cathode CE and the third light emitting layer EML3. The third electron transport layer ETL3 may have the same material and structure as the first electron transport layer ETL1 or may include one or more materials selected from the materials exemplified as the materials included in the first electron transport layer ETL1. The third electron transport layer ETL3 may be composed of a single layer or a plurality of layers. When the third electron transport layer ETL3 is composed of a plurality of layers, the layers may include different materials.

Although not illustrated in the drawing, a hole injection layer may be further disposed at least any one of between the first stack ST1 and the first anode AE1, between the second anode AE2 (refer to FIG. 7) and the third anode AE3 (refer to FIG. 7), between the second stack ST2 and the first charge generation layer CGL1, and between the third stack ST3 and the second charge generation layer CGL2. The hole injection layer may facilitate the injection of holes into the first light emitting layer EML1, the second light emitting layer EML2 and the third light emitting layer EML3. In some embodiments, the hole injection layer may include, but not limited to, any one or more of cuper phthalocyanine (CuPc), poly (3,4-ethylenedioxythiphene) ("PEDOT"), polyaniline ("PANI"), and N,N-dinaphthyl-N,N'-diphenyl benzidine ("NPD"). In some embodiments, the hole injection layer may be disposed between the first stack ST1 and the first anode AE1, between the second anode AE2 (refer to FIG. 7) and the third anode AE3 (refer to FIG. 7), between the second stack ST2 and the first charge generation layer CGL1, and between the third stack ST3 and the second charge generation layer CGL2.

Although not illustrated in the drawing, an electron injection layer may be further disposed between the third electron transport layer ETL3 and the cathode CE, between the second charge generation layer CGL2 and the second stack ST2, or between the first charge generation layer CGL1 and the first stack ST1. In an embodiment, the electron injection layer may facilitate the injection of electrons and may use tris(8-hydroxyquinolino)aluminum) (Alq3), PBD, TAZ, Spiro-PBD, BAlq, or SAlq, for example, but the invention is not limited thereto. In an embodiment, the electron injection layer may be a metal halide compound and may be any one or more of, e.g., $MgF_2$, LiF, NaF, KF, RbF, CsF, FrF, LiI, NaI, KI, RbI, CsI, FrI, and $CaF_2$, for example, but the invention is not limited thereto. In an alternative embodiment, the electron injection layer may include a lanthanum material such as Yb, Sm, or Eu, for example. In an alternative embodiment, the electron injection layer may include both a metal halide material and a lanthanum material such as RbI:Yb or KI:Yb, for example. When the electron injection layer includes both a metal halide material and a lanthanum material, the electron injection layer may be provided by co-deposition of the metal halide material and the lanthanum material. In some embodiments, the electron injection layer may be disposed between the third electron transport layer ETL3 and the cathode CE, between the second charge generation layer CGL2 and the second stack ST2 and between the first charge generation layer CGL1 and the first stack ST1.

The structure of the light emitting layer OL may also be modified from the above structure. In an embodiment, the light emitting layer OL may be modified to a light emitting layer OLa illustrated in FIG. 9, for example. Unlike the structure illustrated in FIG. 8, the light emitting layer OLa illustrated in FIG. 9 may further include a fourth stack ST4 disposed between the third stack ST3 and the second stack ST2 and may further include a third charge generation layer CGL3 disposed between the third stack ST3 and the second stack ST2.

The fourth stack ST4 may include a fourth light emitting layer EML4 and may further include a fourth hole transport layer HTL4, a third electron blocking layer BIL4 and a fourth electron transport layer ETL4.

Each of the first light emitting layer EML1, the second light emitting layer EML2, the third light emitting layer EML3 and the fourth light emitting layer EML4 included in the light emitting layer OLa may emit light of the third color, for example, blue light. At least any one of the first light emitting layer EML1, the second light emitting layer EML2, the third light emitting layer EML3 and the fourth light emitting layer EML4 and at least another one of the first light emitting layer EML1, the second light emitting layer EML2, the third light emitting layer EML3 and the fourth light emitting layer EML4 may emit blue light having different peak wavelength ranges.

In an alternative embodiment, at least any one of the first light emitting layer EML1, the second light emitting layer EML2, the third light emitting layer EML3 and the fourth light emitting layer EML4 may emit green light, and at least another one of the first light emitting layer EML1, the second light emitting layer EML2, the third light emitting layer EML3 and the fourth light emitting layer EML4 may emit blue light. In an embodiment, any one of the first light emitting layer EML1, the second light emitting layer EML2, the third light emitting layer EML3 and the fourth light emitting layer EML4 may be a green light emitting layer, and the other three light emitting layers may all be blue light emitting layers, for example.

The fourth hole transport layer HTL4 may be disposed on the second charge generation layer CGL2. The fourth hole transport layer HTL4 may include the same material as that of the first hole transport layer HTL1 or may include one or more materials selected from the materials exemplified as the materials included in the first hole transport layer HTL1. The fourth hole transport layer HTL4 may be composed of a single layer or a plurality of layers. When the fourth hole transport layer HTL4 is composed of a plurality of layers, the layers may include different materials.

The third electron blocking layer BIL4 may be disposed on the fourth hole transport layer HTL4 and may be disposed between the fourth hole transport layer HTL4 and the fourth light emitting layer EML4. The third electron blocking layer BIL4 may have the same material and structure as the first electron blocking layer BIL1 or may include one or more materials selected from the materials exemplified as the materials included in the first electron blocking layer BIL1. In some embodiments, the third electron blocking layer BIL4 may be omitted.

The fourth electron transport layer ETL4 may be disposed on the fourth light emitting layer EML4 and may be disposed between the third charge generation layer CGL3 and the fourth light emitting layer EML4. The fourth electron transport layer ETL4 may have the same material and structure as the first electron transport layer ETL1 or may include one or more materials selected from the materials exemplified as the materials included in the first electron transport layer ETL1. The fourth electron transport layer ETL4 may be composed of a single layer or a plurality of layers. When the fourth electron transport layer ETL4 is composed of a plurality of layers, the layers may include different materials.

The third charge generation layer CGL3 may have the same structure as the first charge generation layer CGL1 described above. In an embodiment, the third charge generation layer CGL3 may include an n-type charge generation layer CGL31 disposed closer to the fourth stack ST4 and a p-type charge generation layer CGL32 disposed closer to the cathode CE, for example. The p-type charge generation layer CGL32 may be disposed on the n-type charge generation layer CGL31.

Although not illustrated in the drawing, the electron injection layer may be further disposed between the fourth stack ST4 and the third charge generation layer CGL3. In addition, the hole injection layer may be further disposed between the fourth stack ST4 and the second charge generation layer CGL2.

In some embodiments, both the light emitting layer OL illustrated in FIG. 8 and the light emitting layer OLa illustrated in FIG. 9 may not include a red light emitting layer and thus may not emit light of the first color, for example, red light. That is, the output light LE may not include a light component having a peak wavelength in the range of about 610 nm to about 650 nm, for example.

As illustrated in FIG. 7, the first capping layer 160 may be disposed on the cathode CE. The first capping layer 160 may be disposed in all of the first light emitting region LA1, the second light emitting region LA2, the third light emitting region LA3, and the non-light emitting region NLA.

As illustrated in FIGS. 7 and 10, in some embodiments, the first capping layer 160 may include a first sub-capping layer 161 and a second sub-capping layer 163.

The first sub-capping layer 161 may be disposed on the cathode CE. The first sub-capping layer 161 disposed on the cathode CE may improve viewing angle characteristics and increase external luminous efficiency.

In some embodiments, a refractive index $nc1$ of the first sub-capping layer 161 may be greater than a refractive index $nc3$ of the second sub-capping layer 163. In some embodiments, the refractive index $nc1$ of the first sub-capping layer 161 may be about 1.9 to about 2.4, for example. In some embodiments, the first sub-capping layer 161 may include an organic material. In an embodiment, the first sub-capping layer 161 may include a triamine derivative, a carbazole biphenyl derivative, an arylenediamine derivative, or tris(8-hydroxyquinolino)aluminum (Alq3), and the above-described refractive index may be realized by adjusting the composition of such a derivative, for example.

In some embodiments, a thickness Thc1 of the first sub-capping layer 161 may be about 100 angstroms Å to about 1,000 Å, for example.

The second sub-capping layer 163 may be disposed on the first sub-capping layer 161 and disposed between the first sub-capping layer 161 and the thin-film encapsulation layer 170.

In some embodiments, the second sub-capping layer 163 may contact the thin-film encapsulation layer 170, in particular, may contact a lowest inorganic layer among the layers included in the thin-film encapsulation layer 170. In an embodiment, the second sub-capping layer 163 may directly contact the first lower inorganic layer 171 included in the thin-film encapsulation layer 170, for example.

In some embodiments, the second sub-capping layer 163 may have a relatively greater refractive index than an inorganic layer of the thin-film encapsulation layer 170 which contacts the second sub-capping layer 163. In an embodiment, the refractive index nc3 of the second sub-capping layer 163 may be greater than a refractive index n1 of the first lower inorganic layer 171, for example.

In some embodiments, the refractive index nc3 of the second sub-capping layer 163 may be smaller than the refractive index nc1 of the first sub-capping layer 161 and greater than the refractive index n1 of the first lower inorganic layer 171 of the thin-film encapsulation layer 170. That is, the refractive index nc3 of the second sub-capping layer 163 may satisfy a relation of "n1<nc3<nc1." In some embodiments, the refractive index nc3 of the second sub-capping layer 163 may have a value satisfying the relation of "n1<nc3<nc1" in the range of about 1.7 to about 2.0, for example.

In some embodiments, the second sub-capping layer 163 may include an organic material. In an embodiment, the second sub-capping layer 163 may include acrylic, polyimide, polyamide, or a tris(8-hydroxyquinolino)aluminum (Alq3), for example. In some embodiments, the second sub-capping layer 163 may include a different organic material from the first sub-capping layer 161.

In some embodiments, a thickness Thc3 of the second sub-capping layer 163 and the thickness Thc1 of the first sub-capping layer 161 may be different from each other. In some embodiments, the thickness Thc3 of the second sub-capping layer 163 may be smaller than the thickness Thc1 of the first sub-capping layer 161. In some embodiments, the thickness Thc3 of the second sub-capping layer 163 may have a value satisfying a relation of "Thc3<Thc1" in the range of about 10 Å to about 300 Å, for example.

When a difference in refractive index between two neighboring layers increases, the amount of light reflected at an interface between the two layers increases. That is, as the difference in refractive index between two layers becomes greater, the reflectance becomes greater. In addition, when light moves from a layer having a large refractive index to a layer having a small refractive index, when the difference in refractive index between the two layers increases, a critical angle at which total reflection occurs is reduced. Accordingly, the amount of light extracted to the outside may be reduced.

In the illustrated embodiment, the second sub-capping layer 163 is disposed between the first sub-capping layer 161 and the first lower inorganic layer 171 of the thin-film encapsulation layer 170, and the refractive index nc3 of the second sub-capping layer 163 is smaller than the refractive index nc1 of the first sub-capping layer 161 and greater than the refractive index n1 of the first lower inorganic layer 171 of the thin-film encapsulation layer 170. Therefore, it is possible to prevent the amount of light extracted to the outside from being reduced by total reflection. In particular, as the critical angle increases, the amount of light emitted at a predetermined inclination angle to a vertical direction (or the third direction Z) may be increased.

FIG. 12 is a graph illustrating light efficiency according to the structure of a capping layer, more specifically, a graph illustrating light efficiency according to whether the second sub-capping layer 163 is provided.

In FIG. 12, a first example EX1 represents the intensity of light for each light emission angle when the first capping layer 160 includes the second sub-capping layer 163 described above, and a second example EX2 represents the intensity of light for each light emission angle when the first capping layer 160 does not include the second sub-capping layer 163 described above.

Referring to FIG. 12, the first example EX1 and the second example EX2 have the same or similar intensity of emitted light in a section in which the light emission angle is approximately 0 degrees to 45 degrees. When the light emission angle exceeds 45 degrees, the intensity of emitted light is greater in the first example EX1 than in the second example EX2.

When the intensity of light having a predetermined emission angle increases, more light may be supplied relatively uniformly to wavelength conversion patterns 340 and 350 which will be described later, thereby increasing the amount of light that is wavelength-converted by the wavelength conversion patterns 340 and 350. This may ultimately improve the light efficiency of the display device 1 in the illustrated embodiment. Referring again to FIG. 7, the thin-film encapsulation layer 170 is disposed on the first capping layer 160. The thin-film encapsulation layer 170 is disposed in all of the first light emitting region LA1, the second light emitting region LA2, the third light emitting region LA3, and the non-light emitting region NLA. In some embodiments, the thin-film encapsulation layer 170 may directly cover the first capping layer 160.

In some embodiments, the thin-film encapsulation layer 170 may include the first lower inorganic layer 171, the first organic layer 173, and the first upper inorganic layer 175 sequentially stacked on the first capping layer 160.

The first lower inorganic layer 171 may be disposed on the second sub-capping layer 163. The first lower inorganic layer 171 may cover the first light emitting element ED1, the second light emitting element ED2, and the third light emitting element ED3 in the display area DA.

The first lower inorganic layer 171 may be disposed on the second sub-capping layer 163. In some embodiments, the first lower inorganic layer 171 may be disposed directly on the second sub-capping layer 163 and may contact the second sub-capping layer 163.

The first lower inorganic layer 171 may prevent moisture and oxygen from penetrating into the first light emitting element ED1, the second light emitting element ED2 and the third light emitting element ED3. That is, the first lower inorganic layer 171 may function as a barrier layer that prevents penetration of external moisture and oxygen. In some embodiments, the compressive stress of the first lower inorganic layer 171 may be about 0 MPa to about 200 MPa, for example.

In some embodiments, a thickness Th1 of the first lower inorganic layer 171 may be about 10 Å to about 50,000 Å, for example.

In some embodiments, the refractive index n1 of the first lower inorganic layer 171 may be smaller than the refractive index nc3 of the second sub-capping layer 163 and the refractive index nc1 of the first sub-capping layer 161.

In some embodiments, the refractive index n1 of the first lower inorganic layer 171 may have a value satisfying the relation of "nc1>nc3>n1" in the range of about 1.5 to about 1.7, for example. From a material point of view of a film or layer, a refractive index is one of the physical elements that indicate the density of the material. In some embodiments, the refractive index n1 of the first lower inorganic layer 171 may be about 1.5 or more and thus may function as a barrier layer.

As illustrated in FIG. 11, the extinction coefficient (k) increases as the refractive index increases and decreases as the refractive index decreases. In an embodiment, when the refractive index is about 1.7, the extinction coefficient converges to substantially zero as illustrated in the drawing for light having a wavelength of about 370 nm to about 800 nm, for example. A reduction in extinction coefficient denotes a reduction in light loss due to light absorption, which, in turn, denotes an increase in light efficiency. When the refractive index n1 of the first lower inorganic layer 171 is about 1.7 or less, light loss due to light absorption by the first lower inorganic layer 171 may be prevented. Consequently, the light efficiency may be increased.

Therefore, in some embodiments, the refractive index n1 of the first lower inorganic layer 171 may be about 1.5 to about 1.7 in consideration of barrier properties and extinction coefficient.

In some embodiments, the first lower inorganic layer 171 may include an inorganic material and may include oxide or oxynitride. In an embodiment, the first lower inorganic layer 171 may include silicon oxide, silicon oxynitride, aluminum oxide, aluminum oxynitride, tungsten oxide, tungsten oxynitride, titanium oxide, or titanium oxynitride, for example.

The first organic layer 173 may be disposed on the first lower inorganic layer 171. The first organic layer 173 may cover the first light emitting element ED1, the second light emitting element ED2, and the third light emitting element ED3 in the display area DA.

In some embodiments, the first organic layer 173 may include acrylic resin, methacrylic resin, polyisoprene, vinyl resin, epoxy resin, urethane resin, cellulose resin, or perylene resin.

In some embodiments, a thickness Th3 of the first organic layer 173 may be about 2 micrometers (μm) to about 8 μm, for example.

The first upper inorganic layer 175 may be disposed on the first organic layer 173. The first upper inorganic layer 175 may cover the first organic layer 173. Although not illustrated in the drawings, in some embodiments, the first upper inorganic layer 175 may directly contact the first lower inorganic layer 171 in the non-display area NDA to form an inorganic-inorganic bond.

In some embodiments, a thickness Th5 of the first upper inorganic layer 175 may be about 10 Å to about 50,000 Å, for example.

In some embodiments, the first upper inorganic layer 175 may include an inorganic material and may include oxide or oxynitride. In an embodiment, the first upper inorganic layer 175 may include silicon oxide, silicon oxynitride, aluminum oxide, aluminum oxynitride, tungsten oxide, tungsten oxynitride, titanium oxide, or titanium oxynitride, for example.

In some embodiments, a refractive index n5 of the first upper inorganic layer 175 may be about 1.5 to about 1.7.

Since the inorganic layers included in the thin-film encapsulation layer 170 have a refractive index of about 1.7 or less, the extinction coefficient may converge to substantially zero. Therefore, light loss in the inorganic layers included in the thin-film encapsulation layer 170 may be prevented, and the light efficiency may be improved.

The structure of the first capping layer 160 and the structure of the thin-film encapsulation layer 170 may be variously modified from the above-described structures.

Figure 13:
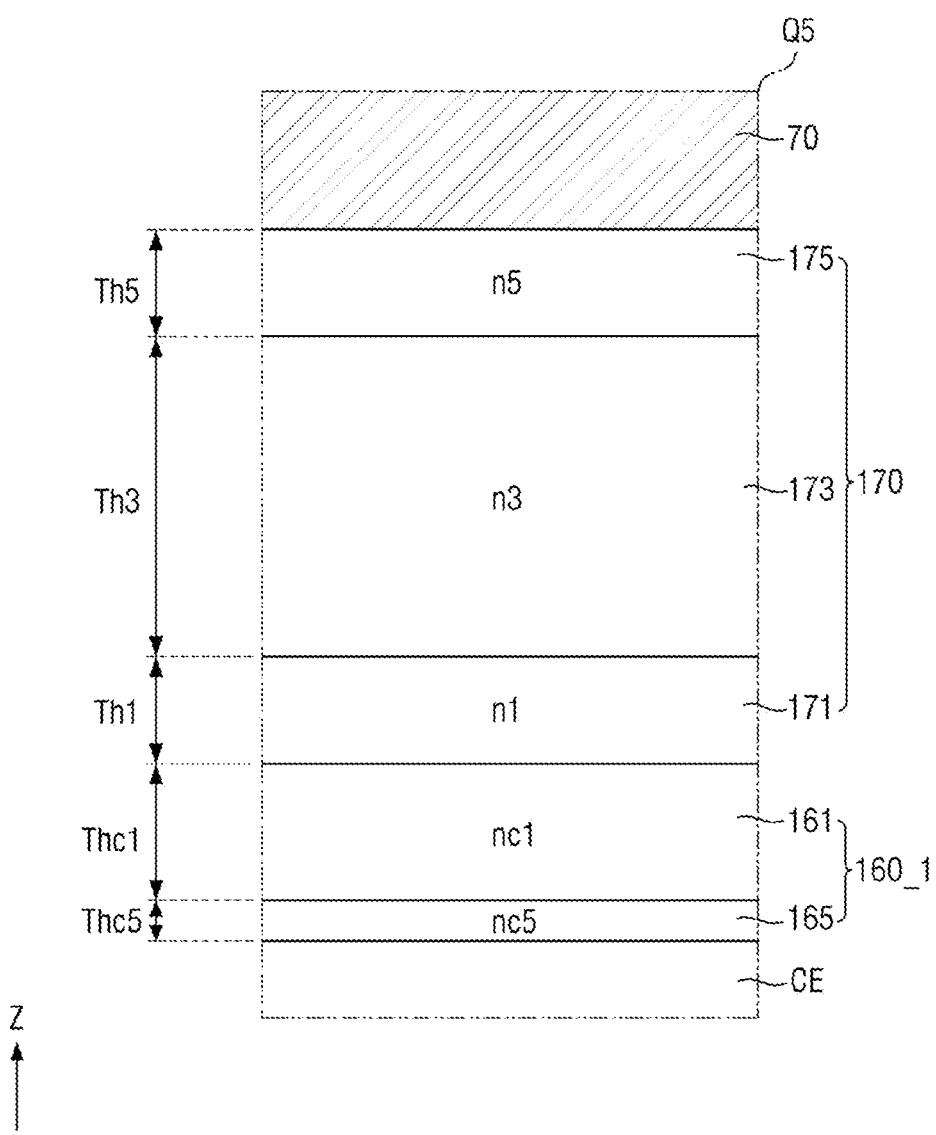
FIG. 13 is a cross-sectional view of another embodiment of FIG. 10.
Figure 14:
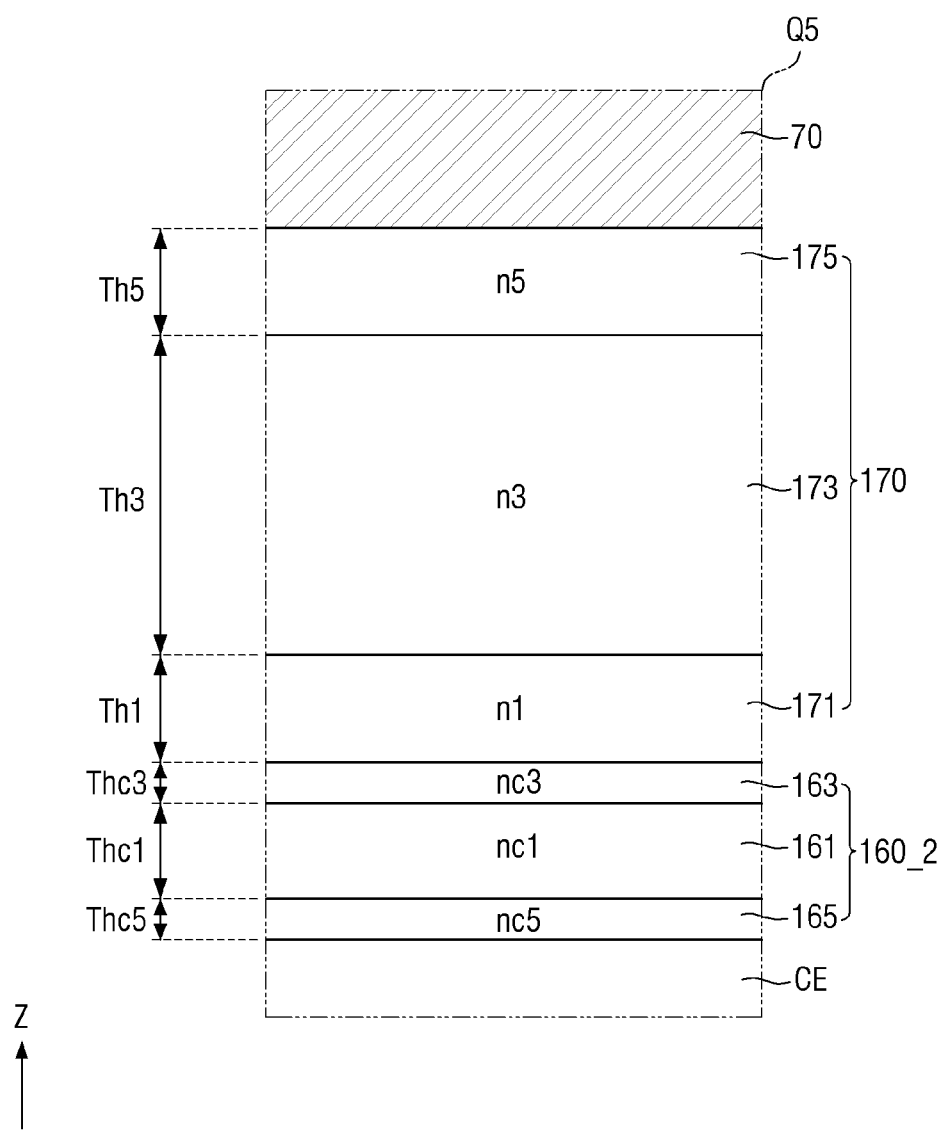
FIG. 14 is a cross-sectional view of another embodiment of FIG. 10.
Figure 15:
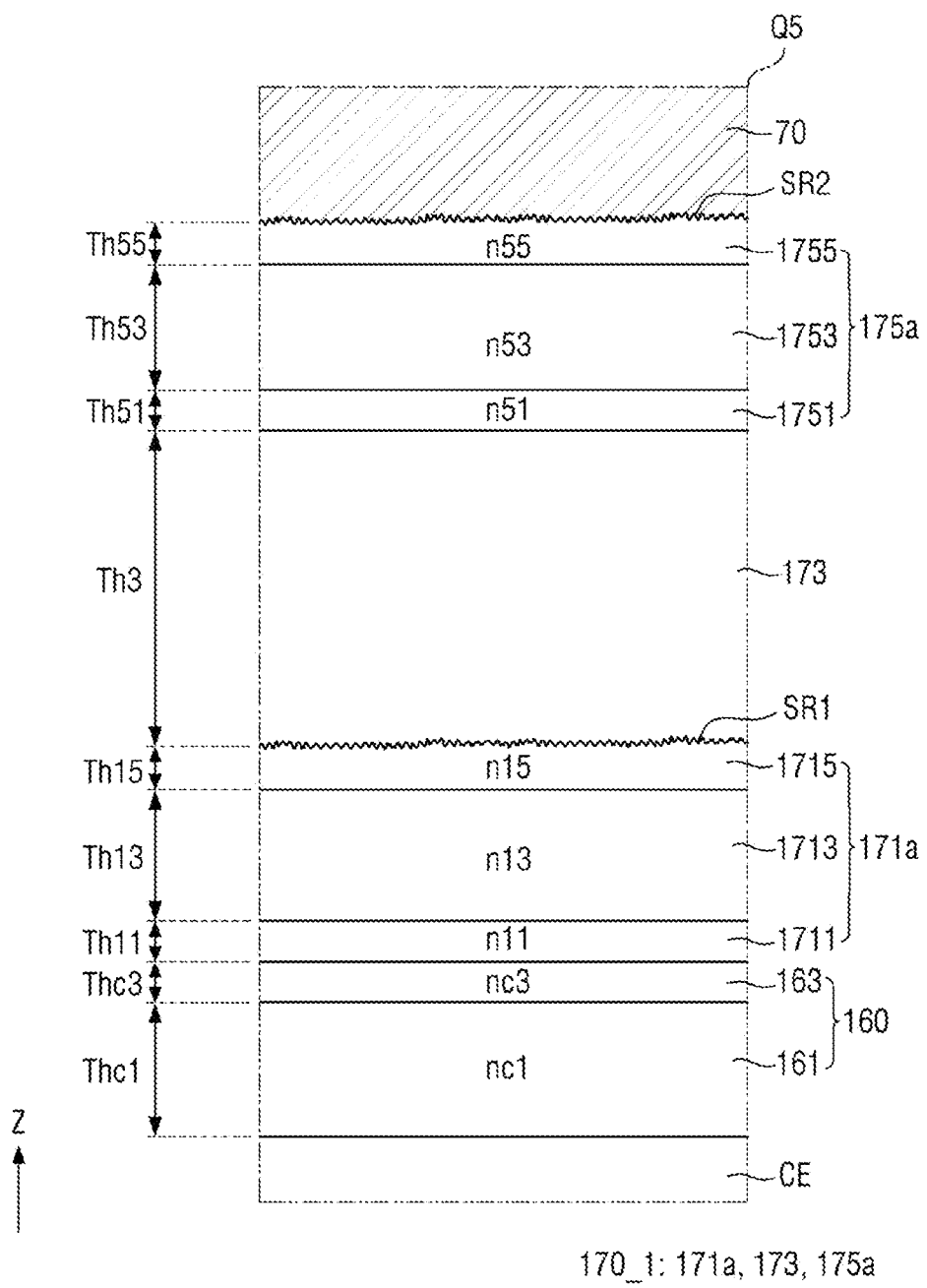
FIG. 15 is a cross-sectional view of another embodiment of FIG. 10.
Figure 16:
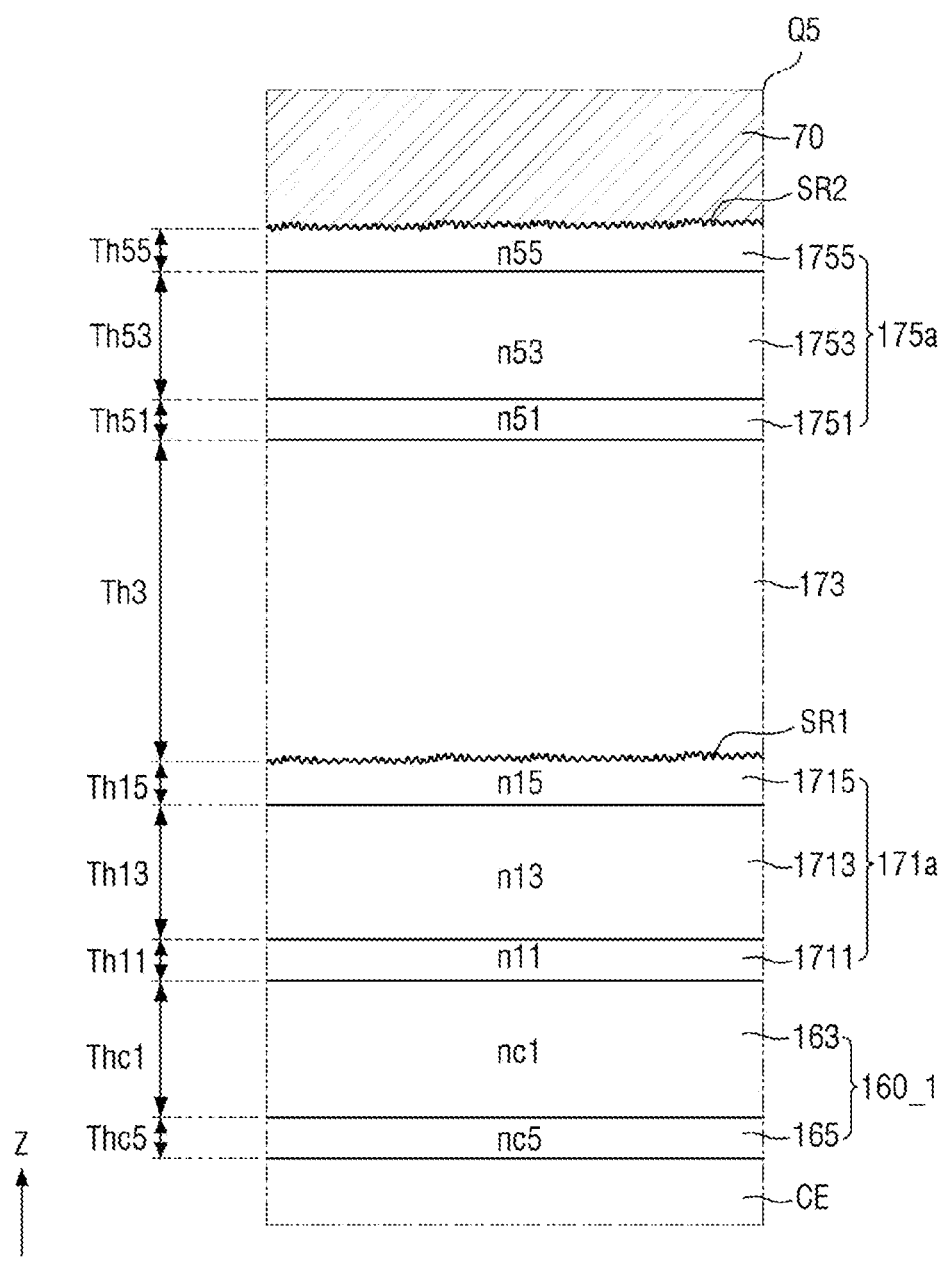
FIG. 16 is a cross-sectional view of another embodiment of FIG. 10.
Figure 17:
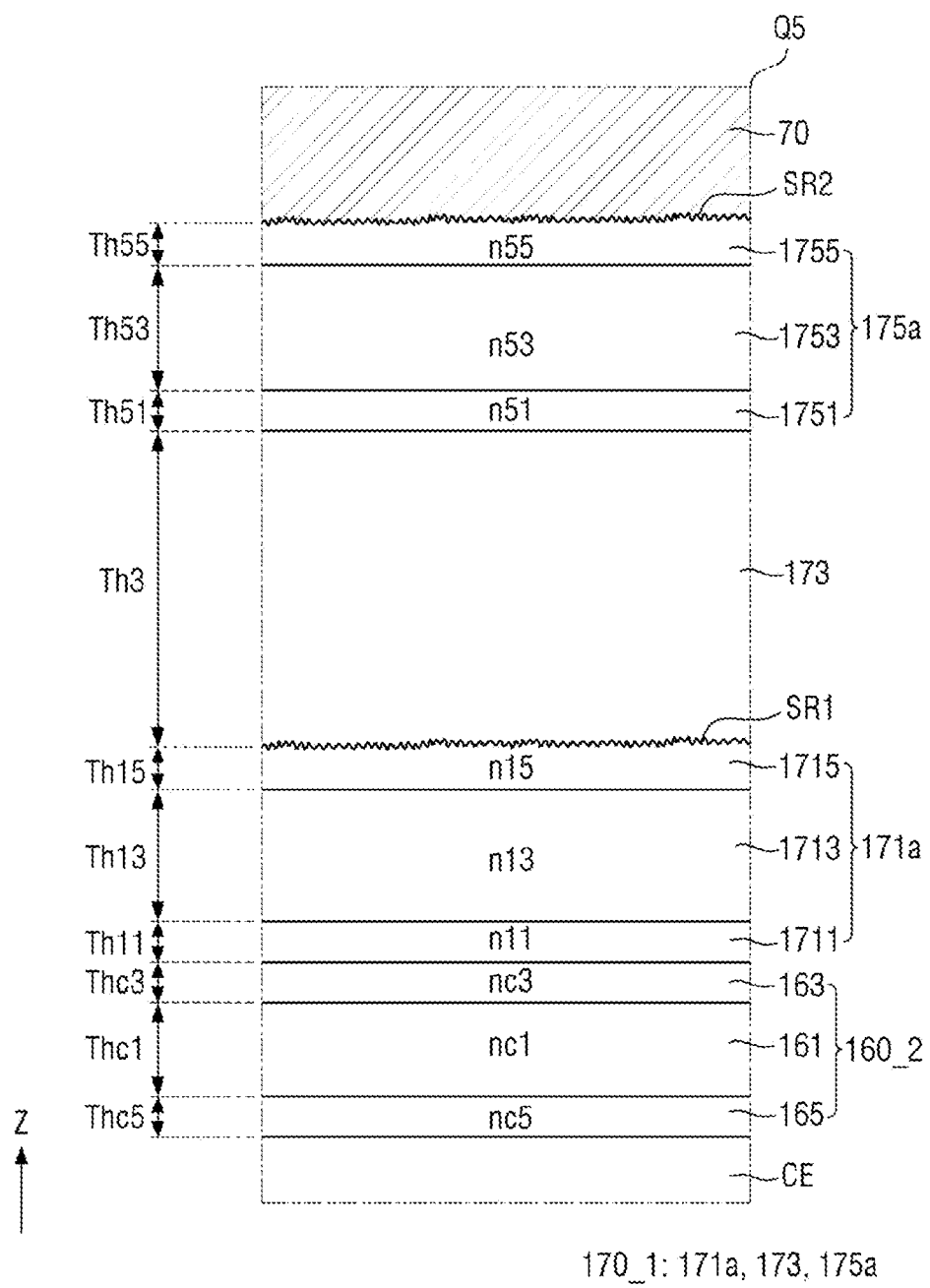
FIG. 17 is a cross-sectional view of another embodiment of FIG. 10.

FIG. 13 is a cross-sectional view of another embodiment of FIG. 10. FIG. 14 is a cross-sectional view of another embodiment of FIG. 10. FIG. 15 is a cross-sectional view of another embodiment of FIG. 10. FIG. 16 is a cross-sectional view of another embodiment of FIG. 10. FIG. 17 is a cross-sectional view of another embodiment of FIG. 10.

Referring to FIG. 13, the first capping layer 160 (refer to FIG. 10) may be modified to a first capping layer 160_1 illustrated in FIG. 13. The first capping layer 160_1 may include a first sub-capping layer 161 and a third sub-capping layer 165.

The first sub-capping layer 161 may be disposed on a cathode CE, and the third sub-capping layer 165 may be disposed between the first sub-capping layer 161 and the cathode CE.

In some embodiments, the first sub-capping layer 161 may contact a thin-film encapsulation layer 170, in particular, may contact a lowest inorganic layer among the layers included in the thin-film encapsulation layer 170. In an embodiment, the first sub-capping layer 161 may contact a first lower inorganic layer 171, for example.

A refractive index nc1 of the first sub-capping layer 161 may be greater than a refractive index n1 of the first lower inorganic layer 171 as described above.

In some embodiments, a refractive index nc5 of the third sub-capping layer 165 may be greater than the refractive index nc1 of the first sub-capping layer 161 and the refractive index n1 of the first lower inorganic layer 171 of the thin-film encapsulation layer 170. That is, the refractive index nc5 of the third sub-capping layer 165 may satisfy a relation of "n1<nc1<nc5." In some embodiments, the refractive index nc5 of the third sub-capping layer 165 may have a value satisfying the relation of "n1<nc1<nc5" in the range of about 2.0 to about 2.7.

In some embodiments, the third sub-capping layer 165 may include an organic material. In an embodiment, the third sub-capping layer 165 may include a triamine derivative, a carbazole biphenyl derivative, an arylenediamine derivative, or a tris(8-hydroxyquinolino)aluminum (Alq3), and a material having the above-described refractive index according to wavelength may be realized by adjusting the composition of such a derivative, for example. In an alternative embodiment, the third sub-capping layer 165 may include a complex structure of an organic material and an inorganic material.

In some embodiments, a thickness Thc5 of the third sub-capping layer 165 and a thickness Thc1 of the first sub-capping layer 161 may be different from each other. In some embodiments, the thickness Thc5 of the third sub-capping layer 165 may be smaller than the thickness Thc1 of the first sub-capping layer 161. In some embodiments, the thickness Thc5 of the third sub-capping layer 165 may have a value satisfying a relation of "Thc5<Thc1" in the range of about 10 Å to about 300 Å, for example.

Referring to FIG. 14, the first capping layer 160 (refer to FIG. 10) may be modified to a first capping layer 160_2 illustrated in FIG. 14. The first capping layer 160_2 may include a first sub-capping layer 161, a second sub-capping layer 163, and a third sub-capping layer 165.

The first sub-capping layer 161 may be disposed on a cathode CE, the third sub-capping layer 165 may be disposed between the first sub-capping layer 161 and the cathode CE, and the second sub-capping layer 163 may be disposed between a first lower inorganic layer 171 and the first sub-capping layer 161.

In some embodiments, the third sub-capping layer 165 may contact the cathode CE, and the second sub-capping layer 163 may contact the first lower inorganic layer 171 of a thin-film encapsulation layer 170.

In some embodiments, a refractive index nc5 of the third sub-capping layer 165 may be greater than a refractive index nc1 of the first sub-capping layer 161 and a refractive index n1 of the first lower inorganic layer 171 of the thin-film encapsulation layer 170, and a refractive index nc3 of the second sub-capping layer 163 may be smaller than the refractive index nc1 of the first sub-capping layer 161 and greater than the refractive index n1 of the first lower inorganic layer 171 of the thin-film encapsulation layer 170. That is, the magnitude relationship between the refractive index of each layer may satisfy a relation of "n1<nc3<nc1<nc5."

Other details of the first sub-capping layer 161, the second sub-capping layer 163 and the third sub-capping layer 165 are the same as those described above, and thus a description thereof is omitted.

Referring to FIG. 15, the thin-film encapsulation layer 170 (refer to FIG. 10) may be modified to a thin-film encapsulation layer 170_1 illustrated in FIG. 15.

The thin-film encapsulation layer 170_1 may include a first lower inorganic layer 171a, a first organic layer 173, and a first upper inorganic layer 175a.

The first lower inorganic layer 171a may include an inorganic material and have a multilayer structure. In some embodiments, as illustrated in FIG. 15, the first lower inorganic layer 171a may include a first sub-inorganic layer 1711 and a second sub-inorganic layer 1713. In addition, the first lower inorganic layer 171a may further include a third sub-inorganic layer 1715.

The first sub-inorganic layer 1711 may be disposed on a first capping layer 160. The first sub-inorganic layer 1711 may prevent the first capping layer 160 from being damaged in the process of forming the second sub-inorganic layer 1713. That is, the first sub-inorganic layer 1711 may function as a protective layer that protects the first capping layer 160. In some embodiments, the compressive stress of the first sub-inorganic layer 1711 may be about 0 MPa to about 200 MPa, for example.

The first lower inorganic layer 171a may contact a second sub-capping layer 163, in particular, the first sub-inorganic layer 1711 which is a lowest inorganic layer of the thin-film encapsulation layer 170_1 may contact the second sub-capping layer 163.

The second sub-inorganic layer 1713 may be disposed on the first sub-inorganic layer 1711. The second sub-inorganic layer 1713 may prevent moisture and oxygen from penetrating into the first light emitting element ED1, the second light emitting element ED2 and the third light emitting element ED3. That is, the second sub-inorganic layer 1713 may function as a barrier layer that prevents penetration of external moisture and oxygen. In some embodiments, the compressive stress of the second sub-inorganic layer 1713 may be about 0 MPa to about 200 MPa, for example.

The third sub-inorganic layer 1715 may be disposed on the second sub-inorganic layer 1713. An upper surface of the third sub-inorganic layer 1715 may directly contact the first organic layer 173. In some embodiments, an uneven structure SR1 may be provided on the upper surface of the third sub-inorganic layer 1715 which directly contacts the first organic layer 173. Since the uneven structure SR1 is provided on the upper surface of the third sub-inorganic layer 1715, the upper surface of the third sub-inorganic layer 1715 may have a relatively greater surface roughness than that of an upper surface of the first sub-inorganic layer 1711 which contacts the second sub-inorganic layer 1713 or an upper surface of the second sub-inorganic layer 1713 which contacts the third sub-inorganic layer 1715.

In some embodiments, the uneven structure SR1 may be provided in any irregular pattern or irregular uneven shape. Since the uneven structure SR1 is provided on the upper surface of the third sub-inorganic layer 1715, the spreadability of an organic material in the process of forming the first organic layer 173 may be improved, and the organic material may spread on the third sub-inorganic layer 1715 relatively uniformly. In addition, since the uneven structure SR1 increases a contact area between the third sub-inorganic layer 1715 and the first organic layer 173, film detachment may be prevented, and the first organic layer 173 may be more firmly attached to the first lower inorganic layer 171a.

In some embodiments, the surface roughness of the uneven structure SR1 may be about 5 nm to about 100 nm based on root-mean-square roughness, for example. When the surface roughness of the uneven structure SR1 is about 5 nm to about 100 nm, for example, the adhesion between the first organic layer 173 and the first lower inorganic layer 171 and the spreadability of the organic material may be improved.

In addition, when the output light LE emitted from the light emitting elements passes through the thin-film encapsulation layer 170, internal reflection may be reduced at the rough interface between the first organic layer 173 and the third sub-inorganic layer 1715, thereby improving light extraction efficiency. In addition, when external light is incident on the thin-film encapsulation layer 170, it may be refracted at the rough interface between the first organic layer 173 and the third sub-inorganic layer 1715, thereby suppressing reflection of the external light. The light extraction efficiency denotes an improvement in the luminance of the screen, and the suppression of external light reflection leads to an improvement in the contrast of the screen.

In some embodiments, due to the above-described uneven structure SR1, the upper surface of the third sub-inorganic layer 1715 may have a surface energy of about 40 millinewton per meter (mN/m) to about 80 mN/m.

In some embodiments, a thickness Th13 of the second sub-inorganic layer 1713 may be greater than a thickness Th11 of the first sub-inorganic layer 1711 and a thickness Th15 of the third sub-inorganic layer 1715.

In some embodiments, the thickness Th13 of the second sub-inorganic layer 1713 may be about 10 Å to about 50,000 Å, for example. In some embodiments, the thickness Th11 of the first sub-inorganic layer 1711 may have a value in the range of about 10 Å to about 10,000 Å which is smaller than the thickness Th13 of the second sub-inorganic layer 1713. In some embodiments, the thickness Th15 of the third sub-inorganic layer 1715 may have a value in the range of about 10 Å to about 5,000 Å which is smaller than the thickness Th13 of the second sub-inorganic layer 1713 and enables implementation of the uneven structure SR1, for example. Here, the thickness Th15 of the third sub-inorganic layer 1715 including the uneven structure SR1 may denote an average thickness.

In some embodiments, a refractive index n11 of the first sub-inorganic layer 1711 may be smaller than a refractive index nc1 of a first sub-capping layer 161 and a refractive index nc3 of the second sub-capping layer 163. That is, the refractive index n11 of the first sub-inorganic layer 1711, the refractive index nc1 of the first sub-capping layer 161, and the refractive index nc3 of the second sub-capping layer 163 may satisfy a relation of "n11<nc3<nc1."

In some embodiments, a refractive index n13 of the second sub-inorganic layer 1713 may be greater than the refractive index n11 of the first sub-inorganic layer 1711. In some embodiments, the refractive index n13 of the second sub-inorganic layer 1713 may be greater than a refractive index n15 of the third sub-inorganic layer 1715. From a material point of view of a film or layer, a refractive index is one of the physical elements that indicate the density of the material. In some embodiments, the refractive index n13 of the second sub-inorganic layer 1713 may be greater than the refractive index n11 of the first sub-inorganic layer 1711 and the refractive index n15 of the third sub-inorganic layer 1715. Accordingly, the second sub-inorganic layer 1713 may function as a barrier layer.

In some embodiments, the refractive index n11 of the first sub-inorganic layer 1711, the refractive index n13 of the second sub-inorganic layer 1713, and the refractive index n15 of the third sub-inorganic layer 1715 may all be about 1.7 or less, for example. Accordingly, light loss due to light absorption by the first lower inorganic layer 171a may be prevented, and the light efficiency of a display device may be increased.

In some embodiments, the refractive index n13 of the second sub-inorganic layer 1713 may be about 1.5 to about 1.7, for example. In some embodiments, the refractive index n11 of the first sub-inorganic layer 1711 may be about 1.3 to less than about 1.7 as long as it is smaller than the refractive index n13 of the second sub-inorganic layer 1713, for example. In some embodiments, the refractive index n15 of the third sub-inorganic layer 1715 may be about 1.3 to less than about 1.7 as long as it is smaller than the refractive index n13 of the second sub-inorganic layer 1713, for example.

In some embodiments, each of the first sub-inorganic layer 1711, the second sub-inorganic layer 1713, and the third sub-inorganic layer 1715 may include an inorganic material and may include oxide or oxynitride. In an embodiment, the first sub-inorganic layer 1711, the second sub-inorganic layer 1713, and the third sub-inorganic layer 1715 may include silicon oxide, silicon oxynitride, aluminum oxide, aluminum oxynitride, tungsten oxide, tungsten oxynitride, titanium oxide, or titanium oxynitride, for example.

In some embodiments, the first sub-inorganic layer 1711, the second sub-inorganic layer 1713, and the third sub-inorganic layer 1715 may all include an oxide of the same first material or an oxynitride of the same first material. In an embodiment, the first material may be any one of silicon (Si), aluminum (Al), tungsten (W), and titanium (Ti), for example. In an embodiment, the first sub-inorganic layer 1711, the second sub-inorganic layer 1713, and the third sub-inorganic layer 1715 may all include silicon oxide (SiOx) or silicon oxynitride (SiOxNy), for example.

In some embodiments, the second sub-inorganic layer 1713 may include an oxynitride of the first material, and the first sub-inorganic layer 1711 and the third sub-inorganic layer 1715 may include an oxide of the first material or an oxynitride of the first material. In addition, content of oxygen atoms in the second sub-inorganic layer 1713 may be smaller than content of oxygen atoms in the first sub-inorganic layer 1711 and content of oxygen atoms in the third sub-inorganic layer 1715. In addition, content of nitrogen atoms in the second sub-inorganic layer 1713 may be greater than content of nitrogen atoms in the first sub-inorganic layer 1711 and content of nitrogen atoms in the third sub-inorganic layer 1715.

In the case of an oxide of the same material or an oxynitride of the same material, the refractive index tends to decrease as the oxygen atom content increases, and refractive index and barrier properties tend to increase as the oxygen atom content decreases or the nitrogen atom content increases. Therefore, the second sub-inorganic layer 1713 having better barrier properties than those of the first sub-inorganic layer 1711 and the third sub-inorganic layer 1715 may have a relatively low oxygen atom content and a relatively high nitrogen atom content.

In some embodiments, the first sub-inorganic layer 1711 and the third sub-inorganic layer 1715 may include silicon oxide, and the second sub-inorganic layer 1713 may include silicon oxynitride.

In alternative embodiments, the first sub-inorganic layer 1711 and the second sub-inorganic layer 1713 may include silicon oxynitride, and the third sub-inorganic layer 1715 may include silicon oxide. In addition, the second sub-inorganic layer 1713 may have a relatively lower oxygen atom content than that of the first sub-inorganic layer 1711 and have a relatively higher nitrogen atom content than that of the first sub-inorganic layer 1711.

In alternative embodiments, the first sub-inorganic layer 1711, the second sub-inorganic layer 1713, and the third sub-inorganic layer 1715 may all include silicon oxynitride. In addition, the second sub-inorganic layer 1713 may have a relatively lower oxygen atom content than those of the first sub-inorganic layer 1711 and the third sub-inorganic layer 1715 and have a relatively higher nitrogen atom content than that of the first sub-inorganic layer 1711 and the third sub-inorganic layer 1715.

In some embodiments, any one of the first sub-inorganic layer 1711 and the third sub-inorganic layer 1715 included in the first lower inorganic layer 171a may be omitted. In an embodiment, when the first sub-inorganic layer 1711 is omitted, the lowest inorganic layer of the thin-film encapsulation layer 170_1 becomes the second sub-inorganic layer 1713, for example. Thus, the second sub-inorganic layer 1713 may contact the second sub-capping layer 163. In this case, the refractive index n13 of the second sub-inorganic layer 1713 may be smaller than the refractive index nc1 of the first sub-capping layer 161 and the refractive index nc3 of the second sub-capping layer 163. That is, the refractive index n13 of the second sub-inorganic layer 1713, the refractive index nc1 of the first sub-capping layer 161, and the refractive index nc3 of the second sub-capping layer 163 may satisfy a relation of "n13<nc3<nc1."

The first organic layer 173 may be disposed on the first lower inorganic layer 171a, and the first upper inorganic layer 175a may be disposed on the first organic layer 173.

The first upper inorganic layer 175a may include a fourth sub-inorganic layer 1751, a fifth sub-inorganic layer 1753, and a sixth sub-inorganic layer 1755.

The fourth sub-inorganic layer 1751 may be disposed on the first organic layer 173 and may block or reduce outgas generated in the first organic layer 173.

The fifth sub-inorganic layer 1753 may be disposed on the fourth sub-inorganic layer 1751 and may function as a barrier layer that prevents penetration of external moisture and oxygen.

An upper surface of the sixth sub-inorganic layer 1755 may directly contact a filler 70. In some embodiments, an uneven structure SR2 may be provided on the upper surface of the sixth sub-inorganic layer 1755 which directly contacts the filler 70. Since the uneven structure SR2 is provided on the upper surface of the sixth sub-inorganic layer 1755, the upper surface of the sixth sub-inorganic layer 1755 may have a relatively greater surface roughness than that of an upper surface of the fifth sub-inorganic layer 1753 which contacts the sixth sub-inorganic layer 1755.

In some embodiments, the uneven structure SR2 may be provided in any irregular pattern or irregular uneven shape. Since the uneven structure SR2 is provided on the upper surface of the sixth sub-inorganic layer 1755, the spreadability of an organic material that forms the filler 70 in the process of forming the filler 70 may be improved, and the organic material may spread on the sixth sub-inorganic layer 1755 relatively uniformly. In addition, since the uneven structure SR2 increases a contact area between the sixth sub-inorganic layer 1755 and the filler 70, the filler 70 and the sixth sub-inorganic layer 1755 may be more firmly attached to each other.

In some embodiments, the surface roughness of the uneven structure SR2 provided on the upper surface of the sixth sub-inorganic layer 1755 may be about 5 nm to about 100 nm based on root-mean-square roughness, for example. When the surface roughness of the uneven structure SR2 is about 5 nm to about 100 nm, for example, the adhesion between the filler 70 and the sixth sub-inorganic layer 1755 and the spreadability of the organic material may be improved.

In addition, the uneven structure SR2 may improve the light extraction efficiency by reducing internal reflection of light and suppress reflection of external light by refracting the external light. The light extraction efficiency denotes an improvement in the luminance of the screen, and the suppression of external light reflection leads to an improvement in the contrast of the screen.

In some embodiments, due to the above-described uneven structure SR2, the upper surface of the sixth sub-inorganic layer 1755 may have a surface energy of about 40 mN/m to about 80 mN/m.

In some embodiments, a thickness Th53 of the fifth sub-inorganic layer 1753 may be greater than a thickness Th51 of the fourth sub-inorganic layer 1751 and a thickness Th55 of the sixth sub-inorganic layer 1755.

In some embodiments, the thickness Th53 of the fifth sub-inorganic layer 1753 may be about 10 Å to about 50,000 Å, for example. In some embodiments, the thickness Th51 of the fourth sub-inorganic layer 1751 may have a value in the range of about 10 Å to about 10,000 Å which is smaller than the thickness Th53 of the fourth sub-inorganic layer 1753, for example. In addition, the thickness Th55 of the sixth sub-inorganic layer 1755 may have a value in the range of about 10 Å to about 5,000 Å which is smaller than the thickness Th53 of the fourth sub-inorganic layer 1753, for example.

In some embodiments, a refractive index n53 of the fifth sub-inorganic layer 1753 may be greater than a refractive index n51 of the fourth sub-inorganic layer 1751 and a refractive index n55 of the sixth sub-inorganic layer 1755.

In some embodiments, the refractive index n53 of the fifth sub-inorganic layer 1753, the refractive index n51 of the fourth sub-inorganic layer 1751, and the refractive index n55 of the sixth sub-inorganic layer 1755 may all be about 1.7 or less, for example. In some embodiments, the refractive index n53 of the fifth sub-inorganic layer 1753 may be about 1.5 to about 1.7, for example. Each of the refractive index n51 of the fourth sub-inorganic layer 1751 and the refractive index n55 of the sixth sub-inorganic layer 1755 may have a value in the range of about 1.3 to less than about 1.7 which is smaller than the refractive index n53 of the fifth sub-inorganic layer 1753.

In some embodiments, each of the fourth sub-inorganic layer 1751, the fifth sub-inorganic layer 1753 and the sixth sub-inorganic layer 1755 may include an inorganic material and may include oxide or oxynitride. In an embodiment, the fourth sub-inorganic layer 1751, the fifth sub-inorganic layer 1753, and the sixth sub-inorganic layer 1755 may include silicon oxide, silicon oxynitride, aluminum oxide, aluminum oxynitride, tungsten oxide, tungsten oxynitride, titanium oxide, or titanium oxynitride, for example.

In some embodiments, the fourth sub-inorganic layer 1751, the fifth sub-inorganic layer 1753, and the sixth sub-inorganic layer 1755 may all include an oxide of the same second material or an oxynitride of the same second material. In an embodiment, the second material may be any one of silicon (Si), aluminum (Al), tungsten (W), and titanium (Ti), for example. In an embodiment, the fourth sub-inorganic layer 1751, the fifth sub-inorganic layer 1753, and the sixth sub-inorganic layer 1755 may all include silicon oxynitride.

In some embodiments, the fifth sub-inorganic layer 1753 may include an oxynitride of the second material, and at least one of the fourth sub-inorganic layer 1751 and the sixth sub-inorganic layer 1755 may include an oxide of the second material or an oxynitride of the second material. In addition, content of oxygen atoms in the fifth sub-inorganic layer 1753 may be smaller than content of oxygen atoms in the fourth sub-inorganic layer 1751 and content of oxygen atoms in the sixth sub-inorganic layer 1755. In addition, content of nitrogen atoms in the fifth sub-inorganic layer 1753 may be greater than content of nitrogen atoms in the fourth sub-inorganic layer 1751 and content of nitrogen atoms in the sixth sub-inorganic layer 1755.

In some embodiments, the fourth sub-inorganic layer 1751 and the sixth sub-inorganic layer 1755 may include silicon oxide, and the fifth sub-inorganic layer 1753 may include silicon oxynitride.

In an alternative embodiment, the fourth sub-inorganic layer 1751, the fifth sub-inorganic layer 1753, and the sixth sub-inorganic layer 1755 may include silicon oxynitride, and the fifth sub-inorganic layer 1753 may have a relatively lower oxygen atom content than those of the fourth sub-inorganic layer 1751 and the sixth sub-inorganic layer 1755 and have a relatively higher nitrogen atom content than that of the fourth sub-inorganic layer 1751 and the sixth sub-inorganic layer 1755.

In some embodiments, any one of the fourth sub-inorganic layer 1751 and the sixth sub-inorganic layer 1755 included in the first upper inorganic layer 175a may be omitted.

Referring to FIG. 16, the thin-film encapsulation layer 170 (refer to FIG. 10) may be modified to a thin-film encapsulation layer 170_1 illustrated in FIG. 16, and the first capping layer 160 (refer to FIG. 10) may be modified to a first capping layer 160_1 illustrated in FIG. 16.

The first capping layer 160_1 may include a first sub-capping layer 161 and a third sub-capping layer 165.

The first sub-capping layer 161 may be disposed on a cathode CE, and the third sub-capping layer 165 may be disposed between the first sub-capping layer 161 and the cathode CE.

In some embodiments, the first sub-capping layer 161 may contact a lowest inorganic layer among inorganic layers included in the thin-film encapsulation layer 170_1, for example, may contact a first sub-inorganic layer 1711.

A refractive index nc1 of the first sub-capping layer 161 may be greater than a refractive index n11 of the first sub-inorganic layer 1711, and a refractive index nc5 of the third sub-capping layer 165 may be greater than the refractive index nc1 of the first sub-capping layer 161 and the refractive index n11 of the first sub-inorganic layer 1711. That is, the refractive index nc5 of the third sub-capping layer 165 may satisfy a relation of "n11<nc1<nc5."

The first capping layer 160_1 is substantially the same or similar to that described above in FIG. 13, and the thin-film encapsulation layer 170_1 is substantially the same or similar to that described above in FIG. 15. Therefore, a more detailed description is omitted.

Referring to FIG. 17, the thin-film encapsulation layer 170 (refer to FIG. 10) may be modified to a thin-film encapsulation layer 170_1 illustrated in FIG. 17, and the first capping layer 160 (refer to FIG. 10) may be modified to a first capping layer 160_2 illustrated in FIG. 17.

The first capping layer 160_2 may include a first sub-capping layer 161, a second sub-capping layer 163, and a third sub-capping layer 165.

The first sub-capping layer 161 may be disposed on a cathode CE, and the third sub-capping layer 165 may be disposed between the first sub-capping layer 161 and the cathode CE. The second sub-capping layer 163 may be disposed between a first lower inorganic layer 171*a* and the first sub-capping layer 161.

In some embodiments, the third sub-capping layer 165 may contact the cathode CE, and the second sub-capping layer 163 may contact a lowest inorganic layer among inorganic layers included in the thin-film encapsulation layer 170_1, for example, may contact a first sub-inorganic layer 1711.

In some embodiments, a refractive index nc5 of the third sub-capping layer 165 may be greater than a refractive index nc1 of the first sub-capping layer 161 and a refractive index n11 of the first sub-inorganic layer 1711 of the thin-film encapsulation layer 170_1, and a refractive index nc3 of the second sub-capping layer 163 may be smaller than the refractive index nc1 of the first sub-capping layer 161 and greater than the refractive index n11 of the first sub-inorganic layer 1711. That is, the magnitude relationship between the refractive index of each layer may satisfy a relation of "n11<nc3<nc1<nc5."

The first capping layer 160_2 is substantially the same or similar to that described above in FIG. 14, and the thin-film encapsulation layer 170_1 is substantially the same or similar to that described above in FIG. 15. Therefore, a more detailed description is omitted.

The color conversion substrate 30 will now be described with reference to FIGS. 18 through 22 in addition to FIG. 7.

Figure 18:
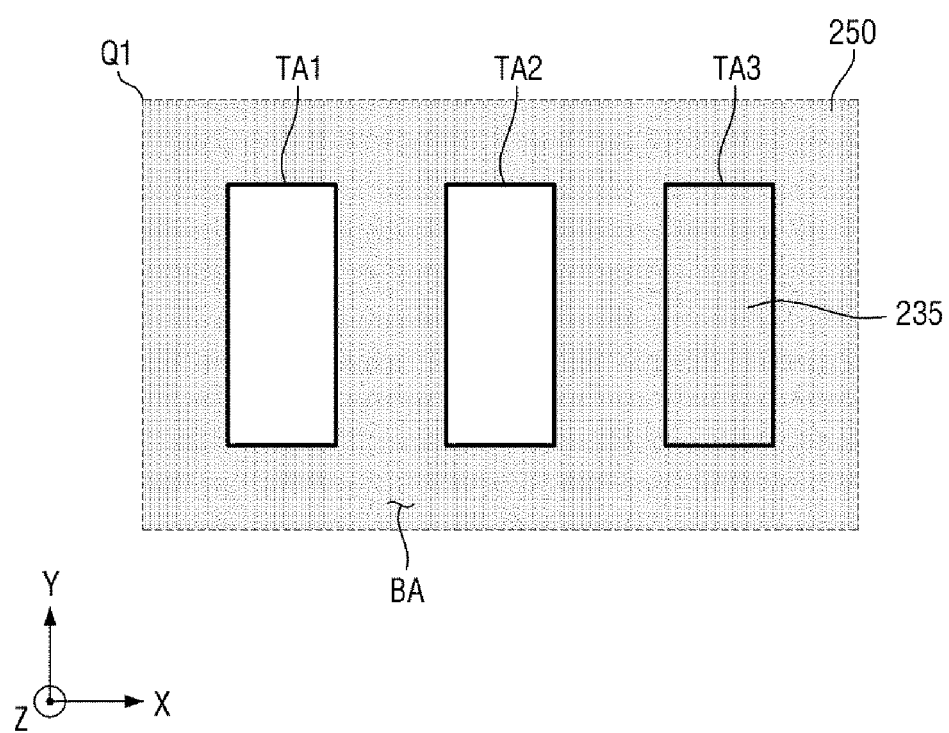
FIG. 18 is a plan view illustrating the embodiment of the arrangement of a third color filter and a color pattern in the color conversion substrate of the display device.
Figure 19:
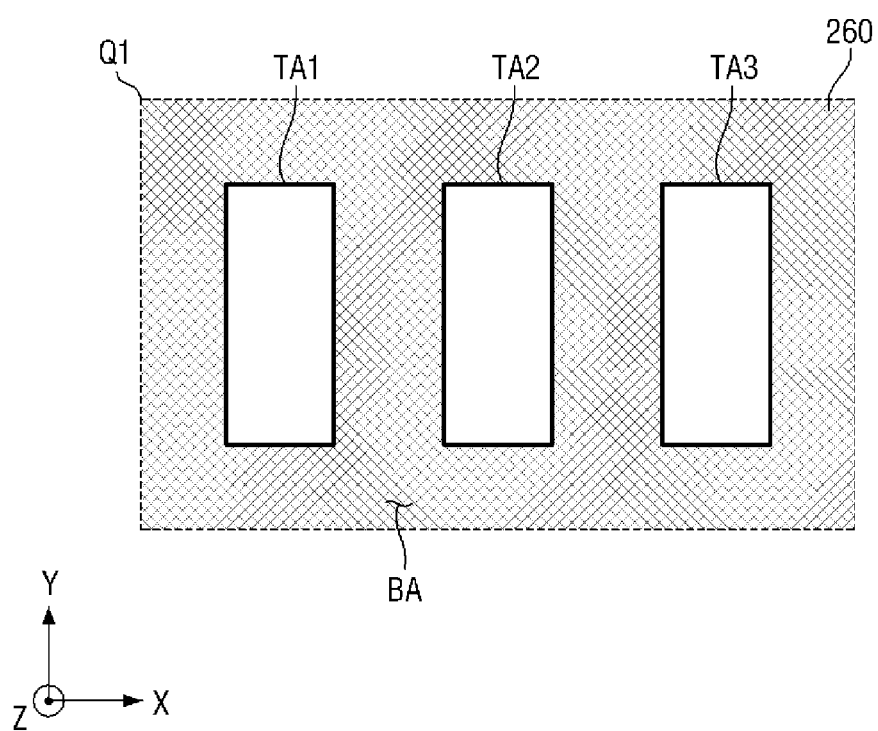
FIG. 19 is a plan view illustrating the embodiment of the arrangement of a light blocking pattern in the color conversion substrate of the display device.
Figure 20:
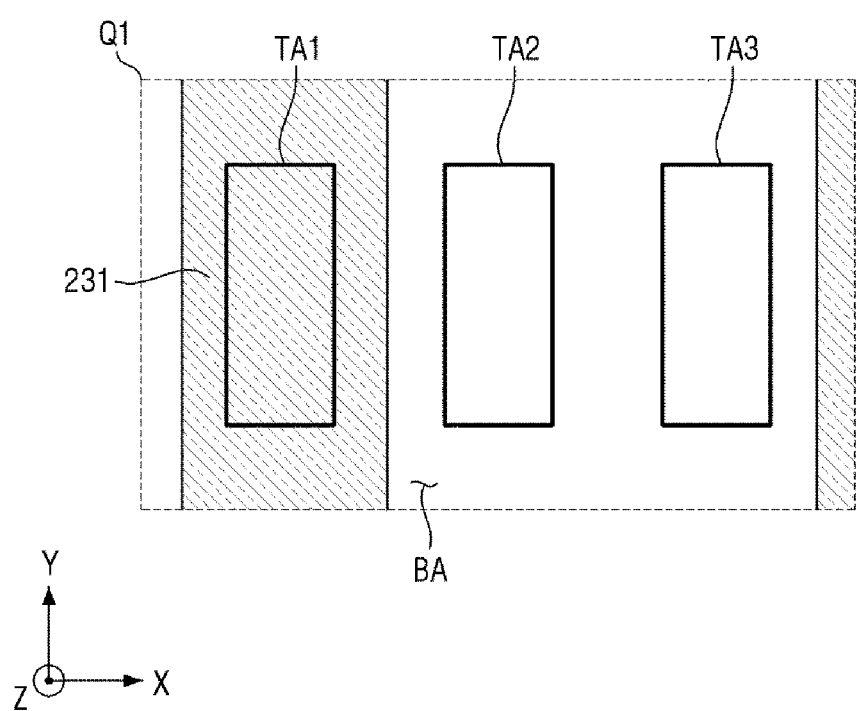
FIG. 20 is a plan view illustrating the embodiment of the arrangement of a first color filter in the color conversion substrate of the display device.
Figure 21:
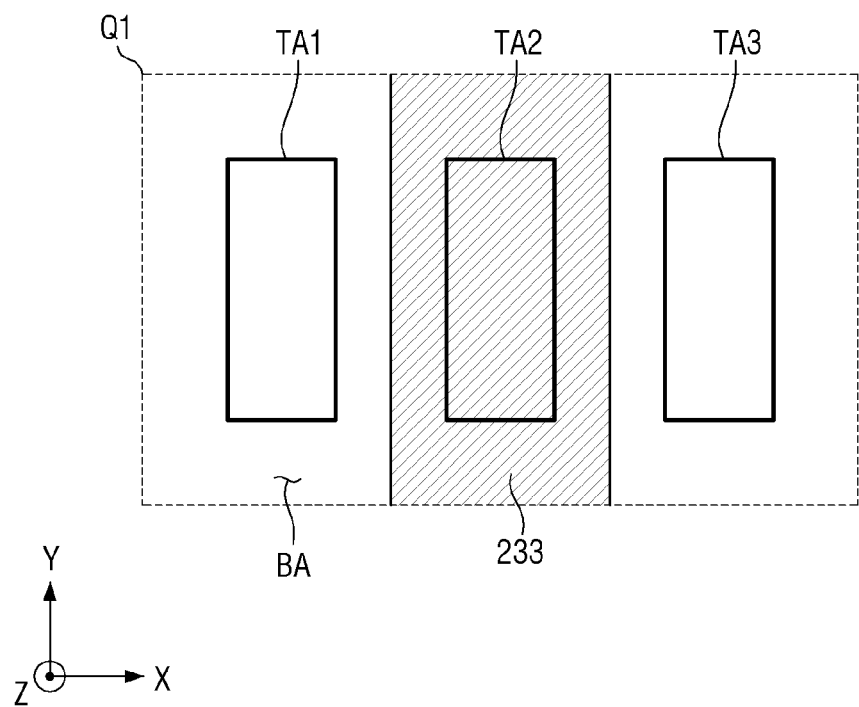
FIG. 21 is a plan view illustrating the embodiment of the arrangement of a second color filter in the color conversion substrate of the display device.
Figure 22:
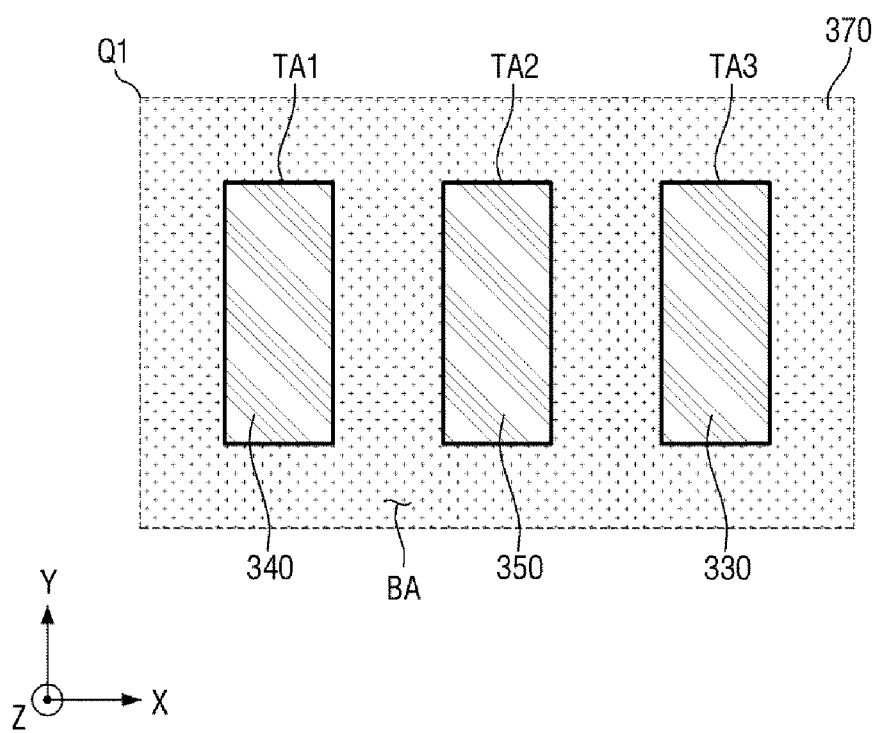
FIG. 22 is a plan view illustrating the embodiment of the arrangement of a bank pattern, a first wavelength conversion pattern, a second wavelength conversion pattern, and a light transmission pattern in the color conversion substrate of the display device.

FIG. 18 is a plan view illustrating the embodiment of the arrangement of a third color filter 235 and the color pattern 250 in the color conversion substrate 30 of the display device 1. FIG. 19 is a plan view illustrating the embodiment of the arrangement of a light blocking pattern 260 in the color conversion substrate 30 of the display device 1. FIG. 20 is a plan view illustrating the embodiment of the arrangement of the first color filter 231 in the color conversion substrate 30 of the display device 1. FIG. 21 is a plan view illustrating the embodiment of the arrangement of the second color filter 233 in the color conversion substrate 30 of the display device 1. FIG. 22 is a plan view illustrating the embodiment of the arrangement of the bank pattern 370, a first wavelength conversion pattern 340, a second wavelength conversion pattern 350, and a light transmission pattern 330 in the color conversion substrate 30 of the display device 1.

Referring to FIGS. 7 and 18 through 22, a second base 310 illustrated in FIG. 7 may include a light transmitting material.

In some embodiments, the second base 310 may include a glass substrate or a plastic substrate. In some embodiments, the second base 310 may further include a separate layer disposed on the glass substrate or the plastic substrate, for example, an insulating layer such as an inorganic layer.

In some embodiments, the light transmitting regions TA1 through TA3 and the light blocking region BA may be defined in the second base 310 as described above.

As illustrated in FIG. 7, the third color filter 235 and the color pattern 250 may be disposed on a surface of the second base 310 which faces the display substrate 10.

The third color filter 235 may overlap the third light emitting region LA3 or the third light transmitting region TA3.

The third color filter 235 may transmit only light of the third color (e.g., blue light) and block or absorb light of the first color (e.g., red light) and light of the second color (e.g., green light). In some embodiments, the third color filter 235 may be a blue color filter and may include a blue colorant such as a blue dye or a blue pigment. As used herein, the term 'colorant' is a concept encompassing both a dye and a pigment.

The color pattern 250 may overlap the non-light emitting region NLA or the light blocking region BA.

The color pattern 250 may absorb a part of light introduced from the outside of the display device 1 into the display device 1, thereby reducing reflected light due to external light. A considerable part of external light is reflected, causing distortion of the color gamut of the display device 1. However, when the color pattern 250 is disposed in the non-light emitting region NLA and the non-display area NDA in the illustrated embodiment, color distortion due to reflection of external light may be reduced.

In some embodiments, the color pattern 250 may include a blue colorant such as a blue dye or a blue pigment. In some embodiments, the color pattern 250 may include the same material as that of the third color filter 235 and may be provided at the same time as the third color filter 235. When the color pattern 250 includes a blue colorant, external light or reflected light transmitted through the color pattern 250 may be blue light. The color sensibility of user's eyes varies according to the color of light. More specifically, light of a blue wavelength band may be perceived less sensitively by the user than light of a green wavelength band and light of a red wavelength band. Therefore, since the color pattern 250 includes a blue colorant, the user may perceive reflected light relatively less sensitively.

In some embodiments, as illustrated in FIG. 18, the color pattern 250 may be disposed over the entire light blocking region BA. In some embodiments, the color pattern 250 and the third color filter 235 may be connected to each other as illustrated in FIG. 18.

As illustrated in FIGS. 7 and 19, the light blocking pattern 260 may be disposed on the surface of the second base 310 which faces the display substrate 10. The light blocking pattern 260 may overlap the light blocking region BA to block transmission of light. In some embodiments, the light blocking pattern 260 may be disposed in a substantially lattice shape in a plan view as illustrated in FIG. 19.

In some embodiments, the light blocking pattern 260 may include an organic light blocking material and may be provided by coating and exposing the organic light blocking material.

As described above, external light may cause distortion of the color gamut of the display device 1. However, when the light blocking pattern 260 is disposed on the second base 310 in the illustrated embodiment, at least a part of the external light is absorbed by the light blocking pattern 260. Therefore, color distortion due to reflection of the external light may be reduced. In some embodiments, the light blocking pattern 260 may prevent color mixing due to intrusion of light between adjacent light transmitting regions, thereby further improving the color gamut.

In some embodiments, the light blocking pattern 260 may be disposed on the color pattern 250. In other words, the light blocking pattern 260 may be disposed opposite the second base 310 with the color pattern 250 interposed between them.

Since the color pattern 250 is disposed between the light blocking pattern 260 and the second base 310, the light blocking pattern 260 may not contact the second base 310 in some embodiments.

As illustrated in FIG. 7, the first color filter 231 and the second color filter 233 may be disposed on the surface of the second base 310 which faces the display substrate 10.

The first color filter 231 may overlap the first light emitting region LA1 or the first light transmitting region TA1, and the second color filter 233 may overlap the second light emitting region LA2 or the second light transmitting region TA2.

In some embodiments, the first color filter 231 may block or absorb light of the third color (e.g., blue light). That is, the first color filter 231 may function as a blue light blocking filter that blocks blue light. In some embodiments, the first color filter 231 may transmit only light of the first color (e.g., red light) and block or absorb light of the third color (e.g., blue light) and light of the second color (e.g., green light). In an embodiment, the first color filter 231 may be a red color filter and may include a red colorant, for example.

The second color filter 233 may block or absorb light of the third color (e.g., blue light). That is, the second color filter 233 may also function as a blue light blocking filter. In some embodiments, the second color filter 233 may transmit only light of the second color (e.g., green light) and block or absorb light of the third color (e.g., blue light) and light of the first color (e.g., red light). In an embodiment, the second color filter 233 may be a green color filter and may include a green colorant, for example.

In some embodiments, a part of the first color filter 231 may be further disposed in the light blocking region BA as illustrated in FIGS. 7 and 20, and a part of the second color filter 233 may be further disposed in the light blocking region BA as illustrated in FIGS. 7 and 21.

In some embodiments, a part of the first color filter 231 may be further disposed in the blocking region BA between the first light transmitting region TA1 and the second light transmitting region TA2 and between the first light transmitting region TA1 and the third light transmitting region TA3.

In some embodiments, a part of the second color filter 233 may be further disposed in the light blocking region BA between the first light transmitting region TA1 and the second light transmitting region TA2 and between the second light transmitting region TA2 and the third light transmitting region TA3.

Although the first color filter 231 and the second color filter 233 do overlap each other in the drawings, they may also overlap each other in the light blocking region BA between the first light transmitting region TA1 and the second light transmitting region TA2. A part of the light blocking region BA in which the first color filter 231 and the second color filter 233 overlap may function as a light blocking member that blocks transmission of light.

In an alternative embodiment, unlike in the drawings, the first color filter 231 and the second color filter 233 may be disposed over the entire light blocking region BA and may overlap each other in the entire light blocking region BA.

In some embodiments, the first color filter 231 and the second color filter 233 may overlap the color pattern 250 in the light blocking region BA. In an embodiment, the color pattern 250 may overlap the first color filter 231 and the second color filter 233 in the light blocking region BA between the first light transmitting region TA1 and the second light transmitting region TA2, for example. In addition, the color pattern 250 may overlap the second color filter 233 in the light blocking region BA between the second light transmitting region TA2 and the third light transmitting region TA3. In addition, the color pattern 250 may overlap the first color filter 231 in the light blocking region BA between the third light transmitting region TA3 and the first light transmitting region TA1.

In the light blocking region BA, a part where the first color filter 231 and the color pattern 250 overlap and a part where the second color filter 233 and the color pattern 250 overlap may function as light blocking members. In the light blocking region BA, the part where the first color filter 231 and the color pattern 250 overlap and the part where the second color filter 233 and the color pattern 250 overlap may absorb at least a part of external light, thereby reducing color distortion due to reflection of the external light. In addition, light emitted to the outside may be prevented from intruding between adjacent light emitting regions and thus causing color mixing. Accordingly, the color gamut of the display device 1 may be further improved.

As illustrated in FIG. 7, a second capping layer 391 may be disposed on the surface of the second base 310 to cover the light blocking pattern 260, the color pattern 250, the first color filter 231, the second color filter 233, and the third color filter 235. In some embodiments, the second capping layer 391 may directly contact the first color filter 231, the second color filter 233, and the third color filter 235. In some embodiments, the second capping layer 391 may directly contact the light blocking pattern 260.

The second capping layer 391 may prevent impurities such as moisture or air from being introduced from the outside and damaging or contaminating the light blocking pattern 260, the color pattern 250, the first color filter 231, the second color filter 233, and the third color filter 235. In addition, the second capping layer 391 may prevent the colorants included in the first color filter 231, the second color filter 233 and the third color filter 235 from being diffused to other elements such as the first wavelength conversion pattern 340 and the second wavelength conversion pattern 350. In some embodiments, the second capping layer 391 may include an inorganic material. In an embodiment, the second capping layer 391 may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride, for example.

The bank pattern 370 may be disposed on a surface of the second capping layer 391 which faces the display substrate 10. In some embodiments, the bank pattern 370 may be disposed directly on the surface of the second capping layer 391 and may directly contact the second capping layer 391.

In some embodiments, the bank pattern 370 may overlap the non-light emitting region NLA or the light blocking region BA. In some embodiments, the bank pattern 370 may surround the first light transmitting region TA1, the second light transmitting region TA2, and the third light transmitting region TA3 in a plan view as illustrated in FIG. 22. The bank pattern 370 may separate spaces in which the first wavelength conversion pattern 340, the second wavelength conversion pattern 350, and the light transmission pattern 330 are disposed.

In some embodiments, the bank pattern 370 may be provided as one unitary pattern as illustrated in FIG. 22, but the invention is not limited thereto. In an embodiment, a part of the bank pattern 370 which surrounds the first light transmitting region TA1, a part of the bank pattern 370 which surrounds the second light transmitting region TA2, and a part of the bank pattern 370 which surrounds the third light transmitting region TA3 may be provided as individual patterns separated from each other.

When the first wavelength conversion pattern 340, the second wavelength conversion pattern 350, and the light transmission pattern 330 are provided by a method of ejecting an ink composition using a nozzle, that is, an inkjet printing method, the bank pattern 370 may serve as a guide that stably positions the ejected ink composition at a desired position. That is, the bank pattern 370 may function as a barrier wall.

In some embodiments, the bank pattern 370 may overlap the pixel defining layer 150.

In some embodiments, the bank pattern 370 may include an organic material having photocurability. In some embodiments, the bank pattern 370 may include an organic material having photocurability and including a light blocking material. When the bank pattern 370 has light blocking properties, it may prevent light from intruding between neighboring light emitting regions in the display area DA. In an embodiment, the bank pattern 370 may block the output light LE emitted from the second light emitting element ED2 from entering the first wavelength conversion pattern 340 overlapping the first light emitting region LA1, for example. In addition, the bank pattern 370 may block or prevent external light from entering elements disposed under the bank pattern 370 in the non-light emitting region NLA.

The first wavelength conversion pattern 340, the second wavelength conversion pattern 350, and the light transmission pattern 330 may be disposed on the second capping layer 391. In some embodiments, the first wavelength conversion pattern 340, the second wavelength conversion pattern 350, and the light transmission pattern 330 may be disposed in the display area DA.

The light transmission pattern 330 may overlap the third light emitting region LA3 or the third light emitting element ED3. The light transmission pattern 330 may be disposed in a space defined by the bank pattern 370 in the third light transmitting region TA3.

In some embodiments, the light transmission pattern 330 may be provided as an island-shaped pattern as illustrated in FIG. 22. Although the light transmission pattern 330 does not overlap the light blocking region BA in the drawings, this is merely an example. In some embodiments, a part of the light transmission pattern 330 may overlap the light blocking region BA.

The light transmission pattern 330 may transmit incident light. The output light LE provided by the third light emitting element ED3 may be blue light as described above. The output light LE which is blue light is transmitted through the light transmission pattern 330 and the third color filter 235 and then emitted to the outside of the display device 1. That is, third light L3 emitted out of the display device 1 through the third light emitting region LA3 may be blue light.

In some embodiments, the light transmission pattern 330 may include a first base resin 331 and may further include a first scatterer 333 dispersed in the first base resin 331.

The first base resin 331 may include a material having high light transmittance. In some embodiments, the first base resin 331 may include an organic material. In an embodiment, the first base resin 331 may include an organic material such as epoxy resin, acrylic resin, cardo resin, or imide resin, for example.

The first scatterer 333 may have a refractive index different from that of the first base resin 331 and may form an optical interface with the first base resin 331. In an embodiment, the first scatterer 333 may be light scattering particles, for example. The first scatterer 333 is not particularly limited as long as it is a material that may scatter at least a part of transmitted light, for example. In an embodiment, the first scatterer 333 may be metal oxide particles or organic particles, for example. In an embodiment, the metal oxide may be, for example, titanium oxide ($TiO_2$), zirconium oxide ($ZrO_2$), aluminum oxide ($Al_2O_3$), indium oxide ($In_2O_3$), zinc oxide (ZnO), or tin oxide ($SnO^2$), for example. The material of the organic particles may be, for example, acrylic resin or urethane resin. The first scatterer 333 may scatter incident light in random directions regardless of the incident direction of the incident light without substantially changing the wavelength of the light transmitted through the light transmission pattern 330.

In some embodiments, the light transmission pattern 330 may directly contact the second capping layer 391 and the bank pattern 370.

The first wavelength conversion pattern 340 may be disposed on the second capping layer 391 and may overlap the first light emitting region LA1 or the first light emitting element ED1 or the first light transmitting region TA1.

In some embodiments, the first wavelength conversion pattern 340 may be disposed in a space defined by the bank pattern 370 in the first light transmitting region TA1.

In some embodiments, the first wavelength conversion pattern 340 may be provided as an island-shaped pattern as illustrated in FIG. 22. Although the first wavelength conversion pattern 340 does not overlap the light blocking region BA in the drawings, this is merely an example. In some embodiments, a part of the first wavelength conversion pattern 340 may overlap the light blocking region BA.

In some embodiments, the first wavelength conversion pattern 340 may directly contact the second capping layer 391 and the bank pattern 370.

The first wavelength conversion pattern 340 may convert or shift a peak wavelength of incident light into another specific peak wavelength and output light having the specific peak wavelength. In some embodiments, the first wavelength conversion pattern 340 may convert the output light LE provided by the first light emitting element ED1 into red light having a peak wavelength in the range of about 610 nm to about 650 nm and output the red light, for example.

In some embodiments, the first wavelength conversion pattern 340 may include a second base resin 341 and a first wavelength shifter 345 dispersed in the second base resin 341 and may further include a second scatterer 343 dispersed in the second base resin 341.

The second base resin 341 may include a material having high light transmittance. In some embodiments, the second base resin 341 may include an organic material. In some embodiments, the second base resin 341 may include the same material as that of the first base resin 331 or may include at least one of the materials exemplified as the constituent materials of the first base resin 331.

The first wavelength shifter 345 may convert or shift a peak wavelength of incident light to another specific peak wavelength. In some embodiments, the first wavelength shifter 345 may convert the output light LE of the third color, which is blue light provided by the first light emitting element ED1, into red light having a single peak wavelength in the range of about 610 nm to about 650 nm and output the red light, for example.

Examples of the first wavelength shifter 345 may include quantum dots, quantum rods, and phosphors. In an embodiment, the quantum dots may be particulate materials that emit light of a specific color when electrons transit from a conduction band to a valence band, for example.

The quantum dots may be semiconductor nanocrystalline materials. The quantum dots may have a specific band gap according to their composition and size. Thus, the quantum dots may absorb light and then emit light having a unique wavelength. Examples of semiconductor nanocrystals of the quantum dots include group IV nanocrystals, group II-VI compound nanocrystals, group III-V compound nanocrystals, group IV-VI nanocrystals, and combinations of the same.

In an embodiment, the group II-VI compounds may include at least one of binary compounds including at least one of CdSe, CdTe, ZnS, ZnSe, ZnTe, ZnO, HgS, HgSe, HgTe, MgSe, MgS and combinations of the same, ternary compounds including at least one of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgznSe, HgZnTe, MgZnSe, MgZnS and combinations of the same, and quaternary compounds including at least one of HgZnTeS, CdZnSeS, CdZnSeTe, CdZnSTe, CdHgSeS, CdHgSeTe, CdHgSTe, HgZnSeS, HgZnSeTe, HgZnSTe and combinations of the same, for example.

In an embodiment, the group III-V compounds may include at least one of binary compounds including at least one of GaN, GaP, GaAs, GaSb, AlN, AlP, AlAs, AlSb, InN, InP, InAs, InSb and combinations of the same, ternary compounds including at least one of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP and combinations of the same, and quaternary compounds including at least one of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and combinations of the same, for example.

In an embodiment, the group IV-VI compounds may include at least one of binary compounds including at least one of SnS, SnSe, SnTe, PbS, PbSe, PbTe and combinations of the same, ternary compounds including at least one of SnSeS, SnSeTe, SnSTe, PbSeS, PbSeTe, PbSTe, SnPbS, SnPbSe, SnPbTe and combinations of the same, and quaternary compounds including at least one of SnPbSSe, SnPbSeTe, SnPbSTe and combinations of the same, for example. In an embodiment, the group IV elements include at least one of silicon (Si), germanium (Ge), and a combination of the same, for example. In an embodiment, the group IV compounds may be binary compounds including at least one of silicon carbide (SiC), silicon germanium (Site), and a combination of the same, for example.

Here, the binary, ternary or quaternary compounds may be in the panicles at a uniform concentration or may be in the same panicles at partially different concentrations. In addition, they may have a core/shell structure in which one quantum dot surrounds another quantum dot. An interface between the core and the shell may have a concentration gradient in which the concentration of an element in the shell is reduced toward the center.

In some embodiments, the quantum dots may have a core-shell structure including a core including the above-described nanocrystal and a shell surrounding the core. The shell of each quantum dot may serve as a protective layer for maintaining semiconductor characteristics by preventing chemical denaturation of the core and/or as a charging layer for giving electrophoretic characteristics to the quantum dot. The shell may be a single layer or a multilayer. An interface between the core and the shell may have a concentration gradient in which the concentration of an element present in the shell is reduced toward the center. The shell of each quantum dot may be, for example, a metal or non-metal oxide, a semiconductor compound, or a combination of the same.

In an embodiment, the metal or non-metal oxide may be, but is not limited to, a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ or NiO or a ternary compound such as $MgAl_2O_4$, $CoFe_2O_4$, $NiFe_2O_4$ or $CoMn_2O_4$, for example.

In an embodiment, the semiconductor compound may be, but is not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, for example.

In an embodiment, light emitted from the first wavelength shifter 345 may have a full width of half maximum ("FWHM") of an emission wavelength spectrum of about 45 nm or less, about 40 nm or less, or about 30 nm or less, for example. Therefore, the color purity and color reproducibility of the display device 1 may be further improved. In addition, the light emitted from the first wavelength shifter 345 may be radiated in various directions regardless of the incident direction of incident light. Therefore, the lateral visibility of the first color displayed in the first light transmitting region TA1 may be improved.

A part of the output light LE provided by the first light emitting element ED1 may be transmitted through the first wavelength conversion pattern 340 without being converted into red light by the first wavelength shifter 345. Of the output light LE, a component incident on the first color filter 231 without being converted by the first wavelength conversion pattern 340 may be blocked by the first color filter 231. Red light into which the output light LE has been converted by the first wavelength conversion pattern 340 may be transmitted through the first color filter 231 and emitted to the outside. That is, first light L1 emitted out of the display device 1 through the first light transmitting region TA1 may be red light.

The second scatterer 343 may have a refractive index different from that of the second base resin 341 and may form an optical interface with the second base resin 341. In an embodiment, the second scatterer 343 may be light scattering particles, for example. Other details of the second scatterer 343 are substantially the same or similar to those of the first scatterer 333, and thus a description thereof is omitted.

The second wavelength conversion pattern 350 may be disposed in a space defined by the bank pattern 370 in the second light transmitting region TA2.

In some embodiments, the second wavelength conversion pattern 350 may be provided as an island-shaped pattern as illustrated in FIG. 22. In some embodiments, unlike in the drawings, a part of the second wavelength conversion pattern 350 may overlap the light blocking region BA.

In some embodiments, the second wavelength conversion pattern 350 may directly contact the second capping layer 391 and the bank pattern 370.

The second wavelength conversion pattern 350 may convert or shift a peak wavelength of incident light into another specific peak wavelength and output light having the specific peak wavelength. In some embodiments, the second wavelength conversion pattern 350 may convert the output light LE provided by the second light emitting element ED2 into green light in the range of about 510 nm to about 550 nm and output the green light, for example.

In some embodiments, the second wavelength conversion pattern 350 may include a third base resin 351 and a second wavelength shifter 355 dispersed in the third base resin 351 and may further include a third scatterer 353 dispersed in the third base resin 351.

The third base resin 351 may include a material having high light transmittance. In some embodiments, the third base resin 351 may include an organic material. In some embodiments, the third base resin 351 may include the same material as that of the first base resin 331 or may include at least one of the materials exemplified as the constituent materials of the first base resin 331.

The second wavelength shifter 355 may convert or shift a peak wavelength of incident light to another specific peak wavelength. In some embodiments, the second wavelength shifter 355 may convert blue light having a peak wavelength in the range of about 440 nm to about 480 nm into green light having a peak wavelength in the range of about 510 nm to about 550 nm, for example.

Examples of the second wavelength shifter 355 may include quantum dots, quantum rods, and phosphors. The second wavelength shifter 355 is substantially the same or similar to the first wavelength shifter 345 described above, and thus a more detailed description thereof is omitted.

In some embodiments, both the first wavelength shifter 345 and the second wavelength shifter 355 may be composed of quantum dots. In this case, the particle size of quantum dots constituting the second wavelength shifter 355 may be smaller than that of quantum dots constituting the first wavelength shifter 345.

The third scatterer 353 may have a refractive index different from that of the third base resin 351 and may form an optical interface with the third base resin 51, In an embodiment, the third scatterer 353 may be light scattering particles, for example. Other details of the third scatterer 353 are substantially the same or similar to those of the second scatterer 343, and thus a description thereof is omitted.

The output light LE emitted from the second light emitting element ED2 may be provided to the second wavelength conversion pattern 350, and the second wavelength shifter 355 may convert the output light LE provided by the second light emitting element ED2 into green light having a peak wavelength in the range of about 510 nm to about 550 nm and emit the green light, for example.

A part of the output light LE which is blue light may be transmitted through the second wavelength conversion pattern 350 without being converted into green light by the second wavelength shifter 355 and may be blocked by the second color filter 233. Green light into which the output light LE has been converted by the second wavelength conversion pattern 350 may be transmitted through the second color filter 233 and emitted to the outside. Accordingly, second light L2 emitted out of the display device 1 through the second light transmitting region TA2 may be green light.

A third capping layer 393 may be disposed on the bank pattern 370, the light transmission pattern 330, the first wavelength conversion pattern 340, and the second wavelength conversion pattern 350. The third capping layer 393 may cover the light transmission pattern 330, the first wavelength conversion pattern 340, and the second wavelength conversion pattern 350. In some embodiments, the third capping layer 393 may also be disposed in the non-display area NDA (refer to FIG. 1). In the non-display area NDA (refer to FIG. 1), the third capping layer 393 may directly contact the second capping layer 391 and seal the light transmission pattern 330, the first wavelength conversion pattern 340 and the second wavelength conversion pattern 350. Accordingly, it is possible to prevent impurities such as moisture or air from being introduced from the outside and damaging or contaminating the light transmission pattern 330, the first wavelength conversion pattern 340 and the second wavelength conversion pattern 350.

In some embodiments, the third capping layer 393 may include an inorganic material. In some embodiments, the third capping layer 393 may include the same material as that of the second capping layer 391 or may include at least one of the materials mentioned in the description of the second capping layer 391.

The filler 70 may be disposed in the space between the color conversion substrate 30 and the display substrate 10 as described above. In some embodiments, the filler 70 may directly contact the third capping layer 393 and the thin-film encapsulation layer 170 as illustrated in FIG. 7.

According to the above-described embodiments, even when the extinction coefficient is made to converge to substantially zero by reducing the refractive indices of the inorganic layers included in the thin-film encapsulation layer, since an inorganic layer is additionally disposed under an inorganic layer functioning as a barrier, the storage reliability of the thin-film encapsulation layer may be maintained at an excellent level.

Therefore, in the illustrated embodiments, the light efficiency of the display device 1 may be improved while the reliability of the display device 1 is maintained. Furthermore, when an uneven structure is provided on an inorganic layer of the thin-film encapsulation layer, the spreadability of an organic material is improved, and the adhesion between the two layers is improved. Therefore, the reliability of the display device 1 may be further improved.

In addition, since the first capping layer 160 includes the second sub-capping layer described above, a sharp change in refractive index at the interface between the thin-film encapsulation layer 170 and the first capping layer 160 may be prevented. Accordingly, it is possible to increase the amount of emitted light, in particular, the amount of emitted light having a slope and the amount of light that is converted by a wavelength conversion pattern, thereby improving the light efficiency of the display device 1.

Figure 23:
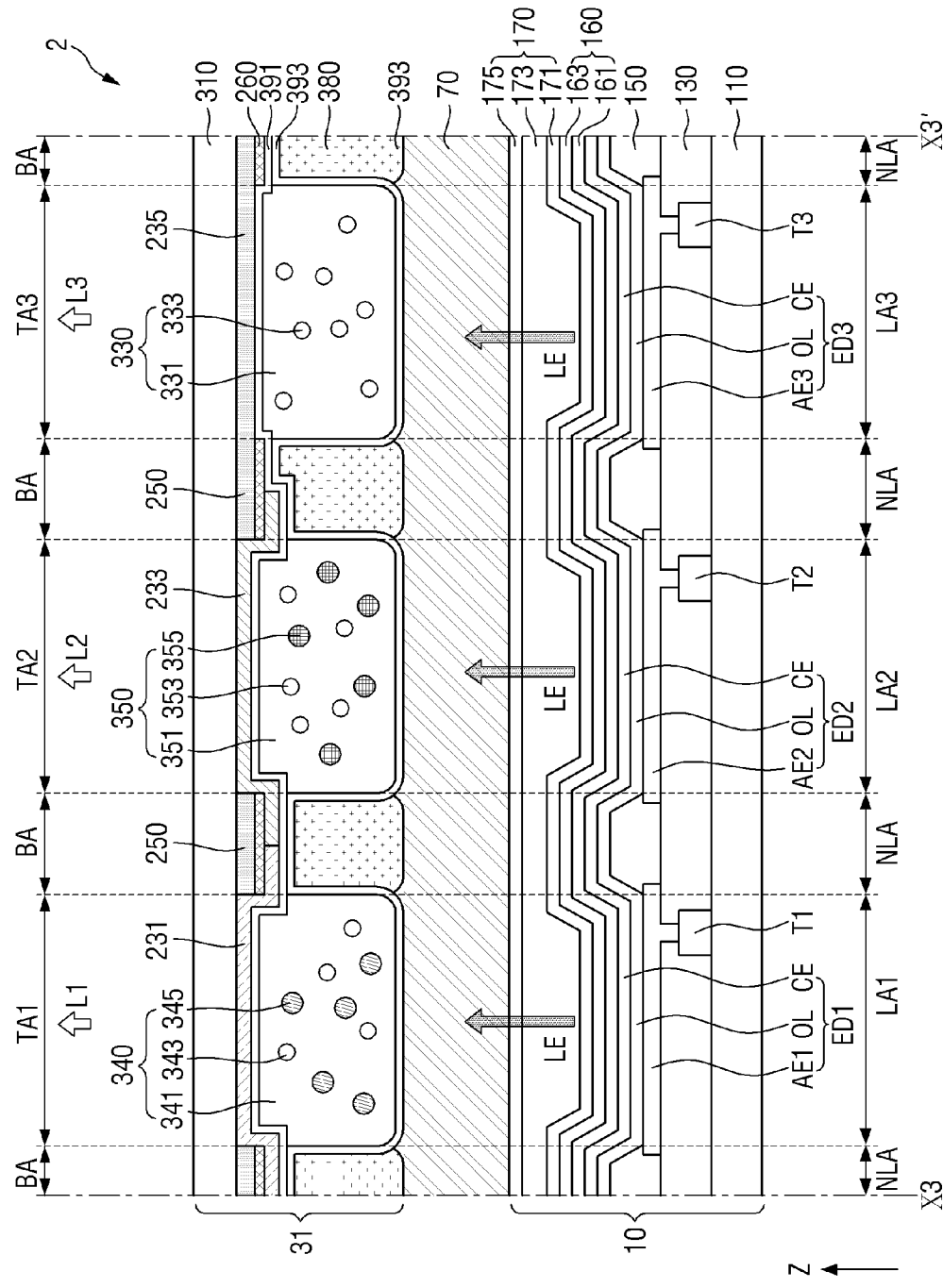
FIG. 23 is a cross-sectional view of an embodiment of a display device, taken along line X3-X3' of FIGS. 3 and 4.

FIG. 23 is a cross-sectional view of an embodiment of a display device 2, taken along line X3-X3' of FIGS. 3 and 4.

Referring to FIG. 23, the display device 2 in the illustrated embodiment includes a display substrate 10, a color conversion substrate 31, and a filler 70. The display device 2 is substantially the same or similar to the embodiment of FIG. 7 except for the configuration of the color conversion substrate 31, in particular, except that the color conversion substrate 31 includes a color mixing preventing member 380 and does not include a bank pattern 370 (refer to FIG. 7). Therefore, a redundant description will be omitted, and differences will be mainly described.

A first wavelength conversion pattern 340, a second wavelength conversion pattern 350, and a light transmission pattern 330 may be disposed on a second capping layer 391. In some embodiments, each of the first wavelength conversion pattern 340, the second wavelength conversion pattern 350, and the light transmission pattern 330 may be provided by coating a photosensitive material and exposing and developing the photosensitive material.

A third capping layer 393 may be disposed on the first wavelength conversion pattern 340, the second wavelength conversion pattern 350, and the light transmission pattern 330. In some embodiments, the third capping layer 393 may directly contact the second capping layer 391 in a light blocking region BA.

The color mixing preventing member 380 may be disposed on a surface of the third capping layer 393 which faces the display substrate 10.

The color mixing preventing member 380 may be disposed in the light blocking region BA to block transmission of light. The color mixing preventing member 380 may be disposed between the light transmission pattern 330 and the first wavelength conversion pattern 340 and between the first wavelength conversion pattern 340 and the second wavelength conversion pattern 350 to prevent color mixing between neighboring light transmitting regions.

In some embodiments, the planar arrangement of the color mixing preventing member 380 may be substantially the same or similar to the arrangement of the bank pattern 370 (refer to FIG. 22) illustrated in FIG. 22. However, the invention is not limited thereto, and the planar structure of the color mixing preventing member 380 may be variously changed.

In some embodiments, the color mixing preventing member 380 may include an organic light blocking material and may be provided by coating and exposing the organic light blocking material.

In some embodiments, the color mixing preventing member 380 may directly contact the filler 70.

Other elements of the display device 2 may be substantially the same as those of the display device 1 described above with reference to FIGS. 7 through 22.

Figure 24:
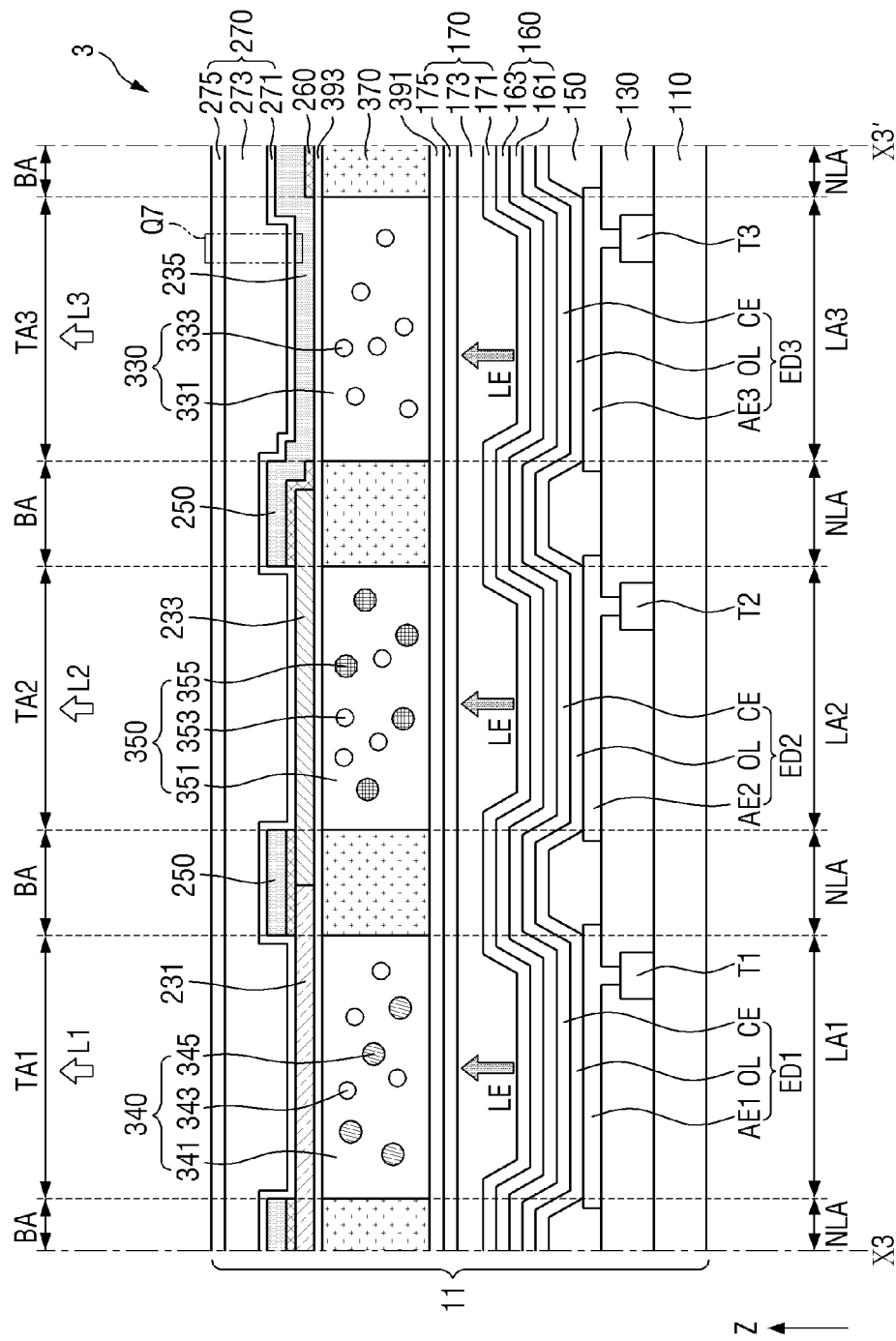
FIG. 24 is a cross-sectional view of an embodiment of a display device, taken along line X3-X3' of FIGS. 3 and 4.
Figure 25:
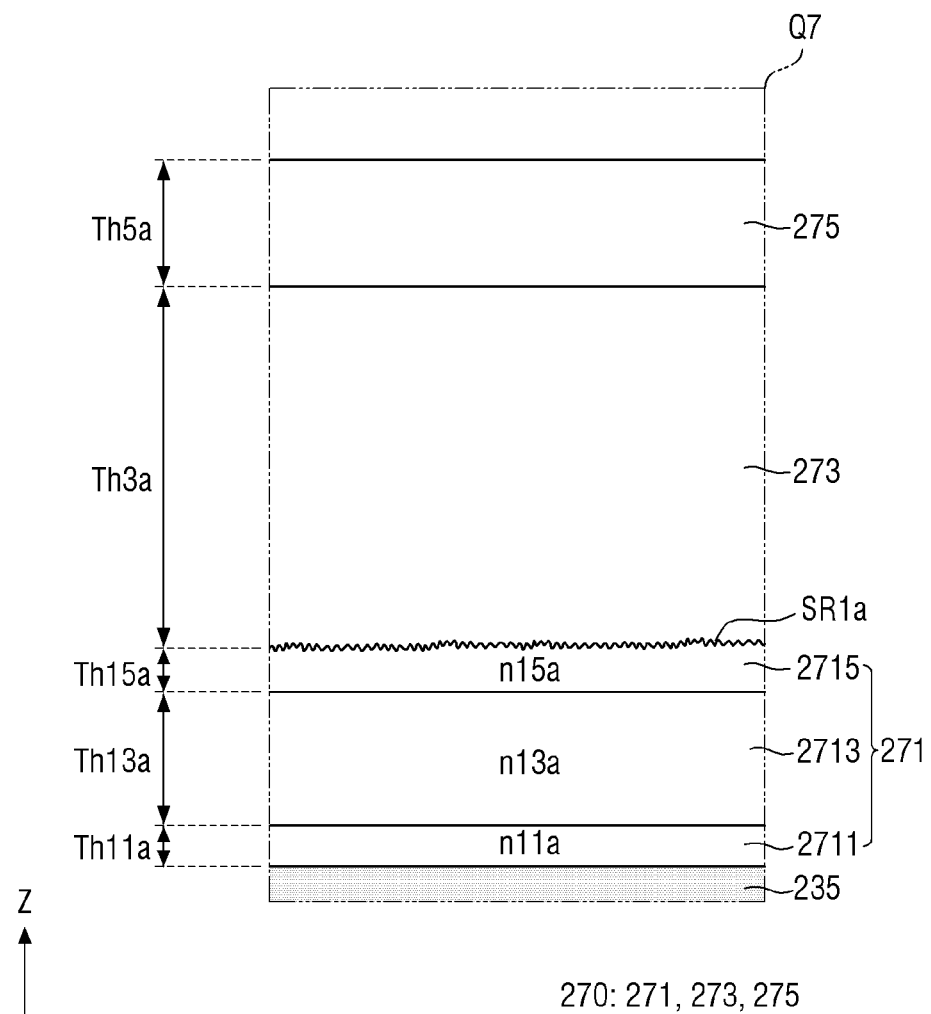
FIG. 25 is an enlarged cross-sectional view of part Q7 of FIG. 24.

FIG. 24 is a cross-sectional view of an embodiment of a display device 3, taken along line X3-X3' of FIGS. 3 and 4. FIG. 25 is an enlarged cross-sectional view of part Q7 of FIG. 24. FIG. 2) is a cross-sectional view of a another embodiment of FIG. 25.

Figure 26:
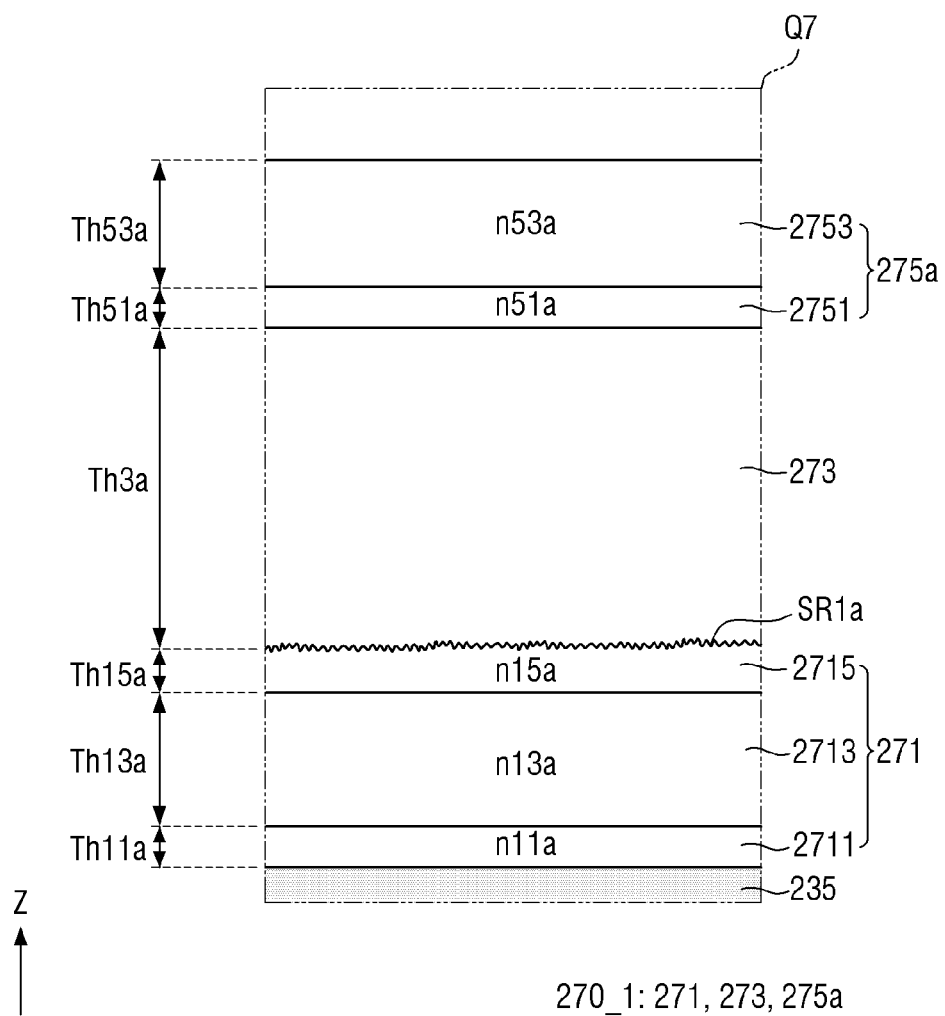
FIG. 26 is a cross-sectional view of another embodiment of FIG. 25.

Referring to FIGS. 24 through 26, the display device 3 in the illustrated embodiment is substantially the same or similar to the embodiment of FIG. 7 except that a display substrate 11 includes all the elements of the color conversion substrate 30 (refer to FIG. 7) illustrated in FIG. 7 except for the second base 310, and the filler 70 is omitted. Therefore, differences will be mainly described below.

A first capping layer 160 may be disposed on a cathode CE, and a thin-film encapsulation layer 170 may be disposed on the first capping layer 160.

The structure of the first capping layer 160 may be substantially the same as the structure illustrated in FIG. 10. In an alternative embodiment, the structure of the first capping layer 160 may be modified to the structure of the first capping layer 160_1 (refer to FIG. 13) illustrated in FIG. 13 or the structure of the first capping layer 160_2 (refer to FIG. 14) illustrated in FIG. 14.

The structure of the thin-film encapsulation layer 170 may be substantially the same as the structure illustrated in FIG. 10. In an alternative embodiment, the structure of the thin-film encapsulation layer 170 may be modified to the structure of the thin-film encapsulation layer 170_1 (refer to FIG. 15) illustrated in FIG. 15, a structure in which at least any one of the first sub-inorganic layer 1711 (refer to FIG. 15) and the third sub-inorganic layer 1715 (refer to FIG. 15) is omitted from the structure of the thin-film encapsulation layer 170_1 (refer to FIG. 15), or a structure in which at least any one of the fourth sub-inorganic layer 1751 (refer to FIG. 15) and the sixth sub-inorganic layer 1755 (refer to FIG. 15) is omitted.

A second capping layer 391 may be disposed on the thin-film encapsulation layer 170. In some embodiments, the second capping layer 391 may contact the thin-film encapsulation layer 170. In some embodiments, the second capping layer 391 may be omitted.

A bank pattern 370, a light transmission pattern 330, a first wavelength conversion pattern 340, and a second wavelength conversion pattern 350 may be disposed on the second capping layer 391. The bank pattern 370 may overlap a non-light emitting region NLA and define a space corresponding to each of a first light emitting region LA1, a second light emitting region LA2 and a third light emitting region LA3. Each of the light transmission pattern 330, the first wavelength conversion pattern 340 and the second wavelength conversion pattern 350 may be disposed in the space defined by the bank pattern 370. The first wavelength conversion pattern 340 may overlap the first light emitting region LA1, the second wavelength conversion pattern 350 may overlap the second light emitting region LA2, and the light transmission pattern 330 may overlap the third light emitting region LA3.

A third capping layer 393 may be disposed on the light transmission pattern 330, the first wavelength conversion pattern 340, and the second wavelength conversion pattern 350.

A first color filter 231 overlapping the first light emitting region LA1, a second color filter 233 overlapping the second light emitting region LA2, a third color filter 235 overlapping the third light emitting region LA3, and a color pattern 250 overlapping the non-light emitting region NLA may be disposed on the third capping layer 393.

In some embodiments, a part of the first color filter 231 and a part of the second color filter 233 may overlap the non-light emitting region NLA, and the color pattern 250 may be disposed on the first color filter 231 and the second color filter 233 in the non-light emitting region NLA.

In some embodiments, a light blocking pattern 260 may be disposed between the color pattern 250 and the first color filter 231 and between the color pattern 250 and the second color filter 233 in the non-light emitting region NLA and may overlap the non-light emitting region NLA. In an embodiment, the light blocking pattern 260 may be omitted.

An upper thin-film encapsulation layer 270 may be disposed on the first color filter 231, the second color filter 233, the third color filter 235, and the color pattern 250.

The upper thin-film encapsulation layer 270 protects elements disposed under the upper thin-film encapsulation layer 270 from external foreign substances such as moisture.

The upper thin-film encapsulation layer 270 is disposed in all of the first light emitting region LA1, the second light emitting region LA2, the third light emitting region LA3, and the non-light emitting region NLA in a display area DA. In some embodiments, the upper thin-film encapsulation layer 270 may directly cover the first color filter 231, the second color filter 233, the third color filter 235 and the color pattern 250 in the display area DA.

In some embodiments, the upper thin-film encapsulation layer 270 may include a second lower inorganic layer 271, a second organic layer 273, and a second upper inorganic layer 275 stacked sequentially.

In some embodiments, the second lower inorganic layer 271 may directly cover the first color filter 231, the second color filter 233, the third color filter 235 and the color pattern 250 in the display area DA and may cover the bank pattern 370 and the color pattern 250 in a non-display area NDA.

The second organic layer 273 may be disposed on the second lower inorganic layer 271. The second organic layer 273 may be disposed over the entire display area DA, and a part of the second organic layer 273 may be disposed in the non-display area NDA (refer to FIG. 1). The second organic layer 273 may include the same material as that of a first organic layer 173 or may include one or more materials selected from the materials exemplified as the materials included in the first organic layer 173.

The second upper inorganic layer 275 may be disposed on the second organic layer 273 and have a thickness Th5$a$. The second upper inorganic layer 275 may cover the second organic layer 273. In some embodiments, the second upper inorganic layer 275 may directly contact the second lower inorganic layer 271 in the non-display area NDA (refer to FIG. 1) to form an inorganic-inorganic bond. The second upper inorganic layer 275 may include the same material as that of a first upper inorganic layer 175 or may include one or more materials selected from the materials exemplified as the materials included in the first upper inorganic layer 175.

In some embodiments, a thickness Th3$a$ of the second organic layer 273 may be about 2 μm to about 8 μm, for example.

The second lower inorganic layer 271 may include an inorganic material and may have a multilayer structure. In some embodiments, as illustrated in FIG. 25, the second lower inorganic layer 271 may include a seventh sub-inorganic layer 2711 and an eighth sub-inorganic layer 2713. In addition, the second lower inorganic layer 271 may further include a ninth sub-inorganic layer 2715.

The seventh sub-inorganic layer 2711 may be disposed on the first color filter 231, the second color filter 233, the third color filter 235, and the color pattern 250. The seventh sub-inorganic layer 2711 may prevent the first color filter 231, the second color filter 233, the third color filter 235 and the color pattern 250 from being damaged in the process of forming the eighth sub-inorganic layer 2713. That is, the seventh sub-inorganic layer 2711 may function as a protective layer.

In some embodiments, the compressive stress of the seventh sub-inorganic layer 2711 may be about 0 MPa to about 200 MPa, for example.

The eighth sub-inorganic layer 2713 may be disposed on the seventh sub-inorganic layer 2711. The eighth sub-inorganic layer 2713 may prevent moisture and oxygen from penetrating into elements disposed under the upper thin-film encapsulation layer 270. In some embodiments, the compressive stress of the eighth sub-inorganic layer 2713 may be about 0 MPa to about 200 MPa, for example.

The ninth sub-inorganic layer 2715 may be disposed on the eighth sub-inorganic layer 2713. An upper surface of the ninth sub-inorganic layer 2715 may directly contact the second organic layer 273.

An uneven structure SR1$a$ having an irregular pattern may be provided on the upper surface of the ninth sub-inorganic layer 2715 or a surface which contacts the second organic layer 273. Accordingly, the spreadability of the second organic layer 273 may be improved. In an embodiment, the surface roughness of the uneven structure SR3 may be about 5 nm to about 100 nm based on root-mean-square roughness, for example.

In some embodiments, a refractive index n11$a$ of the seventh sub-inorganic layer 2711 and a refractive index n15$a$ of the ninth sub-inorganic layer 2715 may be smaller than a refractive index n13$a$ of the eighth sub-inorganic layer 2713. In an embodiment, the refractive index n13$a$ of the eighth sub-inorganic layer 2713 may be about 1.5 to about 1.7, and the refractive index n11$a$ of the seventh sub-inorganic layer 2711 and the refractive index n15$a$ of the ninth sub-inorganic layer 2715 may be about 1.3 to less than about 1.7 as long as they are smaller than the refractive index n13$a$ of the eighth sub-inorganic layer 2713, for example.

In some embodiments, a thickness Th11$a$ of the seventh sub-inorganic layer 2711 and a thickness Th15$a$ of the ninth sub-inorganic layer 2715 may be smaller than a thickness Th13$a$ of the eighth sub-inorganic layer 2713. In an embodiment, the thickness Th13$a$ of the eighth sub-inorganic layer 2713 may be about 10 Å to about 50,000 Å, for example. In some embodiments, the thickness Th11$a$ of the seventh sub-inorganic layer 2711 may be about 10 Å to about 10,000 Å as long as it is smaller than the thickness Th13$a$ of the eighth sub-inorganic layer 2713, for example. In some embodiments, the thickness Th15$a$ of the ninth sub-inorganic layer 2715 may be about 10 Å to about 5,000 Å as long as it is smaller than the thickness Th13$a$ of the eighth sub-inorganic layer 2713, for example.

In some embodiments, the eighth sub-inorganic layer 2713 may include an oxynitride of a third material such as silicon, aluminum, tungsten or titanium, and the seventh sub-inorganic layer 2711 and the ninth sub-inorganic layer 2715 may include an oxide of the third material or an oxynitride of the third material. In addition, content of oxygen atoms in the eighth sub-inorganic layer 2713 may be smaller than content of oxygen atoms in the seventh sub-inorganic layer 2711 and content of oxygen atoms in the ninth sub-inorganic layer 2715. In addition, content of nitrogen atoms in the eighth sub-inorganic layer 2713 may be greater than content of nitrogen atoms in the seventh sub-inorganic layer 2711 and content of nitrogen atoms in the ninth sub-inorganic layer 2715. In an embodiment, the seventh sub-inorganic layer 2711, the eighth sub-inorganic layer 2713, and the ninth sub-inorganic layer 2715 may all include silicon oxynitride, for example. In addition, the eighth sub-inorganic layer 2713 may have a relatively lower oxygen atom content than those of the seventh sub-inorganic layer 2711 and the ninth sub-inorganic layer 2715 and have a relatively higher nitrogen atom content than that of the seventh sub-inorganic layer 2711 and the ninth sub-inorganic layer 2715.

Referring to FIG. 26, the upper thin-film encapsulation layer 270 (refer to FIG. 24) may be modified to an upper thin-film encapsulation layer 270_1 illustrated in FIG. 26. The upper thin-film encapsulation layer 270_1 may include a second lower inorganic layer 271, a second organic layer 273, and a second upper inorganic layer 275a.

The second upper inorganic layer 275a may include a tenth sub-inorganic layer 2751 and an eleventh sub-inorganic layer 2753.

The tenth sub-inorganic layer 2751 may be disposed on the second organic layer 273 and may block or reduce outgas generated in the second organic layer 273.

The eleventh sub-inorganic layer 2753 may be disposed on the tenth sub-inorganic layer 2751 and may function as a barrier layer that prevents penetration of external moisture and oxygen.

In some embodiments, a thickness Th51a, refractive index n51a and material of the tenth sub-inorganic layer 2751 may be substantially the same as the thickness Th51 (refer to FIG. 15), refractive index n51 (refer to FIG. 15) and material of the fourth sub-inorganic layer 1751 (refer to FIG. 15) described above in FIG. 15.

In some embodiments, a thickness Th53a, refractive index n53a and material of the eleventh sub-inorganic layer 2753 may be substantially the same as the thickness Th53 (refer to FIG. 15), refractive index n53 (refer to FIG. 15) and material of the fifth sub-inorganic layer 1753 (refer to FIG. 15) described above in FIG. 15.

Furthermore, the relationship between the thickness Th51a of the tenth sub-inorganic layer 2751 and the thickness Th53a of the eleventh sub-inorganic layer 2753, the relationship between the refractive index n51a of the tenth sub-inorganic layer 2751 and the refractive index n53a of the eleventh sub-inorganic layer 2753, and the relationship (e.g., the oxygen atom content magnitude relationship and the nitrogen atom content magnitude relationship) between an inorganic material included in the tenth sub-inorganic layer 2751 and an inorganic material included in the eleventh sub-inorganic layer 2753 may be the same as the relationship between the fourth sub-inorganic layer 1751 (refer to FIG. 15) and the fifth sub-inorganic layer 1753 (refer to FIG. 15) described above in FIG. 15, and thus a detailed description thereof is omitted.

By embodiments of the invention, it is possible to provide a display device having improved light efficiency and reliability.

However, the effects of the embodiments are not restricted to the one set forth herein. The above and other effects of the embodiments will become more apparent to one of daily skill in the art to which the embodiments pertain by referencing the claims.

What is claimed is:

1. A display device comprising:
a first base;
a light emitting element which is disposed on the first base;
a capping layer which is disposed on the light emitting element, the capping layer comprising:
a first sub-capping layer disposed on the light emitting element; and
a second sub-capping layer disposed on the first sub-capping layer;
a thin-film encapsulation layer which is disposed on the capping layer and comprises an inorganic layer at a bottom of thin-film encapsulation layer; and
a wavelength conversion pattern which is disposed on the thin-film encapsulation layer and overlaps the light emitting element, wherein a refractive index of the second sub-capping layer is greater than a refractive index of the inorganic layer and smaller than a refractive index of the first sub-capping layer, and
wherein the first sub-capping layer comprises an organic material.

2. The display device of claim 1, wherein a thickness of the first sub-capping layer is different from a thickness of the second sub-capping layer.

3. The display device of claim 2, wherein the thickness of the first sub-capping layer is greater than the thickness of the second sub-capping layer.

4. The display device of claim 2, wherein the capping layer further comprises a third sub-capping layer disposed between the first sub-capping layer and the light emitting element, and a refractive index of the third sub-capping layer is greater than the refractive index of the first sub-capping layer.

5. The display device of claim 4, wherein the thickness of the first sub-capping layer is greater than the thickness of the second sub-capping layer and a thickness of the third sub-capping layer.

6. The display device of claim 2, wherein the second sub-capping layer comprise an organic material.

7. The display device of claim 6, wherein the thin-film encapsulation layer comprises a lower inorganic layer disposed on the capping layer, an organic layer disposed on the lower inorganic layer, and an upper inorganic layer disposed on the organic layer, wherein the lower inorganic layer comprises a first sub-inorganic layer disposed on the second sub-capping layer and a second sub-inorganic layer disposed between the first sub-inorganic layer and the organic layer, and a refractive index of the first sub-inorganic layer is smaller than the refractive index of the second sub-capping layer and a refractive index of the second sub-inorganic layer.

8. The display device of claim 7, wherein the refractive index of the first sub-inorganic layer is about 1.3 to less than about 1.7, the refractive index of the second sub-inorganic layer is 1.5 to about 1.7, and the refractive index of the second sub-capping layer is about 1.9 to about 2.4.

9. The display device of claim 7, wherein each of the first sub-inorganic layer and the second sub-inorganic layer comprises oxygen atoms, and content of the oxygen atoms in the first sub-inorganic layer is greater than content of the oxygen atoms in the second sub-inorganic layer.

10. The display device of claim 9, wherein each of the first sub-inorganic layer and the second sub-inorganic layer further comprises nitrogen atoms, and content of the nitrogen atoms in the second sub-inorganic layer is greater than content of the nitrogen atoms in the first sub-inorganic layer.

11. The display device of claim 10, wherein the first sub-inorganic layer and the second sub-inorganic layer include silicon oxynitride.

12. The display device of claim 7, wherein the lower inorganic layer further comprises a third sub-inorganic layer disposed on the second sub-inorganic layer and contacting the organic layer, the third sub-inorganic layer comprises an uneven structure contacting the organic layer, and root-mean-square surface roughness of the uneven structure is about 5 nanometers to about 100 nanometers.

13. The display device of claim 12, wherein a refractive index of the third sub-inorganic layer is smaller than the refractive index of the second sub-inorganic layer, and a thickness of the third sub-inorganic layer is smaller than a thickness of the second sub-inorganic layer.

14. The display device of claim 7, wherein the upper inorganic layer comprises a fourth sub-inorganic layer disposed on the organic layer and a fifth sub-inorganic layer disposed on the fourth sub-inorganic layer, wherein a refractive index of the fourth sub-inorganic layer and a refractive index of the fifth sub-inorganic layer are about 1.7 or less, the refractive index of the fifth sub-inorganic layer is greater than the refractive index of the fourth sub-inorganic layer, and a thickness of the fifth sub-inorganic layer is greater than a thickness of the fourth sub-inorganic layer.

15. The display device of claim 14, further comprising a filler which is disposed between the wavelength conversion pattern and the thin-film encapsulation layer, wherein the upper inorganic layer further comprises a sixth sub-inorganic layer disposed between the fifth sub-inorganic layer and the filler, and the sixth sub-inorganic layer comprises an uneven structure contacting the filler.

16. The display device of claim 1, wherein the light emitting element comprises a first light emitting layer, a second light emitting layer and a third light emitting layer overlapping each other, and each of the first light emitting layer, the second light emitting layer and the third light emitting layer emits light having a peak wavelength of about 440 nanometers to about 550 nanometers, wherein any one of the first light emitting layer, the second light emitting layer and the third light emitting layer emits light having a first peak wavelength, and another one of the first light emitting layer, the second light emitting layer and the third light emitting layer emits light having a second peak wavelength different from the first peak wavelength.

17. The display device of claim 16, further comprising:
a second base which is disposed on the thin-film encapsulation layer;
a color filter which is disposed on a surface of the second base facing the thin-film encapsulation layer and overlaps the light emitting element;
a filler which is disposed between the color filter and the thin-film encapsulation layer; and
a sealing part which is disposed between the first base and the second base and surrounds the filler,
wherein the wavelength conversion pattern is disposed between the filler and the color filter.

18. A display device comprising:
a base;
a light emitting element which is disposed on the base;
a first capping layer which is disposed on the light emitting element, the first capping layer comprising:
a first sub-capping layer disposed on the light emitting element; and
a second sub-capping layer disposed on the first sub-capping layer;
a thin-film encapsulation layer which comprises a first lower inorganic layer disposed on the first capping layer, a first organic layer disposed on the first lower inorganic layer and a first upper inorganic layer disposed on the first organic layer;
a wavelength conversion pattern which is disposed on the thin-film encapsulation layer and overlaps the light emitting element;
a second capping layer which is disposed on the wavelength conversion pattern;
a color filter which is disposed on the second capping layer and overlaps the wavelength conversion pattern; and
an upper thin-film encapsulation layer which is disposed on the color filter and comprises a second lower inorganic layer, a second organic layer disposed on the second lower inorganic layer and a second upper inorganic layer disposed on the second organic layer,
wherein a refractive index of the second sub-capping layer is smaller than a refractive index of the first sub-capping layer, and a refractive index of the first lower inorganic layer is smaller than the refractive index of the second sub-capping layer.

19. The display device of claim 18, wherein the first lower inorganic layer comprises a plurality of sub-inorganic layers, and a refractive index of a sub-inorganic layer, which contacts the second sub-capping layer, among the plurality of sub-inorganic layers is smaller than the refractive index of the second sub-capping layer.

20. The display device of claim 19, wherein the second lower inorganic layer comprises a first sub-inorganic layer disposed on the color filter, a second sub-inorganic layer disposed on the first sub-inorganic layer and a third sub-inorganic layer disposed on the second sub-inorganic layer and contacting the second organic layer, wherein a refractive index of the second sub-inorganic layer is greater than a refractive index of the first sub-inorganic layer and a refractive index of the third sub-inorganic layer, and the third sub-inorganic layer comprises an uneven structure contacting the second organic layer.

* * * * *